(12) United States Patent
Kobayashi et al.

(10) Patent No.: US 10,693,002 B2
(45) Date of Patent: Jun. 23, 2020

(54) SEMICONDUCTOR DEVICE

(71) Applicant: FUJI ELECTRIC CO., LTD., Kawasaki (JP)

(72) Inventors: Yusuke Kobayashi, Tsukuba (JP); Naoyuki Ohse, Matsumoto (JP); Shinsuke Harada, Tsukuba (JP); Manabu Takei, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/121,096

(22) Filed: Sep. 4, 2018

(65) Prior Publication Data

US 2019/0074373 A1   Mar. 7, 2019

(30) Foreign Application Priority Data

Sep. 7, 2017  (JP) ................. 2017-172417
Sep. 7, 2017  (JP) ................. 2017-172418

(Continued)

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0615* (2013.01); *H01L 29/0619* (2013.01);
(Continued)

(58) Field of Classification Search
None
See application file for complete search history.

(56) References Cited

U.S. PATENT DOCUMENTS

2008/0283909 A1   11/2008   Akiyama et al.
2013/0001792 A1    1/2013   Uno et al.

FOREIGN PATENT DOCUMENTS

JP   2008-288462 A   11/2008
JP   2012-209330 A   10/2012
(Continued)

OTHER PUBLICATIONS

Zanchetta et al., "Analytical and numerical study of the impact of HALOs on short channel and hot carrier effects in scaled MOSFETs", Solid State Electronics, Elsevier Science Ltd., 2002, vol. 46, No. 3, pp. 429-434 (Discussed in Patent Application Specification).

*Primary Examiner* — Long Pham

(57) ABSTRACT

In an n-type current diffusion region, a first $p^+$-type region underlying a bottom of a trench (gate trench) is provided. In the n-type current diffusion region, a second $p^+$-type region is provided between adjacent trenches, separated from the first $p^+$-type region and in contact with the p-type base region. In the p-type base region, near a side wall of the trench, a third $p^+$-type region is provided a predetermined distance from the side wall of the trench and is separated from the first and the second $p^+$-type regions. The third $p^+$-type region extends in a depth direction, substantially parallel to the side wall of the trench. A drain-side end of the third $p^+$-type region is in contact with the n-type current diffusion region or protrudes a predetermined depth from the interface of the p-type base region and the n-type current diffusion region toward the drain.

15 Claims, 42 Drawing Sheets

(30) Foreign Application Priority Data

Sep. 7, 2017 (JP) .................................. 2017-172420
Jun. 27, 2018 (JP) .................................. 2018-121609

(51) Int. Cl.
*H01L 29/08* (2006.01)
*H01L 29/10* (2006.01)
*H01L 29/739* (2006.01)
*H01L 29/16* (2006.01)

(52) U.S. Cl.
CPC ...... *H01L 29/0623* (2013.01); *H01L 29/0638* (2013.01); *H01L 29/0661* (2013.01); *H01L 29/0878* (2013.01); *H01L 29/1095* (2013.01); *H01L 29/1608* (2013.01); *H01L 29/7397* (2013.01)

(56) References Cited

FOREIGN PATENT DOCUMENTS

| | | | |
|---|---|---|---|
| JP | 2013-012669 A | 1/2013 | |
| JP | 2015-153893 A | 8/2015 | |

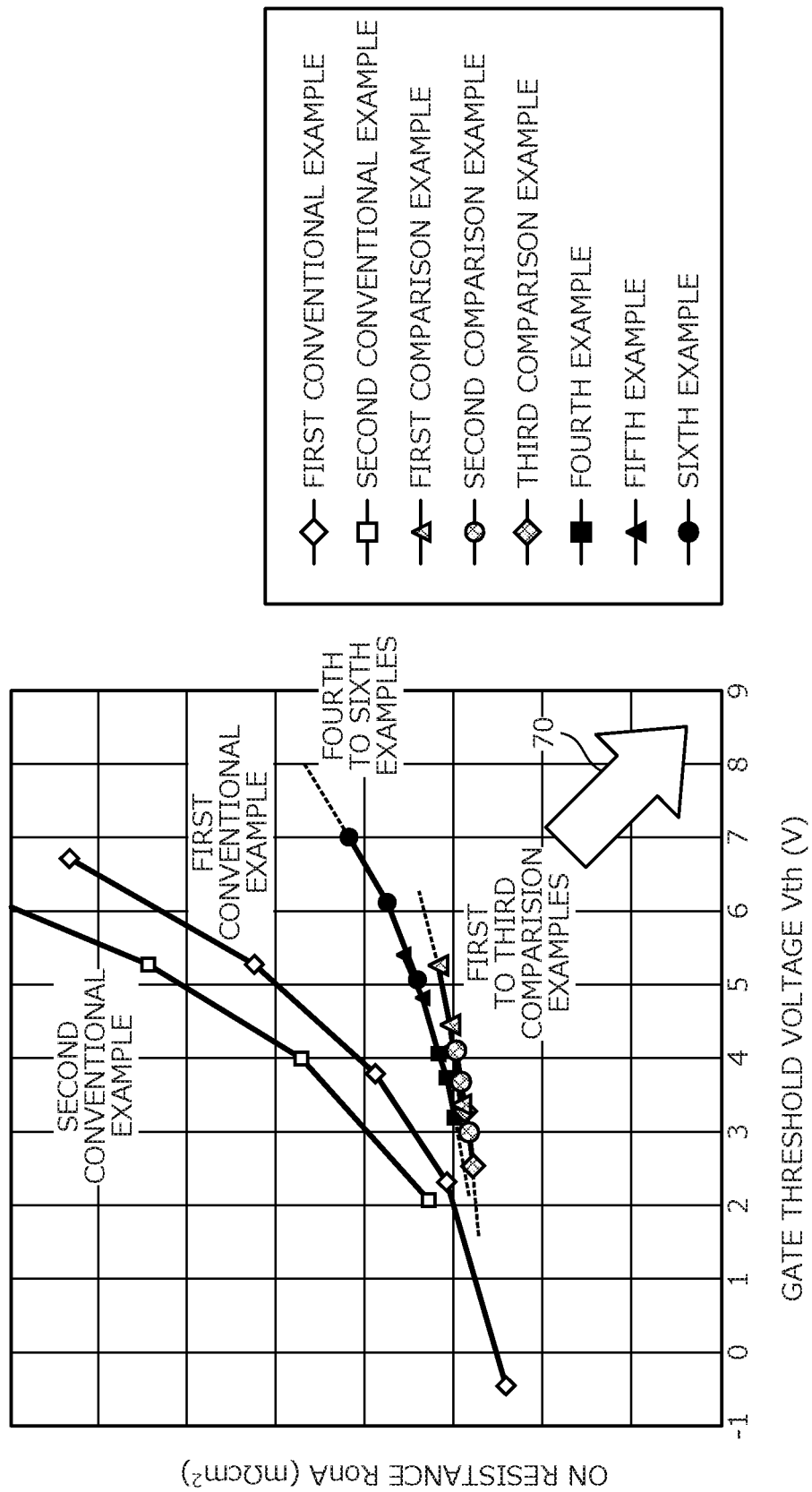

FIG.25A

| SAMPLE No. | $w_T$ (μm) | $w_C$ (μm) | θ1A (deg.) | θ1B (deg.) | θ1C (deg.) |
|---|---|---|---|---|---|
| 1 | 0.8 | 0.85-1.3 | 14 OR MORE | 20-61 | 37-50 |
| 2 | 1.0 | 0.85-1.3 | 14 OR MORE | 20-61 | 43-56 |
| 3 | 0.6 | 0.85-1.3 | 14 OR MORE | 20-61 | 29-42 |
| 4 | 0.4 | 0.85-1.3 | 14 OR MORE | 20-61 | 20-31 |
| 5 | 0.8 | 0.4-0.85 | 14 OR MORE | 20-61 | 51-75 |
| 6 | 1.0 | 0.4-0.85 | 14 OR MORE | 20-61 | 57-78 |
| 7 | 0.6 | 0.4-0.85 | 14 OR MORE | 20-61 | 43-71 |
| 8 | 0.4 | 0.4-0.85 | 14 OR MORE | 20-61 | 32-63 |
| 9 | 0.8 | 0.2-0.65 | 14 OR MORE | 20-61 | 61-89 |
| 10 | 0.6 | 0.2-0.65 | 14 OR MORE | 20-61 | 53-89 |
| 11 | 0.4 | 0.2-0.65 | 14 OR MORE | 20-61 | 42-89 |
| 12 | 0.2 | 0.2-0.65 | 14 OR MORE | 20-61 | 24-89 |

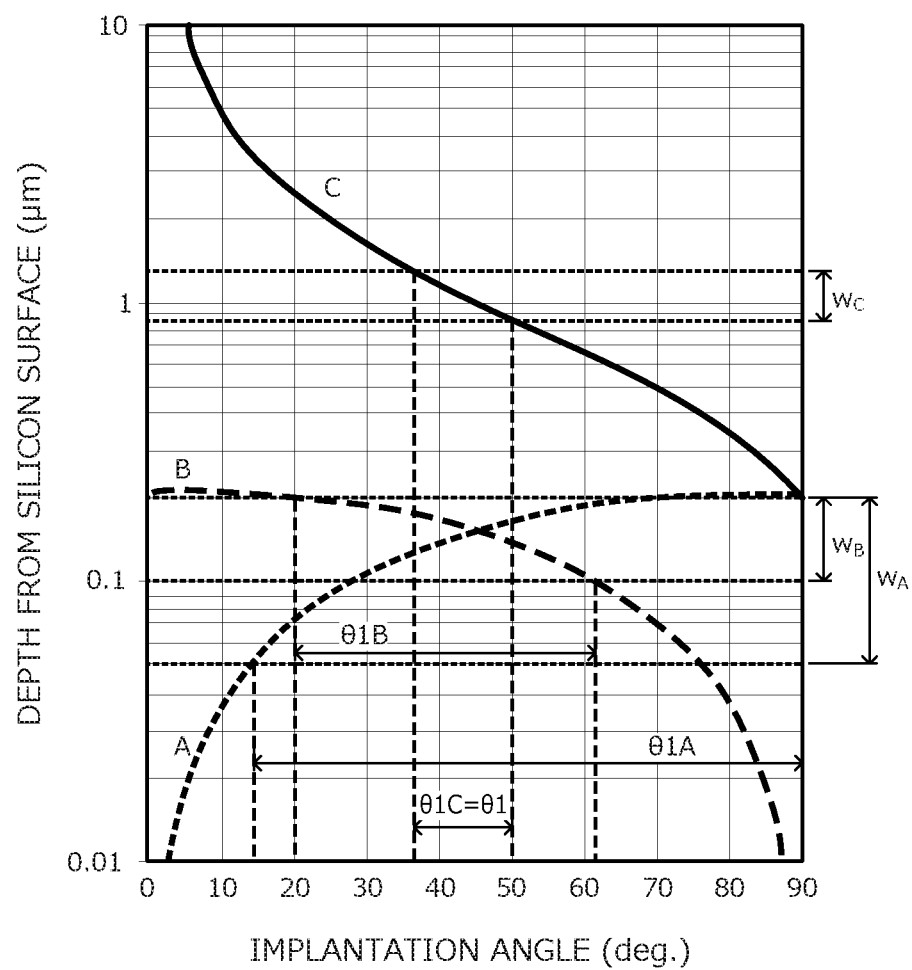

SEMICONDUCTOR DEVICE

CROSS REFERENCE TO RELATED APPLICATIONS

This application is based upon and claims the benefit of priority of the prior Japanese Patent Application Nos. 2018-121609 filed on Jun. 27, 2018, and 2017-172420 filed on Sep. 7, 2017, and 2017-172418 filed on Sep. 7, 2017, and 2017-172417 filed on Sep. 7, 2017, the entire contents of which are incorporated herein by reference.

BACKGROUND

1. Field

Embodiments of the invention relate to a semiconductor device.

2. Description of Related Art

A semiconductor material (hereinafter, wide bandgap semiconductor material) having a bandgap that is wider than that of silicon has a critical electric field strength that is greater than that of silicon and therefore, is expected to be a semiconductor material that may sufficiently reduce ON resistance. Further, for power semiconductor devices that use a wide bandgap semiconductor material, low ON resistance is demanded and in a vertical metal oxide semiconductor field effect transistor (MOSFET), a trench gate structure that structurally facilitates low ON resistance characteristics is adopted.

A trench gate structure is a MOS gate structure in which a MOS gate is embedded in a trench formed at a front surface of a semiconductor substrate. While a trench gate structure enables lower ON resistance by a reduction of cell pitch, due to the reduction of the cell pitch, decreases in breakdown voltage and increases in the electric field applied to a gate insulating film in an OFF state occur and thus, it is important to suppress these occurrences. Further, with a trench gate structure, a channel (n-type inversion layer) is formed along a trench side wall in a vertical direction (a depth direction). Therefore, channel shortening by ion implantation, epitaxial growth, etc. is facilitated as compared to in a planar gate structure in which a MOS gate is provided in a plate-like shape on the front surface of the semiconductor substrate.

A conventional semiconductor device will be described taking, as an example, a case in which silicon carbide (SiC) is used as the wide bandgap semiconductor material. FIG. 38 is a cross-sectional view of a structure of the conventional semiconductor device. The conventional semiconductor device depicted in FIG. 38 is a trench gate MOSFET fabricated using a semiconductor substrate 110 that contains silicon carbide and in which silicon carbide layers that constitute an n$^-$-type drift region 102 and a p-type base region 104 are sequentially formed by epitaxial growth on an n$^+$-type starting substrate 101 that contains silicon carbide. A thickness t101 of the p-type base region 104 is reduced, whereby a channel length L becomes shorter, enabling channel shortening.

First and second p$^+$-type regions 121, 122 are selectively provided at positions deeper toward a drain than is a bottom of a trench 107, from a front surface of the semiconductor substrate 110. The first p$^+$-type region 121 underlies the bottom of the trench 107. The second p$^+$-type region 122 is selectively provided between (mesa region) the trench 107 and an adjacent trench 107, and is separated from the trenches 107. Provision of the first and the second p$^+$-type regions 121, 122 realizes suppression of the electric field applied to the gate insulating film in the OFF state and enhanced breakdown voltage. Reference numerals 103, 105, 106, 108, 109, 111 to 113 are an n-type current diffusion region, an n$^+$-type source region, a p$^{++}$-type contact region, a gate insulating film, a gate electrode, an interlayer insulating film, a source electrode, and a drain electrode, respectively.

A method has been proposed as a method of suppressing short channel effect. According to the method, in a part of a well region of a planar gate MOSFET, the part being directly below the gate electrode, a region having an impurity concentration that is made higher than that of the well region is formed from an oblique direction relative to a front surface of a semiconductor substrate, using the gate electrode as a mask (for example, refer to S. Zanchetta, et al, "Analytical and numerical study of the impact of HALOs on short channel and hot carrier effects in scaled MOSFETs", Solid State Electronics, Elsevier Science Ltd., 2002, Vol. 46, No. 3, pp. 429-434).

Further, a device has been proposed as a planar gate MOSFET that suppresses the short channel effect. The device includes at a lower part of an n$^-$-type source region, a p-type halo region that suppresses spreading of an impurity from a source to a channel formation region (for example, refer to Japanese Laid-Open Patent Publication No. 2013-012669 (paragraph 0234)).

Further, a device has been proposed as a trench gate MOSFET that suppresses the short channel effect. The device includes in a p-type base region, a region that is separated from a gate insulating film (gate trench) and that contains a p-type impurity at a high concentration (for example, refer to Japanese Laid-Open Patent Publication No. 2015-153893 (paragraphs 0079, 0090, FIGS. 10, 12)).

Further, a device has been proposed as a planar gate MOSFET in which the ON resistance is reduced. The device includes at a part of an n$^-$-type drift region, the part being sandwiched between a pair of p-type base regions, a field plate of a trench gate structure and an n-type low resistance region covering the field plate entirely (for example, refer to Japanese Laid-Open Patent Publication No. 2012-209330 (paragraphs 0053 to 0054, FIG. 6). In Japanese Laid-Open Patent Publication No. 2012-209330, punch-through breakdown voltage is enhanced by a field plate effect, whereby application of a structure in which the n-type low resistance region is disposed is facilitated and the ON resistance is reduced.

Further, as another conventional trench gate MOSFET, a device has been proposed that includes a p-type region that is separated from a gate trench and adjacent to a p-type base region along a direction parallel to a substrate front surface. The p-type region is in contact with an end of a p-type contact region, the end being toward a drain. An impurity concentration of the p-type region is higher than that of the p-type base region (for example, refer to Japanese Laid-Open Patent Publication No. 2008-288462 (paragraphs 0009 to 0013, FIG. 1)). In Japanese Laid-Open Patent Publication No. 2008-288462, the channel length is shortened and the ON resistance is reduced. In addition, the p-type region whose impurity concentration is higher than that of the p-type base region is provided adjacent to the p-type base region along a direction parallel to the substrate front surface, whereby punch-through of the p-type base region is prevented by the short channel effect.

SUMMARY

According to an embodiment, a semiconductor device includes a semiconductor substrate containing a semiconductor material having a bandgap wider than that of silicon; a first semiconductor layer of a first conductivity type provided on a front surface of the semiconductor substrate, the first semiconductor layer containing a semiconductor material having a bandgap wider than that of silicon; a second semiconductor layer of a second conductivity type provided on a first side of the first semiconductor layer, opposite a second side of the first semiconductor layer facing toward the semiconductor substrate, the second semiconductor layer containing a semiconductor material having a bandgap wider than that of silicon; a first first-conductivity-type region of the first conductivity type selectively provided in the second semiconductor layer; a trench that penetrates the first first-conductivity-type region and the second semiconductor layer, and reaches the first semiconductor layer; a gate electrode provided in the trench, via a gate insulating film; a first second-conductivity-type semiconductor region of the second conductivity type selectively provided in the first semiconductor layer, separated from the second semiconductor layer and underlying a bottom of the trench; a second second-conductivity-type semiconductor region of the second conductivity type selectively provided in the first semiconductor layer between the trench and an adjacent trench, the second second-conductivity-type semiconductor region being in contact with the second semiconductor layer; a third second-conductivity-type semiconductor region of the second conductivity type selectively provided in the second semiconductor layer, closer to the first semiconductor layer than is the first first-conductivity-type region, the third second-conductivity-type semiconductor region being in contact with the first first-conductivity-type region and the first semiconductor layer, the third second-conductivity-type semiconductor region being a predetermined distance from a side wall of the trench, the third second-conductivity-type semiconductor region protruding 0.3 µm or less from an interface of the first semiconductor layer and the second semiconductor layer toward the semiconductor substrate and having an impurity concentration that is lower than that of the second semiconductor layer; a first electrode in contact with the second semiconductor layer and the first first-conductivity-type region; and a second electrode provided at a rear surface of the semiconductor substrate.

In the embodiment, an impurity concentration of a part of the second semiconductor layer between the side wall of the trench and the third second-conductivity-type semiconductor region is at most 10% of the impurity concentration of the third second-conductivity-type semiconductor region.

In the embodiment, the third second-conductivity-type semiconductor region has an L-shaped cross-sectional shape formed by a first linear part extending along the side wall of the trench and a second linear part orthogonal to the first linear part and extending along a first surface of the second semiconductor layer, opposite a second surface of the second semiconductor layer facing toward semiconductor substrate.

In the embodiment, the semiconductor device further includes a second first-conductivity-type region of the second conductivity type and having an impurity concentration higher than that of the first semiconductor layer, and in the first semiconductor layer, the second first-conductivity-type region being in contact with the second semiconductor layer and reaching a position deeper toward the second electrode from an interface with the second semiconductor layer than is the bottom of the trench.

In the embodiment, the second first-conductivity-type region has at least any one of: a first region of the first semiconductor layer provided between the trench and the third second-conductivity-type semiconductor region, and a second region of the first semiconductor layer provided between the first second-conductivity-type semiconductor region and the third second-conductivity-type semiconductor region.

In the embodiment, the first region of the first semiconductor layer is provided between first second-conductivity-type semiconductor region and the second semiconductor layer.

In the embodiment, the first region is in contact with the first second-conductivity-type semiconductor region and the second semiconductor layer.

In the embodiment, the first region is provided along an inner wall of the trench.

In the embodiment, the second region is in contact with the first second-conductivity-type semiconductor region and the third second-conductivity-type semiconductor region.

In the embodiment, the second region is in contact with the first region.

In the embodiment, a depth of the second region from an inner wall of the trench is at most a depth of the third second-conductivity-type semiconductor region from the side wall of the trench.

In the embodiment, the second first-conductivity-type region has the first region and the second region, and an impurity concentration of the second region is higher than an impurity concentration of the first region.

In the embodiment, the second first-conductivity-type region has the first region and the second region, and an impurity concentration of the second region is equal to an impurity concentration of the first region.

In the embodiment, the semiconductor device further includes an active region provided in the semiconductor substrate and including at least the trench and the gate electrode provided in the trench, via the gate insulating film; a termination region surrounding a periphery of the active region; and a breakdown voltage structure provided in the termination region, toward the front surface of the semiconductor substrate. The third second-conductivity-type semiconductor region extends from an active region side toward the termination region and terminates before reaching the termination region.

In the embodiment, the third second-conductivity-type semiconductor region is divided plural times between the active region and the termination region, in a direction toward the termination region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 13A is a characteristics diagram depicting simulation results of fourth to sixth examples;

FIG. 25A is a table depicting implantation angles of a first oblique ion implantation performed in samples of an example;

FIG. 25B is a characteristics diagram depicting a relationship of implantation angle of the first oblique ion implantation and depth of a third $p^+$-type region from a silicon surface;

DESCRIPTION OF EMBODIMENTS

Figure 37:
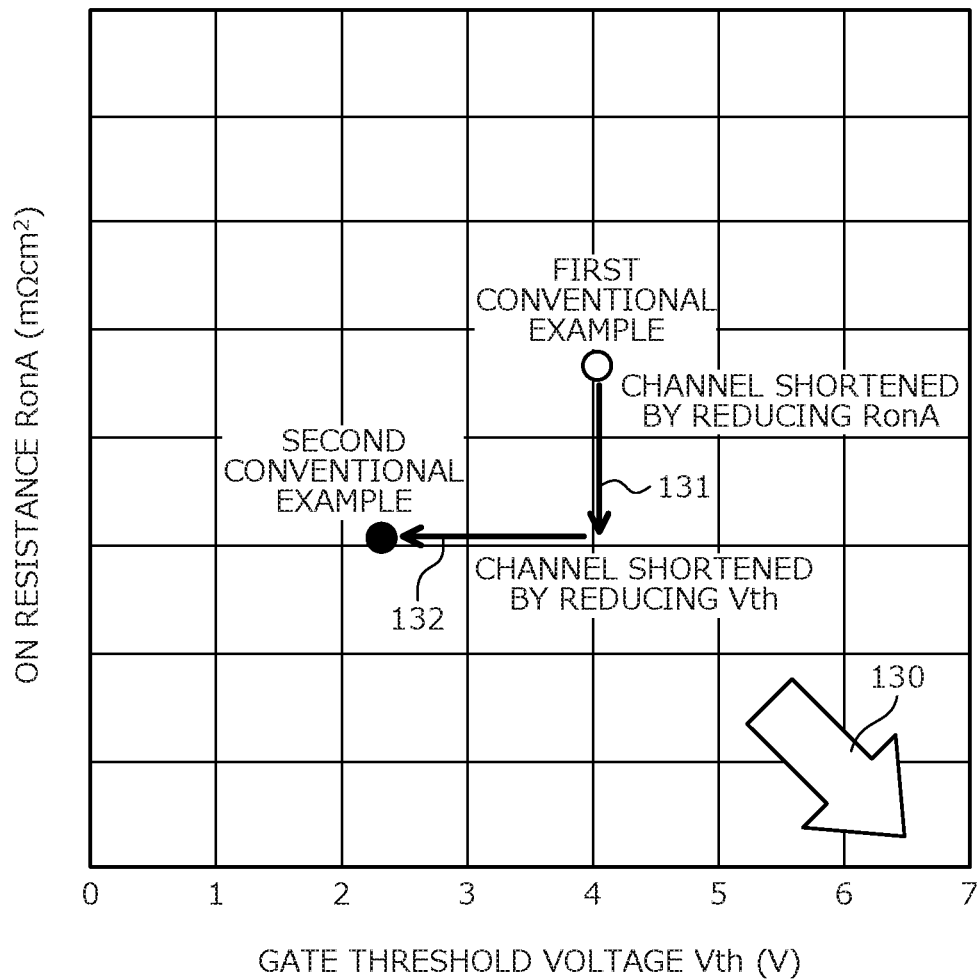
FIG. 37 is a characteristics diagram depicting results of simulating a relationship of gate threshold voltage and reduction of ON resistance of a conventional semiconductor device.
Figure 38:
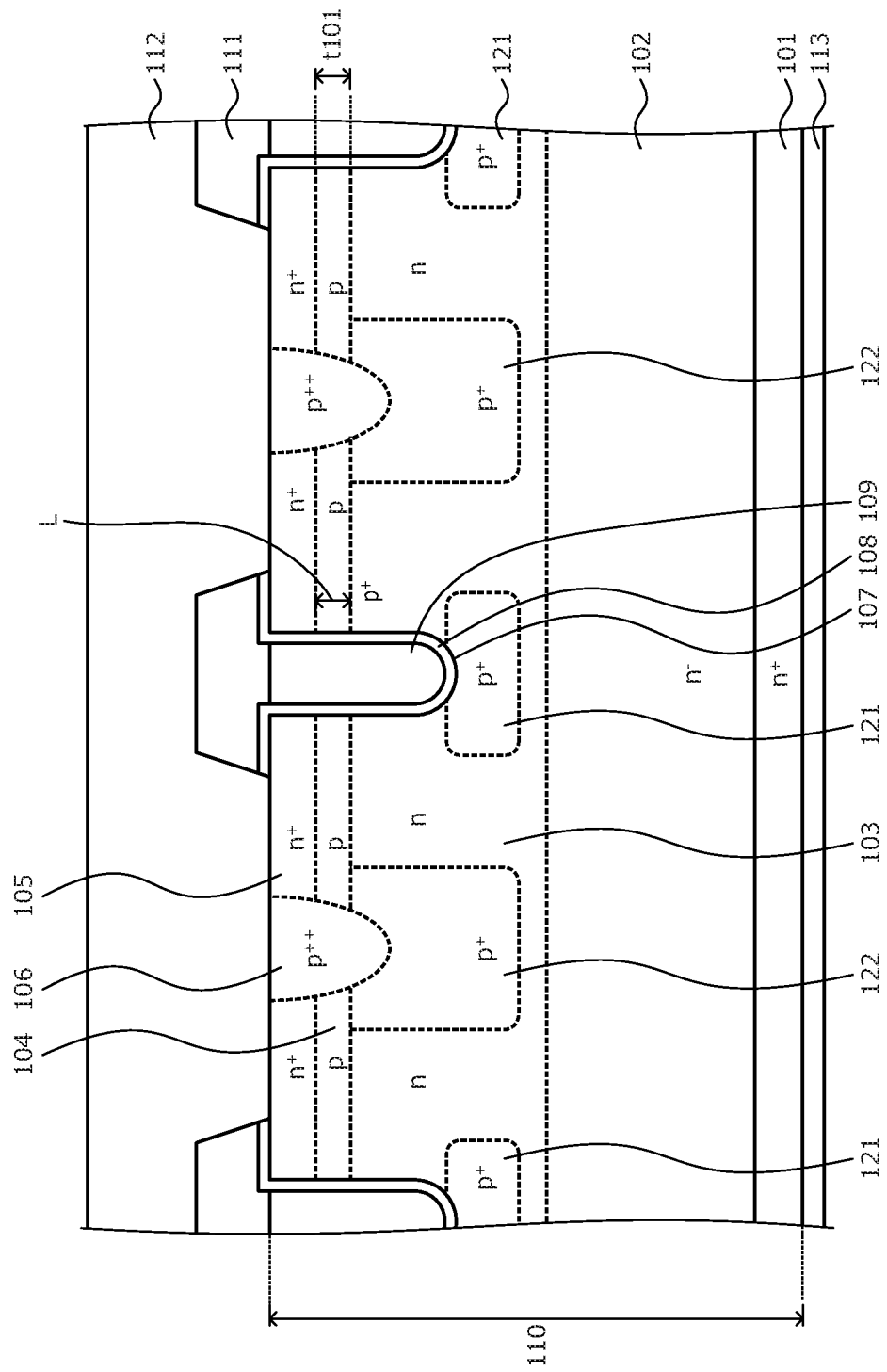
FIG. 38 is a cross-sectional view of a structure of the conventional semiconductor device.

First, problems associated with the conventional techniques will be described. In the conventional vertical trench gate MOSFET above, the channel length L is shorted to further reduce the ON resistance. FIG. 37 is a characteristics diagram depicting results of simulating the relationship of gate threshold voltage and reduction of the ON resistance of the conventional semiconductor device. A first conventional example is a trench gate MOSFET having the conventional structure described above. A second conventional example is a conventional trench gate MOSFET having a structure (hereinafter, short channel structure) in which the channel length L is shorter than that of the first conventional example (refer to FIG. 38). Excluding the channel length L, configurations of the first and the second conventional examples are similar, and a configuration in which the channel is shortened in the first conventional example is the second conventional example.

As depicted in FIG. 37, an ON resistance RonA and a gate threshold voltage Vth in the second conventional example is lower compared to the first conventional example, which means that while shortening of the channel length L enables the ON resistance RonA to be reduced (arrow indicated by reference numeral 131), with shortening of the channel length L for channel shortening, the gate threshold voltage Vth decreases (arrow indicated by reference numeral 132). A direction (lower right direction) from a starting point toward a terminating point of arrow 130 is a direction that improves a tradeoff of reducing the ON resistance RonA and suppressing decreases in the gate threshold voltage Vth.

The gate threshold voltage Vth decreases due to channel shortening for the following reason. Shortening the channel length L shortens a distance between a source and a drain. Therefore, during the ON state of the MOSFET, effects (short channel effect) of depletion layers spreading in the p-type base region 104 respectively from a drain side and a source side are significant and accompanying increases of the short channel effect, the magnitude of decrease of the gate threshold voltage also increases. In this manner, improvement of the tradeoff between reducing the ON resistance and suppressing decreases in the gate threshold voltage is difficult.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
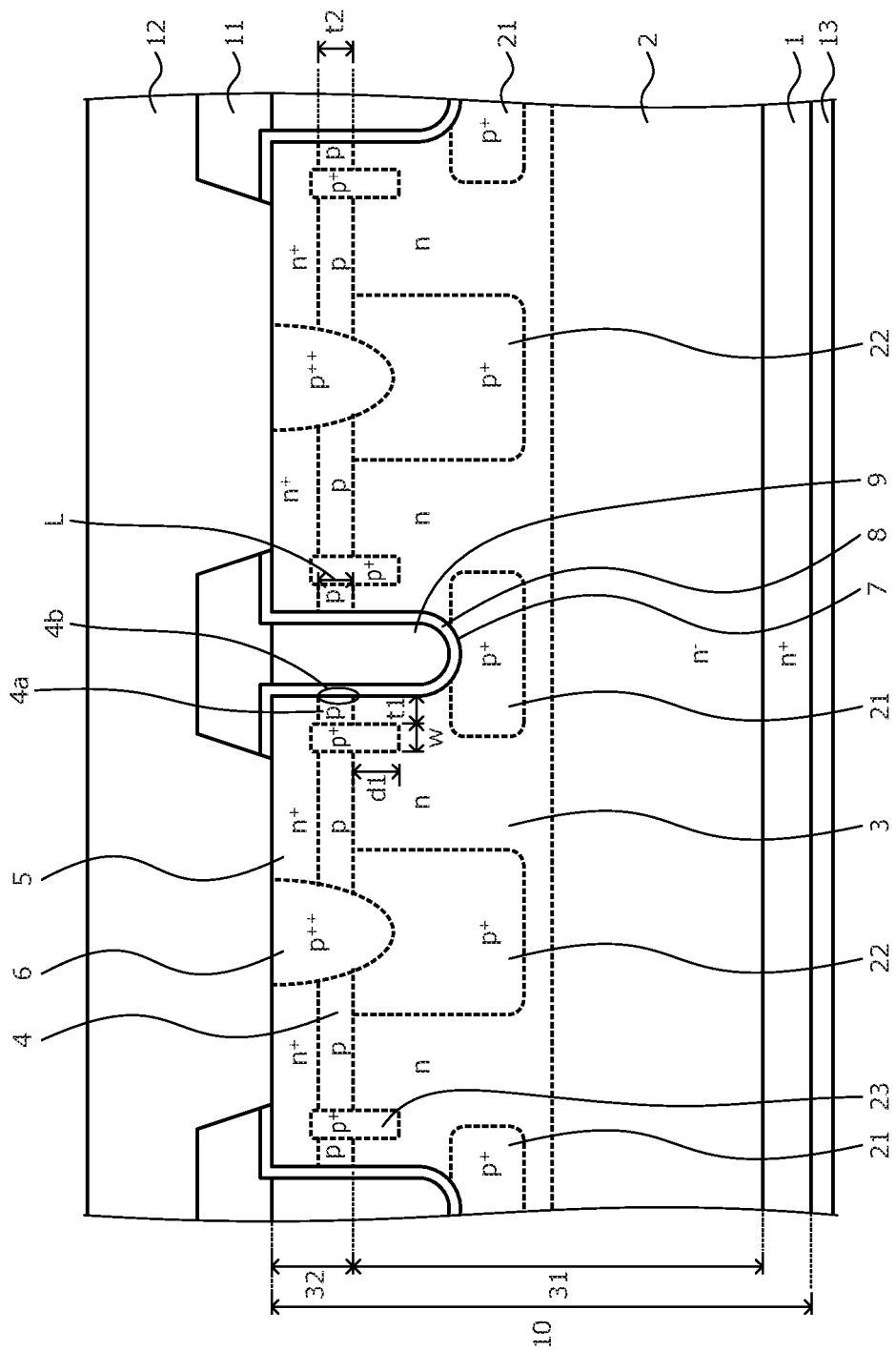
FIG. 1 is a cross-sectional view of a structure of a semiconductor device according to a first embodiment.

The semiconductor device according to a first embodiment is configured using a semiconductor material (wide bandgap semiconductor material) having a bandgap wider than that of silicon. A structure of the semiconductor device according to the first embodiment will be described taking as an example, a case in which, for example, silicon carbide (SiC) is used as the wide bandgap semiconductor material. FIG. 1 is a cross-sectional view of a structure of the semiconductor device according to the first embodiment. In FIG. 1, one unit cell (constituent unit of an element) and ½ of each adjacent unit cell on each side of the unit cell are depicted. Further, in FIG. 1, only a portion of the unit cells disposed in an active region are depicted and an edge termination region that surrounds a periphery of the active region is not depicted (similarly in FIGS. 2 to 9).

The active region is a region through which current flows when the semiconductor device is in the ON state. The edge termination region is a region between the active region and a chip (a semiconductor substrate 10) side surface and is a region that mitigates electric field toward a substrate front surface (the front surface of the semiconductor substrate 10) side of an n⁻-type drift region 2 and sustains the breakdown voltage. In the edge termination region, for example, a p-type region constituting a junction termination extension (JTE) structure, a guard ring, etc., a breakdown voltage structure such as a field plate, RESURF, etc. is disposed. The breakdown voltage is a voltage limit at which errant operation or damage of the semiconductor device does not occur.

The semiconductor device according to the first embodiment and depicted in FIG. 1 is a vertical MOSFET that includes a MOS gate having a trench gate structure in the front surface (surface on a p-type base region 4 side) side of the semiconductor substrate 10 containing silicon carbide. The semiconductor substrate 10 is an epitaxial substrate (semiconductor chip) in which silicon carbide layers (first and second semiconductor layers) 31, 32 constituting an n⁻-type drift region 2 and the p-type base region 4 are sequentially formed by epitaxial growth on an n⁺-type starting substrate 1 containing silicon carbide. The MOS gate is constituted by the p-type base region 4, an n⁺-type source region (first first-conductivity-type region) 5, a p⁺⁺-type contact region 6, a trench 7, a gate insulating film 8, and a gate electrode 9.

In particular, the trench 7 penetrates a p-type silicon carbide layer 32 (the p-type base region 4) in a depth direction from the front surface (surface of the p-type silicon carbide layer 32) of the semiconductor substrate 10, and reaches an n⁻-type silicon carbide layer 31. The depth direction is a direction from the front surface of the semiconductor substrate 10 toward a rear surface. In the trench 7, the gate insulating film 8 is provided along an inner wall of the trench 7. The gate electrode 9 is provided on the gate insulating film 8 so as to be embedded in the trench 7, forming the MOS gate. One unit cell is constituted by the MOS gate in one trench 7 and adjacent mesa regions (region between the trenches 7) sandwiching the MOS gate.

In a surface layer on a source side (side toward a source electrode 12) of the n⁻-type silicon carbide layer 31, an n-type region (hereinafter, an n-type current diffusion region (second first-conductivity-type region)) 3 is provided so as to be in contact with the p-type silicon carbide layer 32 (the p-type base region 4). The n-type current diffusion region 3 is a so-called current spreading layer (CSL) that reduces carrier spreading resistance. The n-type current diffusion region 3, for example, is provided uniformly along a direction parallel to a substrate front surface, so as to cover an inner wall of the trench 7. The n-type current diffusion region 3 reaches a position that from an interface with the p-type base region 4, is deeper toward a drain (a drain electrode 13) than is a bottom of the trench 7.

A part of the n⁻-type silicon carbide layer 31 excluding the n-type current diffusion region 3 is the n⁻-type drift region 2. In other words, the n-type current diffusion region 3 is provided between the n⁻-type drift region 2 and the p-type base region 4, and in contact with the n⁻-type drift region 2 and the p-type base region 4. In the n-type current diffusion region 3, first and second p⁺-type regions (first and second second-conductivity-type semiconductor regions) 21, 22 are each selectively provided. The first p⁺-type region 21 underlies the bottom of the trench 7. The first p⁺-type region 21 may be provided to be in contact with the bottom and a bottom corner part of the trench 7 overall. The bottom corner part of the trench 7 is a border of the bottom and a side wall of the trench 7.

Further, the first p⁺-type region 21 is disposed separated from the p-type base region 4, at a position deeper toward the drain than is an interface of the p-type base region 4 and the n-type current diffusion region 3. A drain-side end of the first p+-type region 21, the drain-side end facing toward the drain, may terminate in the n-type current diffusion region 3, or may reach an interface of the n-type current diffusion region 3 and the n⁻-type drift region 2, or may terminate in the n⁻-type drift region 2. In other words, a pn junction of the first p⁺-type region 21 and the n-type current diffusion region 3 (or the n⁻-type drift region 2) is positioned deeper toward the drain than is the bottom of the trench 7 and a depth of the first p⁺-type region 21 may be variously changed.

The second p⁺-type region 22 is provided between (mesa region) the trench 7 and an adjacent trench, so as to be separated from the first p⁺-type region 21 and in contact with the p-type base region 4. A pn junction of the second p⁺-type region 22 and the n-type current diffusion region 3 (or the n⁻-type drift region 2) is positioned deeper toward the drain than is the bottom of the trench and a depth of the second p⁺-type region 22 may be variously changed. For example, the drain-side end of the first p+-type region 21, may terminate in the n-type current diffusion region 3 so as to be closer to the drain than is the bottom of the trench 7, or may reach the interface of the n-type current diffusion region 3 and the n⁻-type drift region 2, or may terminate in the n⁻-type drift region 2.

In this manner, by forming pn junctions by the first and the second p$^+$-type regions 21, 22 and the n-type current diffusion region 3 (or the n$^-$-type drift region 2) at positions deeper toward the drain than is the bottom of the trench 7, application of high electric field to the gate insulating film 8 by a part along the bottom of the trench 7 may be prevented.

In the p-type silicon carbide layer 32, the n$^+$-type source region 5 and the p$^{++}$-type contact region 6 are each selectively provided so as to be in contact with each other. The n$^+$-type source region 5 is disposed so as to be in contact with the trench 7 and opposes the gate electrode 9 across the gate insulating film 8 at the side wall of the trench 7. The p$^{++}$-type contact region 6 opposes the second p$^+$-type region 22 in the depth direction. A depth of the p$^{++}$-type contact region 6, for example, may be deeper than a depth of the n$^+$-type source region 5 and the p$^{++}$-type contact region 6 may penetrate the p-type silicon carbide layer 32 in the depth direction and reach the second p$^+$-type region 22. A drain side region of the p$^{++}$-type contact region 6 toward the drain may terminate in the second p$^+$-type region 22.

Further, in the p-type silicon carbide layer 32, a third p$^+$-type region (third second-conductivity-type semiconductor region) 23 is provided near the side wall of the trench 7, separated from the side wall of the trench 7 by a predetermined distance t1. The third p$^+$-type region 23 extends in the depth direction substantially parallel to the side wall of the trench 7. In other words, the third p$^+$-type region 23 opposes the gate insulating film 8 at the side wall of the trench 7, across a part of the p-type base region 4 (or the p-type base region 4 and the n-type current diffusion region 3) along the side wall of the trench 7.

Further, the third p$^+$-type region 23, for example, has a substantially long rectangular cross-sectional shape in the depth direction, and reaches at least the interface of the p-type base region 4 and the n-type current diffusion region 3 from an interface of the n$^+$-type source region 5 and the p-type base region 4. A part of the p-type silicon carbide layer 32 excluding the n$^+$-type source region 5, the p$^{++}$-type contact region 6 and the third p$^+$-type region 23 is the p-type base region 4. The third p$^+$-type region 23 is disposed separated from the first and the second p$^+$-type regions 21, 22 and is in contact with the n$^+$-type source region 5 at a source-side end thereof toward the source. The source-side end of the third p$^+$-type region 23 may slightly protrude into the n$^+$-type source region 5.

A drain-side end of third p$^+$-type region 23 toward the drain is in contact with the n-type current diffusion region 3, or protrudes a predetermined depth d from the interface of the p-type base region 4 and the n-type current diffusion region 3 toward the drain (i.e., in the n-type current diffusion region 3). In other words, a depth d1 that the drain-side end of the third p$^+$-type region 23 protrudes from the interface of the p-type base region 4 and the n-type current diffusion region 3 toward the drain is at least 0.0 μm. The drain-side end of the third p$^+$-type region 23 terminates in the n-type current diffusion region 3, at a position shallower than that of the first p$^+$-type region 21 from the substrate front surface.

A part of the p-type base region 4 between the side wall of the trench 7 and the third p$^+$-type region 23 is a region (hereinafter, channel region) 4a in which a channel (n-type inversion layer) is formed along the side wall of the trench 7 when the MOSFET is in the ON state. A width of the channel region 4a is a distance t1 from the third p$^+$-type region 23 to the side wall of the trench 7. A thickness (i.e., a thickness of the p-type base region) t2 of the channel region 4a is the channel length L and, for example, is in a range from about 0.4 μm to 0.8 μm. A channel concentration is determined by impurity concentrations of the channel region 4a and the third p$^+$-type region 23.

An impurity concentration of the channel region 4a, at a side-wall surface region 4b of the trench 7 is set, for example, to be about 10% or less of a peak value (maximum value) of an impurity concentration of the third p$^+$-type region 23. Additionally, the impurity concentration of the channel region 4a at the side-wall surface region 4b of the trench 7 is set to be about 30% or less of the channel concentration (hereinafter, original channel concentration) of a structure without the third p$^+$-type region 23 provided therein. The original channel concentration is the channel concentration determined by only a p-type impurity concentration of the p-type base region 4.

The third p$^+$-type region 23 is a so-called HALO region that when the MOSFET is in the ON state, suppresses depletion layers respectively spreading in the p-type base region 4, from a pn junction of the p-type base region 4 and the n$^+$-type source region 5, and a pn junction of the p-type base region 4 and the n-type current diffusion region 3. Provision of the third p$^+$-type region 23 enables increases of the short channel effect to be suppressed when the MOSFET is in the ON state, even when the thickness t2 of the channel region 4a (=the channel length L) is reduced to facilitate reduction of the ON resistance and further enables decreases in the gate threshold voltage to be suppressed.

Arrangement and dimensions of the third p$^+$-type region 23 may be as follows. The distance t1 from the third p$^+$-type region 23 to the side wall of the trench 7 may be, for example, about 0.02 μm to 0.1 μm, and further may be, for example, about 0.04 μm to 0.08 μm. The depth d1 of the third p$^+$-type region 23 protruding toward the drain from the interface of the p-type base region 4 and the n-type current diffusion region 3 may be, for example, about 0.0 μm to 0.3 μm, and further may be, for example, deeper than 0.0 μm. A width (thickness along a direction orthogonal to the side wall of the trench 7) w1 of the third p$^+$-type region 23 may be at least 0.05 μm. With such dimensions and arrangement, the third p$^+$-type region 23 is provided, thereby enabling the tradeoff of reducing the ON resistance and suppressing decreases in the gate threshold voltage to be further improved.

An interlayer insulating film 11 is provided at the substrate front surface overall so as to cover the gate electrode 9 embedded in the trench 7. All of the gate electrodes 9 are electrically connected to a gate electrode pad (not depicted) by a non-depicted part (e.g., a metal contact provided near a border of the active region and the edge termination region). The source electrode 12 is in contact with the n$^+$-type source region 5 and the p$^{++}$-type contact region 6 via a contact hole opened in the interlayer insulating film 11, and is electrically connected with these regions. Further, the source electrode 12 is electrically insulated from the gate electrode 9 by the interlayer insulating film 11. At a rear surface (a rear surface of the n$^+$-type starting substrate 1 constituting an n$^+$-type drain region) of the semiconductor substrate 10, the drain electrode 13 is provided.

Figure 2:
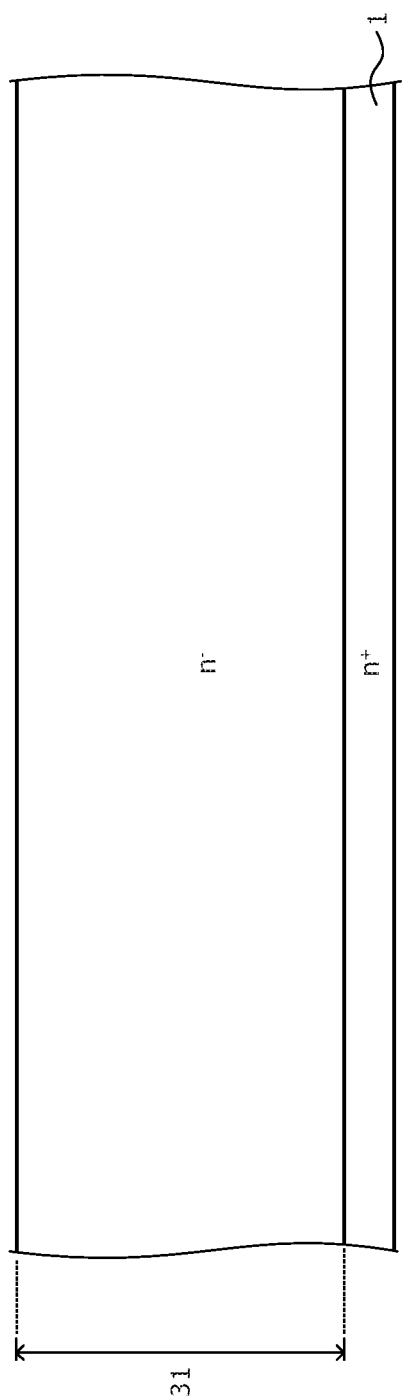
FIG. 2 is a cross-sectional view of the semiconductor device according to the first embodiment during manufacture.
Figure 3:
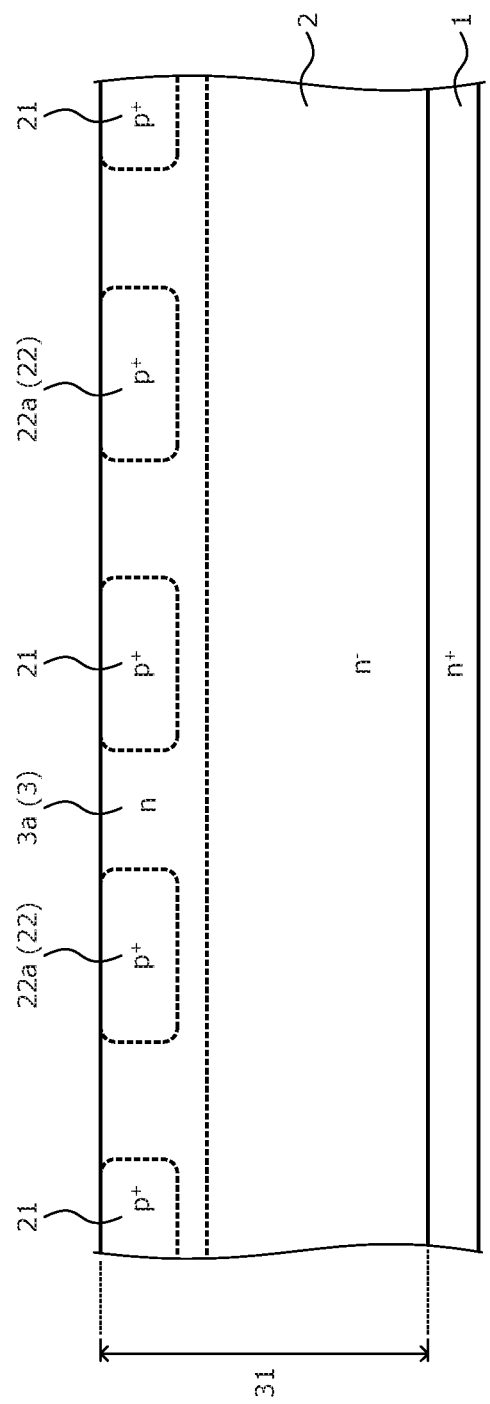
FIG. 3 is a cross-sectional view of the semiconductor device according to the first embodiment during manufacture.

A method of manufacturing a semiconductor device according to the present embodiment will described. FIGS. 2, 3, 4, 5, 6, 7, 8, and 9 are cross-sectional views of the semiconductor device according to the present embodiment during manufacture. FIG. 9 depicts an enlarged view near one of the trenches 7 depicted in FIG. 7. First, as depicted in FIG. 2, the n$^+$-type starting substrate 1 constituting the n$^+$-type drain region is prepared. Next, on the front surface of the n$^+$-type starting substrate 1, the n$^-$-type silicon carbide layer 31 is formed by epitaxial growth. Next, as depicted in FIG. 3, by photolithography and ion implantation of a p-type impurity, the first p$^+$-type region 21 and a p$^+$-type region (hereinafter, p$^+$-type partial region) 22a are each selectively formed in a surface layer of the n$^-$-type silicon carbide layer 31. The p$^+$-type partial region 22a is a part of the second p$^+$-type region 22.

Next, by photolithography and ion implantation of an n-type impurity, for example, an n-type region (hereinafter, n-type partial region) 3a in the surface layer of the n$^-$-type silicon carbide layer 31 is formed spanning the active region entirely. The n-type partial region 3a is a part of the n-type current diffusion region 3. Here, a depth of the n-type partial region 3a is deeper than that of the first p$^+$-type region 21 and that of the p$^+$-type partial region 22a; and drain sides (side facing toward the n$^+$-type starting substrate 1) of the first p$^+$-type region 21 and the p$^+$-type partial region 22a are entirely covered by the n-type partial region 3a. A part of the n$^-$-type silicon carbide layer 31 closer to the drain than is the n-type partial region 3a constitutes the n$^-$-type drift region 2. A sequence in which the n-type partial region 3a and, the first p$^+$-type region 21 and the p$^+$-type partial region 22a are formed may be interchanged.

Figure 4:
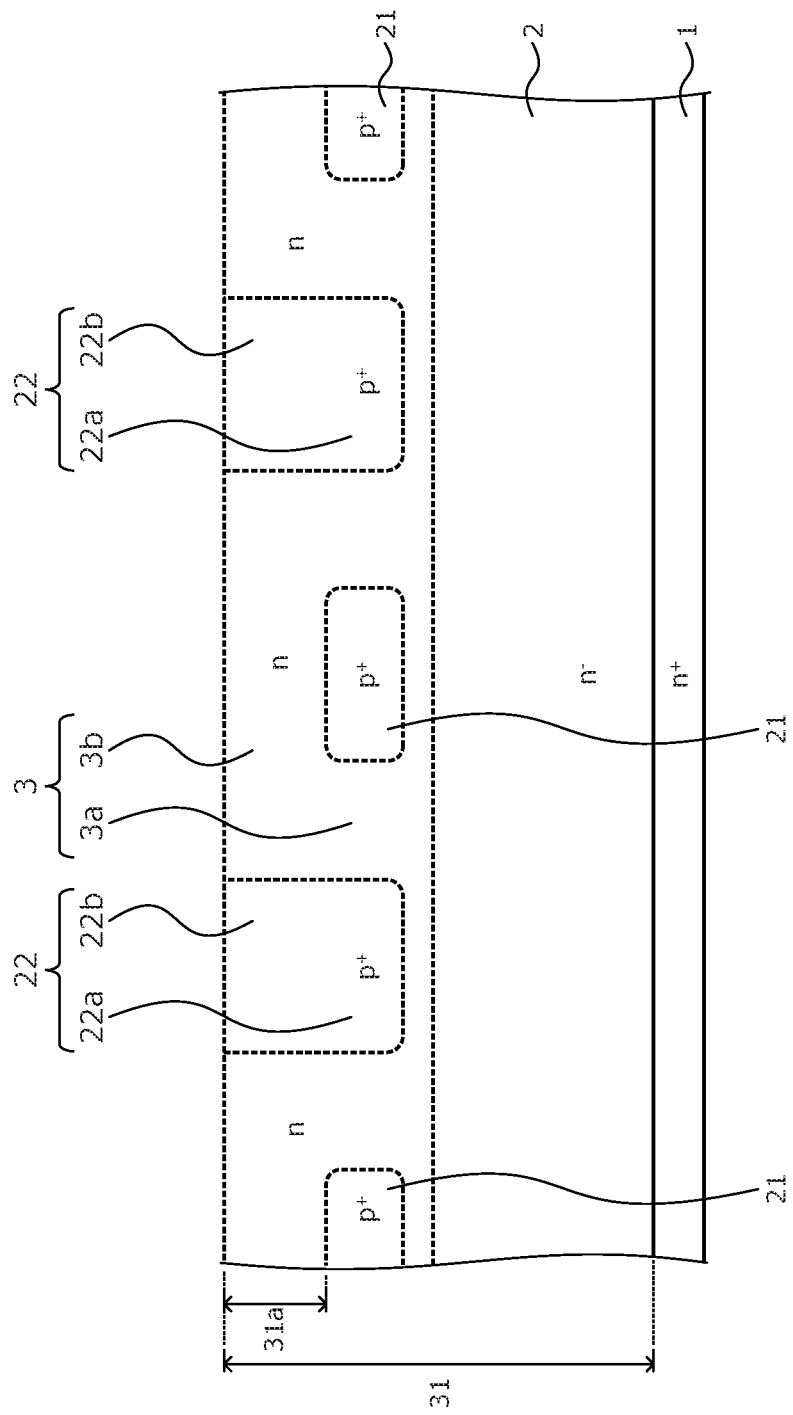
FIG. 4 is a cross-sectional view of the semiconductor device according to the first embodiment during manufacture.

Next, as depicted in FIG. 4, on the n$^-$-type silicon carbide layer 31, an n$^-$-type silicon carbide layer is further formed by epitaxial growth, increasing a thickness of the n$^-$-type silicon carbide layer 31. Next, by photolithography and ion implantation of a p-type impurity, in a part (the surface layer of the n$^-$-type silicon carbide layer 31) 31a of the n$^-$-type silicon carbide layer 31 where the thickness of the n$^-$-type silicon carbide layer 31 is increased, at a region therein opposing the p$^+$-type partial region 22a in the depth direction, a p$^+$-type partial region 22b is formed at a depth so as to be in contact with the p$^+$-type partial region 22a. A width and impurity concentration of the p$^+$-type partial region 22b are, for example, substantially equal to those of the p$^+$-type partial region 22a. The p$^+$-type partial regions 22a, 22b are connected in the depth direction, forming the second p$^+$-type region 22.

Figure 5:
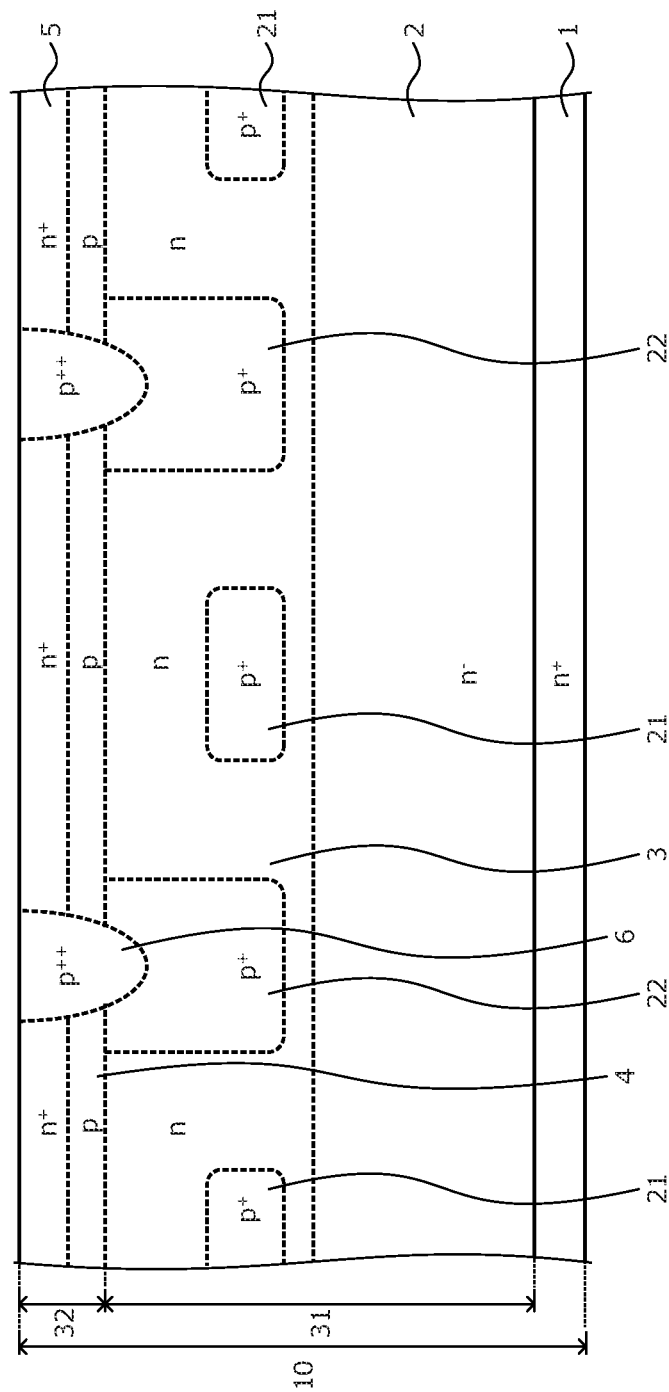
FIG. 5 is a cross-sectional view of the semiconductor device according to the first embodiment during manufacture.

Next, by photolithography and ion implantation of an n-type impurity, for example, spanning the active region overall, an n-type partial region 3b is formed in the part 31a where the thickness of the n$^-$-type silicon carbide layer 31 is increased, at a depth reaching the n-type partial region 3a. An impurity concentration of the n-type partial region 3b is substantially equal to that of the n-type partial region 3a. The n-type partial regions 3a, 3b are connected in the depth direction, forming the n-type current diffusion region 3. A sequence in which the p$^+$-type partial region 22b and the n-type partial region 3b are formed may be interchanged. Next, as depicted in FIG. 5, on the n$^-$-type silicon carbide layer 31, the p-type silicon carbide layer 32 is formed by epitaxial growth. As a result, the semiconductor substrate (semiconductor wafer) 10 is formed in which the n$^-$-type silicon carbide layer 31 and the p-type silicon carbide layer 32 are sequentially stacked on the n$^+$-type starting substrate 1.

Next, by photolithography and ion implantation of an n-type impurity, for example, spanning the active region overall, the n$^+$-type source region 5 is formed in the surface layer of the p-type silicon carbide layer 32. Next, by photolithography and ion implantation of a p-type impurity, the p$^{++}$-type contact region 6 is selectively formed in the surface layer of the p-type silicon carbide layer 32, at a depth so as to penetrate the n$^+$-type source region 5 in the depth direction. A sequence in which the n$^+$-type source region 5 and the p$^{++}$-type contact region 6 are formed may be interchanged. A part of the p-type silicon carbide layer 32 excluding the n$^+$-type source region 5 and the p$^{++}$-type contact region 6 is the p-type base region 4. In all ion implantations and oblique ion implantations described hereinafter performed in this manufacturing process, a resist film may be used as a mask, or an oxide film may be used as a mask.

Figure 6:
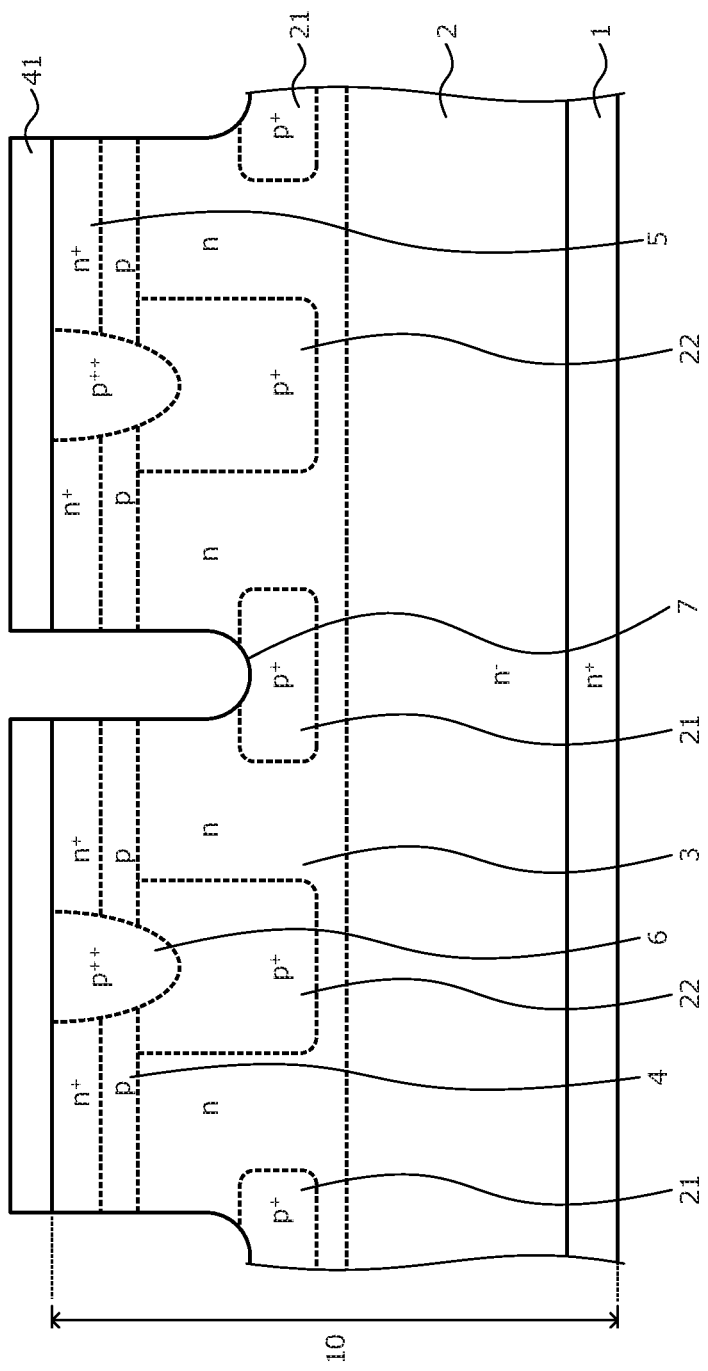
FIG. 6 is a cross-sectional view of the semiconductor device according to the first embodiment during manufacture.

Next, as depicted in FIG. 6, for example, by a thermal oxidation method or a chemical vapor deposition method (CVD), an oxide film 41 is formed at the front surface of the semiconductor substrate 10 (surfaces of the n$^+$-type source region 5 and the p$^{++}$-type contact region 6). Next, by photolithography and etching, the oxide film 41 is selectively removed, opening parts that correspond to formation regions of the trench 7. Next, a remaining part of the oxide film 41 is used as a mask and etching is performed, forming the trenches 7 to penetrate the n$^+$-type source region 5 and the p-type base region 4, and reach the first p$^+$-type region 21 in the n-type current diffusion region 3.

Figure 7:
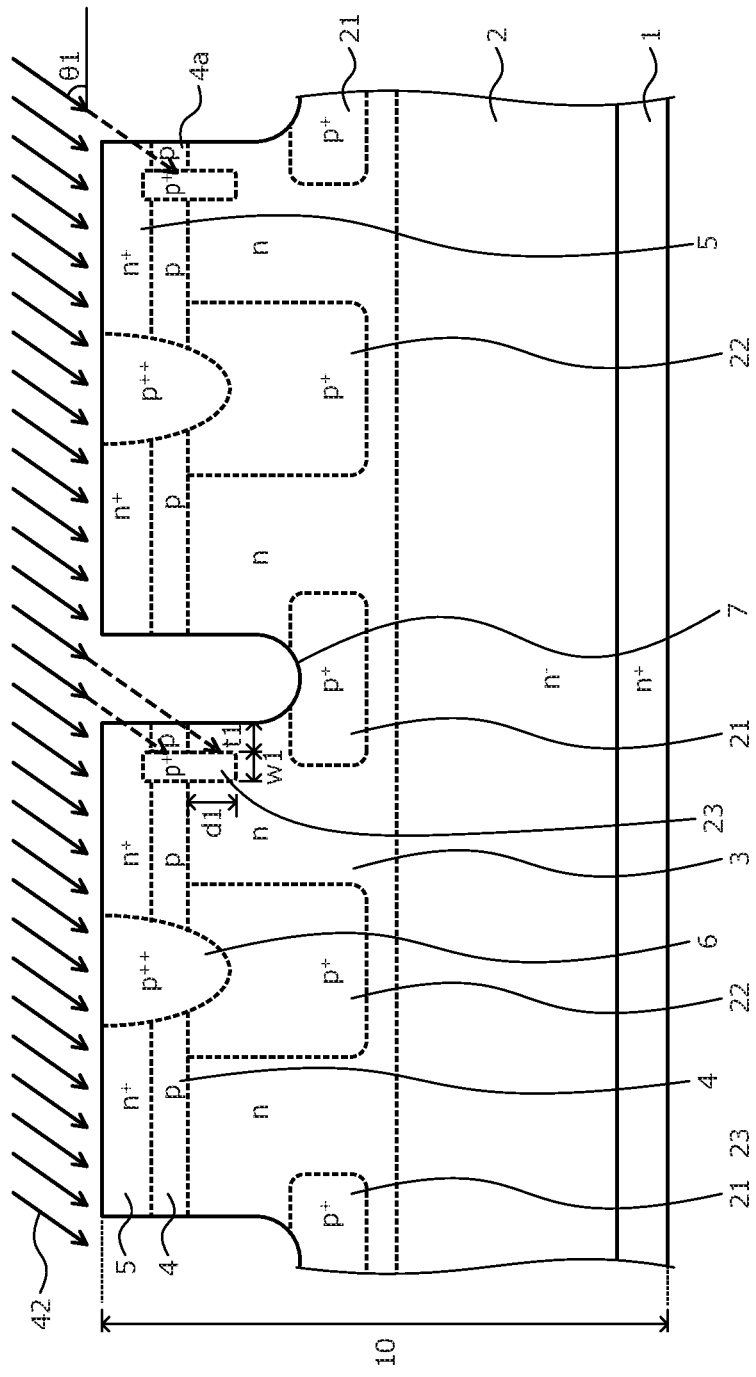
FIG. 7 is a cross-sectional view of the semiconductor device according to the first embodiment during manufacture.

Next, as depicted in FIG. 7, after the oxide film 41 is removed, a p-type impurity such as aluminum (Al) is ion implanted (hereinafter, oblique ion implantation 42) in first side walls of the trenches 7 from an oblique direction that is a predetermined implantation angle θ1 relative to the front surface of the semiconductor substrate 10. As a result, the third p$^+$-type region 23 is selectively formed in the p-type base region 4 (or spanning into the n-type current diffusion region 3 from the p-type base region 4), separated from the first side walls of the trenches 7 by the predetermined distance t1. At this time, conditions of the oblique ion implantation 42 are set based on the predetermined distance t1 from the third p$^+$-type region 23 to the side wall of the trench 7, the predetermined depth d1 of the third p$^+$-type region 23 from the interface of the p-type base region 4 and the n-type current diffusion region 3 toward the drain, and the width w1 of the third p$^+$-type region 23.

Figure 8:
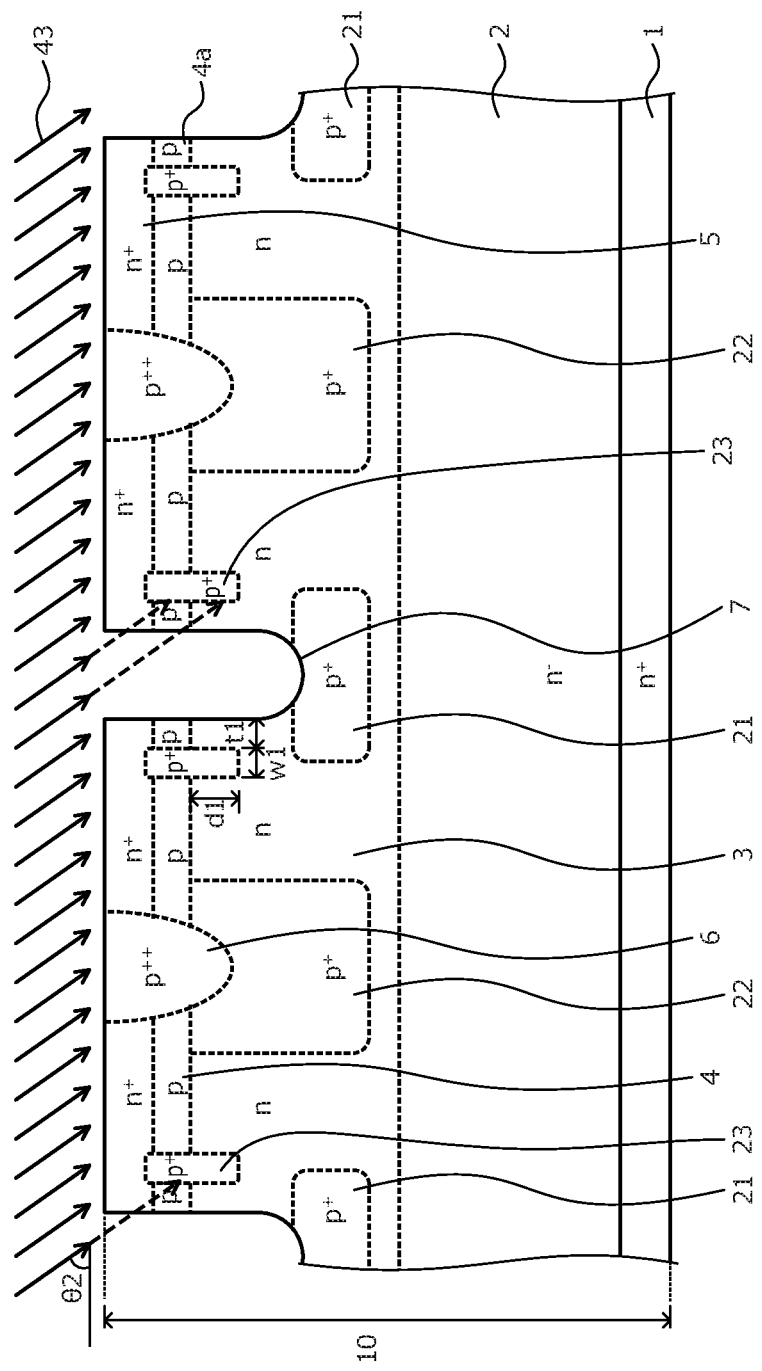
FIG. 8 is a cross-sectional view of the semiconductor device according to the first embodiment during manufacture.
Figure 9:
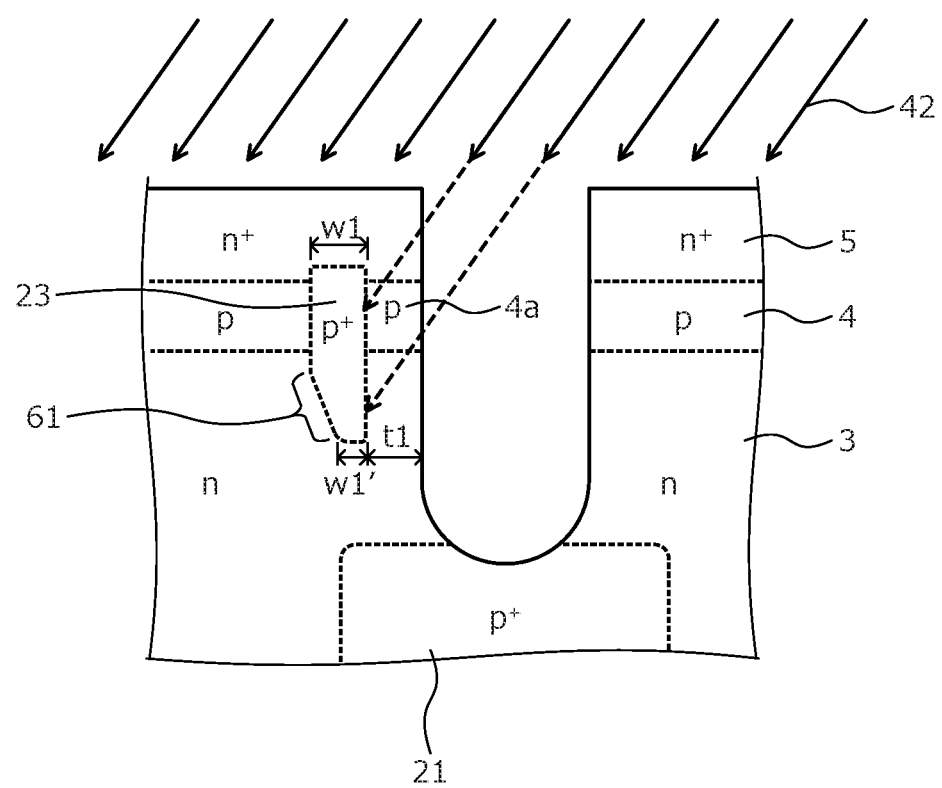
FIG. 9 is a cross-sectional view of the semiconductor device according to the first embodiment during manufacture.

Next, as depicted in FIG. 8, after the oxide film 41 is removed, an oblique ion implantation 43 of a p-type impurity such as aluminum in second side walls of the trenches 7 from an oblique direction that is a predetermined implantation angle θ2 relative to the front surface of the semiconductor substrate 10. As a result, the third p$^+$-type region 23 is selectively formed in the p-type base region 4 (or spanning into the n-type current diffusion region 3 from the p-type base region 4), separated from the second side walls of the trenches 7 by the predetermined distance t1. In other words, to ion implant a p-type impurity into the second side walls of the trenches 7, the oblique ion implantation 43 is performed with respect to the second side walls of the trenches 7, at the implantation angle θ2 that is symmetrical to the implantation angle θ1 of the oblique ion implantation 42 performed with respect to the first side walls of the trenches 7. Excluding the implantation angle θ2, conditions of the oblique ion implantation 43 performed with respect to the second side walls of the trenches 7 are similar to those of the oblique ion implantation 42 performed with respect to the first side walls of the trenches 7.

The implantation angles θ1, θ2 of the oblique ion implantations 42, 43, for example, may be in a range from about 30 degrees to 60 degrees relative to the front surface of the semiconductor substrate 10. Acceleration energies of the oblique ion implantations 42, 43 may be, for example, in a range from about 150 keV to 350 keV. Further, the implantation angles θ1, θ2 of the oblique ion implantations 42, 43, acceleration energies and dose amounts of the oblique ion implantations 42, 43 are set so as to satisfy the following three conditions. A first condition is a condition that a position that is deeper than a silicon face (the side wall of the trench 7) is a range of the p-type impurity (in FIGS. 7 and 8, range positions of the p-type impurity are indicated by terminal positions of dotted lined arrows (similarly in FIG. 9)).

A second condition is a condition that the impurity concentration of the channel region 4a, at the side-wall surface region 4b of the trench 7 is at most 10% of a peak value of the impurity concentration of the third p+-type region 23. A third condition is a condition that the impurity concentration of the channel region 4a, at the side-wall surface region 4b of the trench 7 is at most 30% of the original channel concentration. Further, an impurity concentration of the p-type silicon carbide layer 32 may be, for example, about $1\times10^{17}/cm^3$ or higher so as to prevent punch-through due to the depletion layers that spread in the p-type base region 4, respectively from the drain side and the source side when the MOSFET is in the ON state.

For example, the impurity concentration of the p-type silicon carbide layer 32 is assumed to be about $1.5\times10^{17}/cm^3$. In this case, acceleration energies and the dose amounts of the oblique ion implantations 42, 43 are set so that the peak value of the impurity concentration of the third p+-type region 23 becomes about $3.0\times10^{17}/cm^3$ and the p-type impurity concentration of the channel region 4a at the side-wall surface region 4b of the trench 7 becomes about $3.0\times10^{16}/cm^3$. During the oblique ion implantations 42, 43, the $n^+$-type source region 5 and the $p^{++}$-type contact region 6 are also ion implanted with the p-type impurity. However, the $n^+$-type source region 5 and the $p^{++}$-type contact region 6 have high impurity concentrations (for example, the impurity concentration of the $n^+$-type source region 5 is about $1\times10^{19}/cm^3$), and the impurity concentration of the third $p^+$-type region 23 is at least 10 times lower than the impurity concentrations of the $n^+$-type source region 5 and the $p^{++}$-type contact region 6. Therefore, even when the p-type impurity is ion implanted in the $n^+$-type source region 5 and/or the $p^{++}$-type contact region 6 during the oblique ion implantations 42, 43, MOSFET characteristics are not affected.

In this manner, the third $p^+$-type region 23 is formed by the oblique ion implantations 42, 43, thereby enabling the predetermined distance t1 from the third $p^+$-type region 23 to the side wall of the trench 7 to be obtained stably. On the other hand, with the oblique ion implantations 42, 43, at the drain-side end of the third $p^+$-type region 23, a part 61 thereof that is deepest from the side wall of the trench 7 in a direction orthogonal to the side wall of the trench 7 becomes oblique relative to the side wall of the trench 7, and a width w1' of the drain-side end of the third $p^+$-type region 23 becomes narrower than the predetermined width w1 (refer to FIG. 9). Therefore, the predetermined width w1 of the third $p^+$-type region 23 may be set with consideration that the width w1' of the drain-side end of the third $p^+$-type region 23 becomes narrower.

Next, a non-depicted carbon (C) film is formed along the front surface of the semiconductor substrate 10 and the inner walls of the trenches 7. Next, heat treatment (activation annealing) for activating the impurities is performed with respect to all of the regions formed by ion implantation. Next, the carbon film is removed. Next, heat treatment (annealing) for rounding corners of the bottoms of the trenches 7 and openings of the trenches 7 is performed. Next, by a general method, the gate insulating film 8, the gate electrode 9, the interlayer insulating film 11, contact holes, the source electrode 12, and the drain electrode 13 are formed. Thereafter, the semiconductor wafer is diced (cut) into individual chips, whereby the MOSFET depicted in FIG. 1 is completed.

As described above, according to the first embodiment, the third $p^+$-type region is provided in the p-type base region so as to be separated from and parallel to the trench side wall, whereby the p-type impurity concentration of a part of the p-type base region opposing the side wall of the trench across the channel region is increased. As a result, the spreading of depletion layers in the p-type base region, from the drain side and the source side respectively when the MOSFET is in the ON state, may be suppressed. Therefore, even when the channel length is shortened to reduce the ON resistance, increases of the short channel effect may be suppressed, enabling decreases in the gate threshold voltage to be suppressed.

Further, according to the first embodiment, formation of the third $p^+$-type region in the p-type base region by the oblique ion implantation performed with respect to the side wall of the trench enables the third $p^+$-type region to be formed by self-alignment with respect to the side wall of the trench. Therefore, the third $p^+$-type region may be formed with precision at a position that is separated by a predetermined distance in a direction orthogonal to the side wall of the trench.

Figure 10:
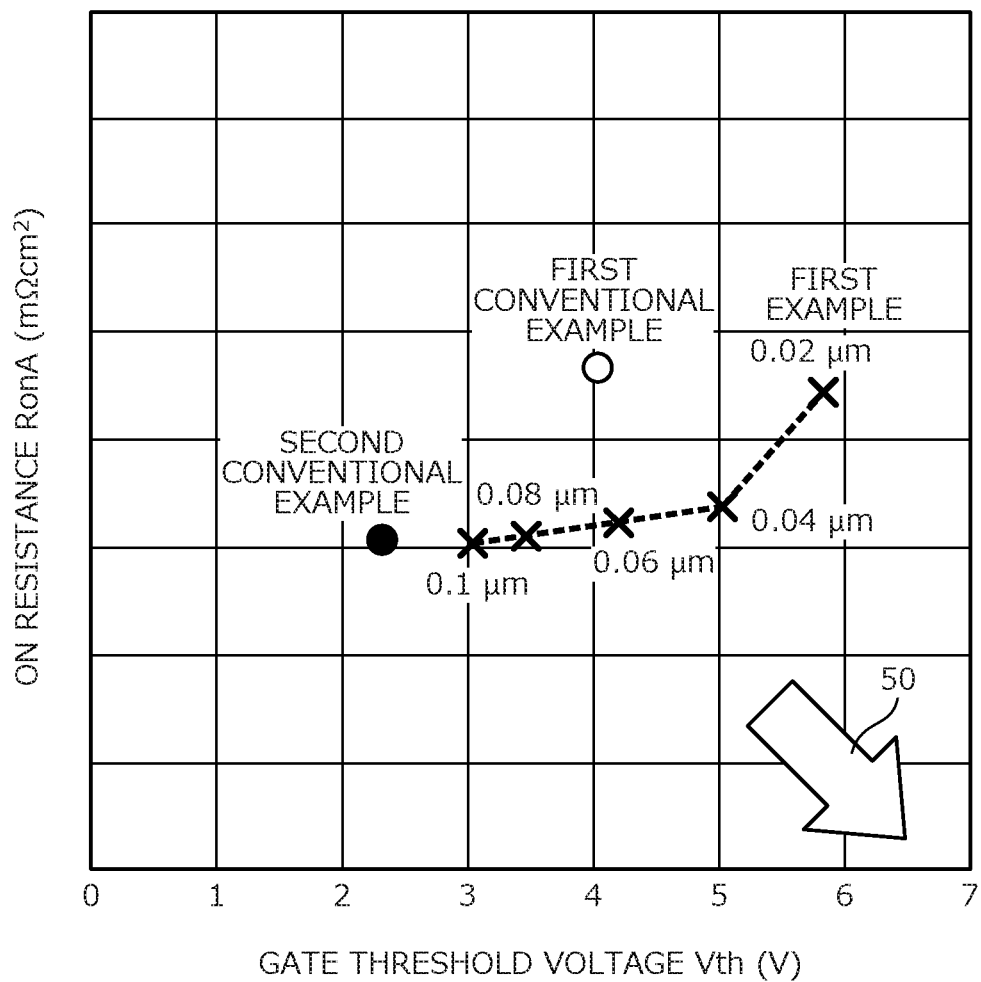
FIG. 10 is a characteristics diagram depicting simulation results of a first example.

A relationship of the ON resistance RonA and the gate threshold voltage Vth was verified. First, in a MOSFET (hereinafter, a first example) that has the structure of the semiconductor device according to the described embodiment, calculated results of the ON resistance RonA and the gate threshold voltage Vth when the distance t1 from the third $p^+$-type region 23 to the side wall of the trench is variously changed are indicated in FIG. 10 by "x". FIG. 10 is a characteristics diagram depicting simulation results of the first example.

FIG. 10 depicts results when in the first example, the distance t1 from the third $p^+$-type region 23 to the side wall of the trench 7 is 0.02 μm, 0.04 μm, 0.06 μm, 0.08 μm, and 0.1 μm. Further, FIG. 10 further depicts, for comparison, results of the first and the second conventional examples of FIG. 37 by "○" and "●", respectively. A direction (lower right direction) from a start point toward a terminal point of arrow 50 is a direction by which the tradeoff of reducing the ON resistance RonA and suppressing decreases in the gate threshold voltage Vth improves (similarly in FIG. 13A).

As depicted in FIG. 10, for all the results of differing cases of the distance t1 from third $p^+$-type region 23 to the side wall of the trench 7, the first example is found to be positioned further in the direction (lower right direction) by which the tradeoff of reducing the ON resistance RonA and suppressing decreases in the gate threshold voltage Vth improves, than are the first and the second conventional examples. In other words, it was confirmed that, similar to the first example, provision of the third $p^+$-type region 23 opposing the trench 7 across the channel region 4a improves the tradeoff reducing the ON resistance RonA and suppressing decreases in the gate threshold voltage Vth.

In the first example, the ON resistance RonA increases as the distance t1 from the third $p^+$-type region 23 to the side wall of the trench 7 decreases for the following reason. The shorter is the distance t1 from the third $p^+$-type region 23 to the side wall of the trench 7, a total dose amount of the channel region 4a increases at the time of formation of the third $p^+$-type region 23 by the oblique ion implantations 42, 43. As a result, mobility decreases. Therefore, the distance t1 from the third $p^+$-type region 23 to the side wall of the trench 7 may be in a range from about 0.04 μm to 0.08 μm by which the tradeoff of reducing the ON resistance RonA and suppressing decreases in the gate threshold voltage Vth, is further improved.

Figure 11:
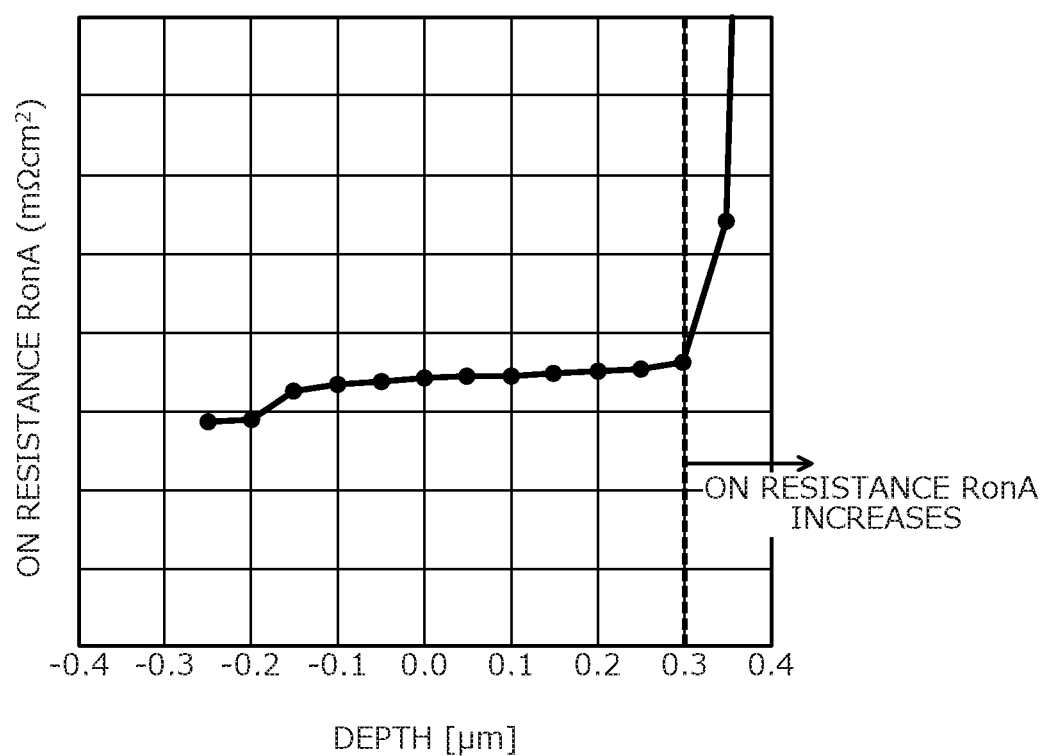
FIG. 11 is a characteristics diagram depicting simulation results of a second example.

Next, in a MOSFET (hereinafter, a second example) that has the structure of the semiconductor device according to the first embodiment, calculated results of the ON resistance RonA and the gate threshold voltage Vth when the depth d1 of the third p$^+$-type region 23 protruding from the interface of the p-type base region 4 and the n-type current diffusion region 3 toward the drain is variously changed are depicted in FIG. 11. FIG. 11 is a characteristics diagram depicting simulation results of the second example.

In FIG. 11, the depth d1>0.0 μm is a case in which the third p$^+$-type region 23 protrudes toward the drain, from the interface of the p-type base region 4 and the n-type current diffusion region 3. The depth d1=0.0 μm is a case in which the drain-side end of the third p$^+$-type region 23 is positioned at the interface of the p-type base region 4 and the n-type current diffusion region 3. The depth d1<0.0 μm is a case in which the third p$^+$-type region 23 does not protrude toward the drain, from the interface of the p-type base region 4 and the n-type current diffusion region 3.

From the results depicted in FIG. 11, in the case of the depth d1>0.3 μm, the ON resistance RonA was confirmed to increase. A reason for this is as follows. The deeper is the depth d1 that the third p$^+$-type region 23 protrudes from the interface of the p-type base region 4 and the n-type current diffusion region 3 toward the drain, the closer is the third p$^+$-type region 23 to the first p$^+$-type region 21. As a result, a current path (a part of the n-type current diffusion region 3 sandwiched by the third p$^+$-type region 23 and the first p$^+$-type region 21) becomes narrower and parasitic resistance increases. Therefore, from the results depicted in FIG. 11, the depth d1 may be in a range from about 0.0 μm to 0.3 μm.

Figure 12:
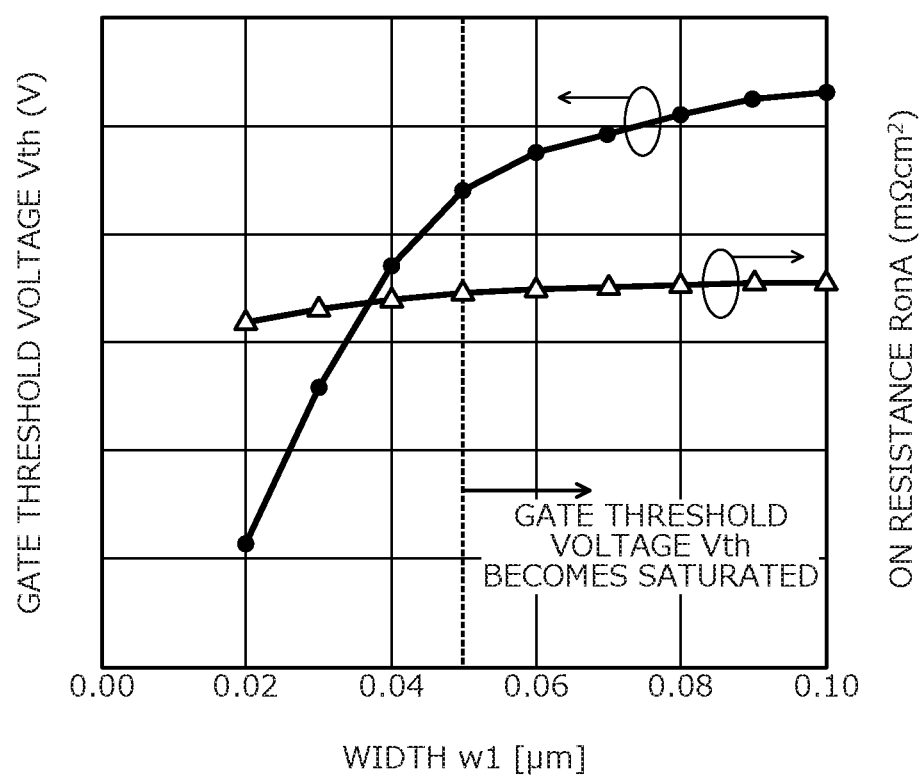
FIG. 12 is a characteristics diagram depicting simulation results of a third example.

Next, for a MOSFET (hereinafter, a third example) that has the semiconductor device according to the first embodiment, calculated results of the ON resistance RonA and the gate threshold voltage Vth when the width w1 of the third p$^+$-type region 23 is variously changed are depicted in FIG. 12. FIG. 12 is a characteristics diagram depicting simulation results of the third example.

From the results depicted in FIG. 12, the ON resistance RonA was confirmed to indicate a substantially constant value without being dependent on the width w1 of the third p$^+$-type region 23. Further, it was confirmed that when the width w1 of the third p$^+$-type region 23 is increased to a certain thickness, the gate threshold voltage Vth begins to saturate and a substantially constant value is shown. In particular, it was found that when the width w1 of the third p$^+$-type region 23 is at least 0.05 μm, the gate threshold voltage Vth begins to saturate and the width w1 of the third p$^+$-type region 23 is favorably at least 0.05 μm.

Figure 13B:
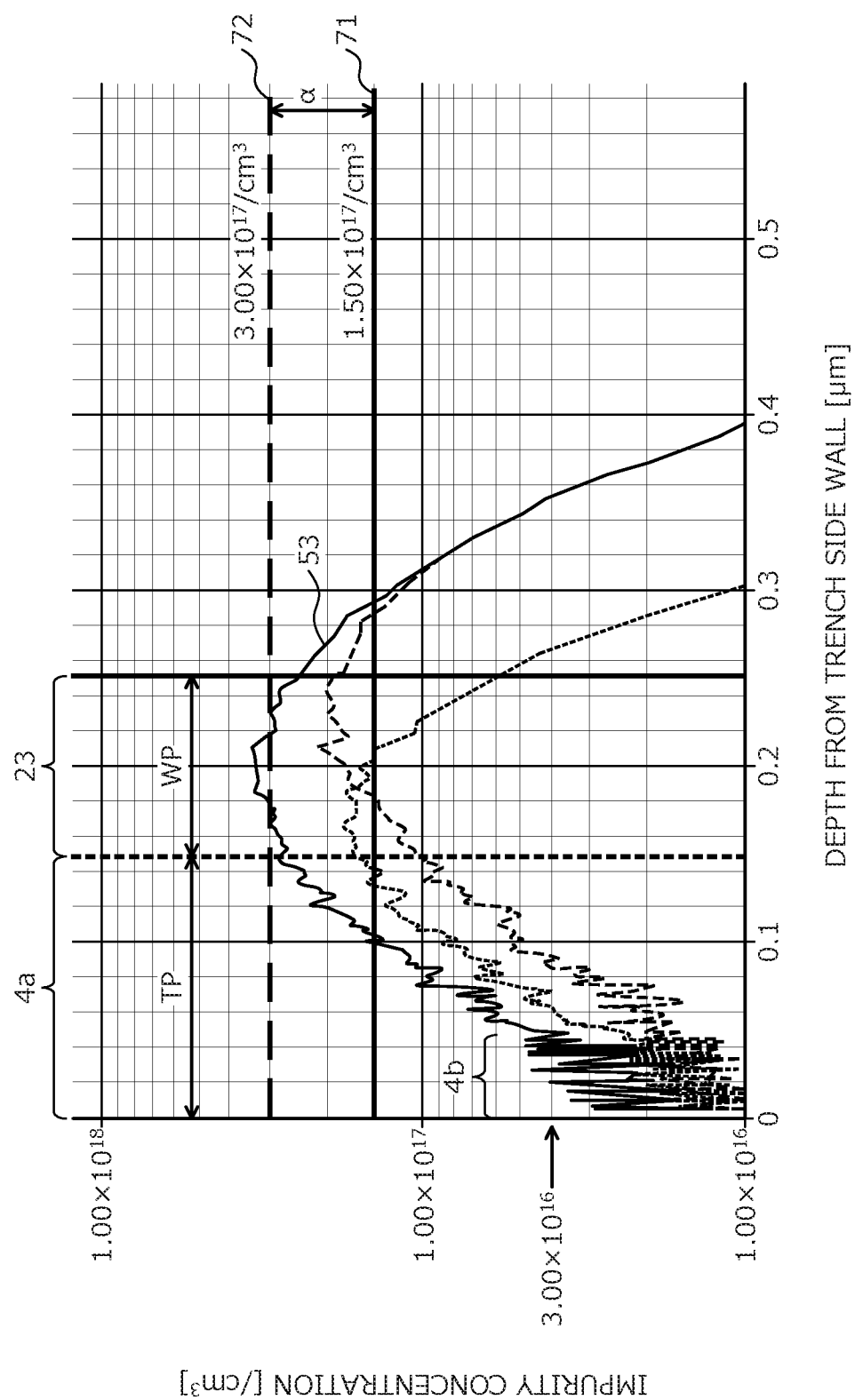
FIG. 13B is a characteristics diagram depicting an example of an impurity concentration profile by oblique ion implantation.
Figure 13C:
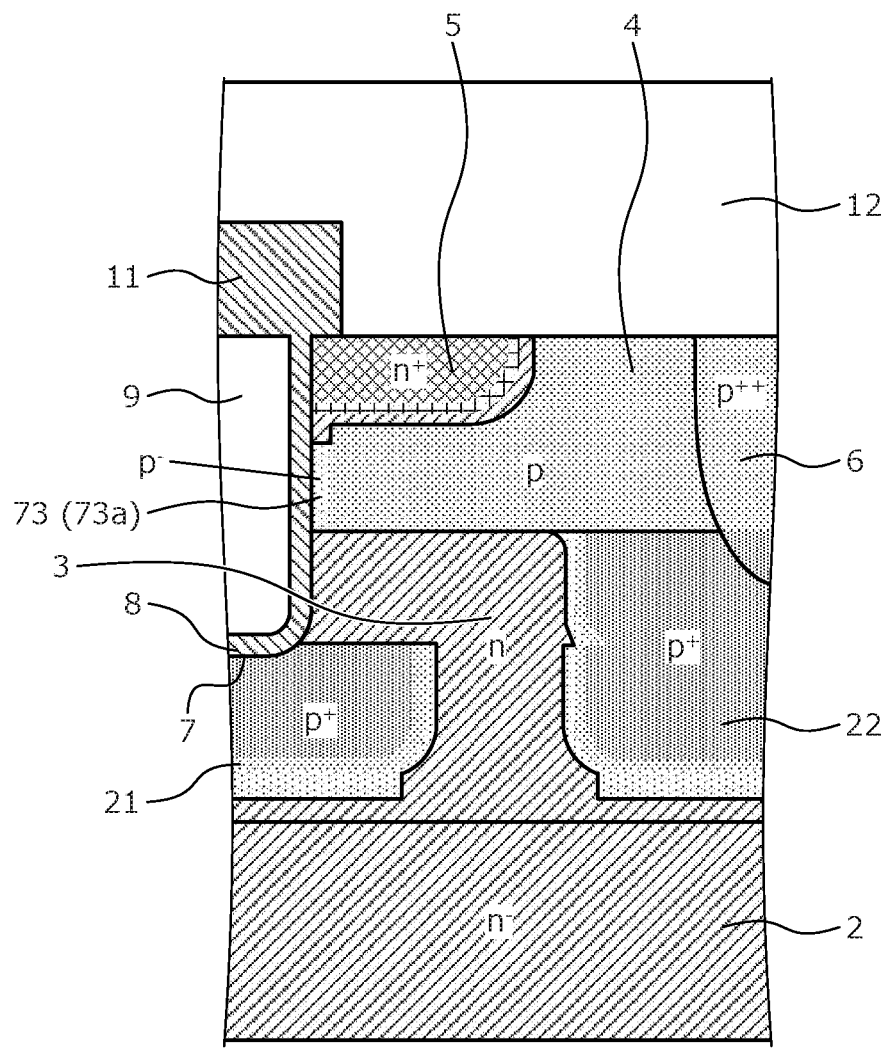
FIG. 13C is a cross-sectional view of a part of a structure of a MOSFET of first to third comparison examples.

Next, conditions of the oblique ion implantations 42, 43 for forming the third p$^+$-type region 23 were verified. In a method of manufacturing the semiconductor device according to the first embodiment, conditions (hereinafter, fourth to sixth examples) of the oblique ion implantations 42, 43 were variously changed, and calculated results for the ON resistance RonA and the gate threshold voltage Vth are depicted in FIG. 13A. FIG. 13A is a characteristics diagram depicting simulation results of the fourth to the sixth examples. FIG. 13A depicts the gate threshold voltage Vth and the ON resistance RonA in a case where a drain voltage Vd is 20V. FIG. 13B is a characteristics diagram depicting an example of an impurity concentration profile by the oblique ion implantation. FIG. 13C is a cross-sectional view of a part of the structure of the MOSFET of first to third comparison examples.

The channel length L of the fourth to the sixth examples was 0.4 μm. Further, in the fourth to the sixth examples, the acceleration energies and the dose amounts of the oblique ion implantations 42, 43 were adjusted so that the predetermined distance t1 from the third p$^+$-type region 23 to the side wall of the trench 7 was 0.15 μm, 0.1 μm, and 0.05 μm, and the p-type impurity concentration of the channel region 4a at the side-wall surface region 4b of the trench 7 was about 3.0×10$^{16}$/cm$^3$. The implantation angles θ1, θ2 of the oblique ion implantations 42, 43 were set to be 45 degrees relative to the front surface of the semiconductor substrate 10.

For the fourth to the sixth examples, simulation results are shown for a case in which the peak value of the impurity concentration of the third p+-type region 23 was 2.0×10$^{17}$/cm$^3$, 3.0×10$^{17}$/cm$^3$, and 4.0×10$^{17}$/cm$^3$. For example, in the fourth example, a targeted width WP of a part of the third p+-type region 23 indicating a vicinity of the peak value of the impurity concentration was about 0.1 μm. Additionally, as depicted in FIG. 13B, the impurity concentration of the p-type silicon carbide layer 32 was assumed to be about 1.5×10$^{17}$/cm$^3$ (indicated by horizontal line 71), a target of the peak value of the impurity concentration was about 3.0×10$^{17}$/cm$^3$ (indicated by horizontal line 72). A distance TP of a target depth from the side wall of the trench 7 to a target depth of the peak value of the impurity concentration of the third p+-type region 23 was about 0.15 μm. The impurity concentration at the side-wall surface region 4b of the trench 7 in the p-type impurity concentration profile by the oblique ion implantations 42, 43 were about 3.0×10$^{16}$/cm$^3$ that is 10% of target of the peak value of the impurity concentration of the third p+-type region 23. The third p$^+$-type region 23 is assumed to be formed to have a p-type impurity concentration profile 53. Reference character α is a p-type impurity concentration difference of the p-type silicon carbide layer 32 and the third p$^+$-type region 23.

At the time of the oblique ion implantations 42, 43, the p-type impurity concentration profile 53 pulls on a tail (a part where the impurity concentration decreases along a gradual slope like a flaring of a hem) toward the side wall of the trench 7. Therefore, the distance TP of the depth of the target peak value of the impurity concentration of the third p+-type region 23 from the side wall of the trench 7 has to be set to a distance deeper from the side wall of the trench 7 than is the distance t1 from the side wall of the trench 7 to the third p$^+$-type region 23. In other words, the oblique ion implantations 42, 43 set the predetermined distance TP to be a target depth of the peak value of the impurity concentration of the third p+-type region 23 from the side wall of the trench 7. The conditions of the oblique ion implantations 42, 43 are set so that the impurity concentration from the target depth (the distance TP from the side wall of the trench 7) of the peak value of the impurity concentration of the third p+-type region 23 from the side wall of the trench 7, to the depth of the targeted width WP shows a peak value vicinity of the impurity concentration of the third p+-type region 23. Additionally, the oblique ion implantations 42, 43 are each performed in multiple stages (plural times), forming the predetermined p-type impurity concentration profile 53 in each surface layer of both side walls of the trench 7.

For example, when the p-type impurity concentration profile 53 depicted in FIG. 13B is obtained, in the fourth example, an example of the conditions of the oblique ion implantations 42, 43 for the p-type impurity concentration of the channel region 4a at the side-wall surface region 4b of the trench 7 to be set in a range from about $1.0 \times 10^{16}/cm^3$ to $5.0 \times 10^{16}/cm^3$ is as follows. For example, the oblique ion implantations 42, 43 are each performed in two stages. The oblique ion implantations 42, 43 of a first-stage oblique ion implantation are assumed to each have an acceleration energy and dose about in a range from about 200 keV to 400 keV and a range from about $2.5 \times 10^{12}/cm^2$ to $4.5 \times 10^{12}/cm^2$, respectively, and the implantation angles θ1, θ2 are assumed to be in a range from about 40 degrees to 50 degrees relative to the front surface of the semiconductor substrate 10. Further, the oblique ion implantations 42, 43 of a second-stage oblique ion implantation are assumed to have an acceleration energy and a dosing amount in a range from about 150 keV to 300 keV and a range from about $1.5 \times 10^{12}/cm^2$ to $3.5 \times 10^{12}/cm^2$, respectively, and the implantation angles θ1, θ2 are assumed to be in a range from about 40 degrees to 50 degrees relative to the front surface of the semiconductor substrate 10.

Further, in FIG. 13A, for comparison, simulation results of the first and the second conventional examples described above of depicted. Further, simulation results are depicted of the first to the third comparison examples that have in place of the third $p^+$-type region 23, in a part along the side wall of the trench 7, a $p^-$-type region (hereinafter, a $p^-$-type BOX region 73, refer to FIG. 13C) that has a box profile (the impurity concentration is uniform) and that is in contact with the trench 7. In other words, the $p^-$-type BOX region 73 is formed in a channel region 73a. The first and the second conventional examples are assumed to have respective channel lengths of 0.4 μm and 0.85 μm. Simulation results are depicted for cases where in the first and the second conventional examples, the channel concentration is assumed to be $1.0 \times 10^{17}/cm^3$, $1.5 \times 10^{17}/cm^3$, $2.0 \times 10^{17}/cm^3$, $2.5 \times 10^{17}/cm^3$, and $3.0 \times 10^{17}/cm^3$.

The $p^-$-type BOX region 73 of the first to the third comparison examples have an impurity concentration that is lower than that of the p-type base region 104 and in the p-type base region 104, the $p^-$-type BOX region 73 is exposed at the side wall of the trench 107. The $p^-$-type BOX region 73, for example, is a diffusion region formed by ion implantation from a direction orthogonal to the substrate front surface or a region formed by epitaxial growth. In the first to the third comparison examples, a width (thickness in a direction orthogonal to the side wall of the trench 107) of the $p^-$-type BOX region 73 is assumed to be 0.04 μm, 0.06 μm, and 0.08 μm, respectively. The first to the third comparison examples show simulation results for cases where the $p^-$-type BOX region 73 is $2.0 \times 10^{17}/cm^3$, $3.0 \times 10^{17}/cm^3$, and $4.0 \times 10^{17}/cm^3$, respectively.

From the results depicted in FIG. 13A, the fourth to the sixth examples confirm that the tradeoff of reducing the ON resistance RonA and suppressing decreases in the gate threshold voltage Vth may be improved to a greater extent than in the first and the second conventional examples. Further, the fourth to the sixth examples confirm that the tradeoff of reducing the ON resistance RonA and suppressing decreases in the gate threshold voltage Vth may be improved to about a same extent as in the first to the third comparison examples. Further, the fourth to the sixth examples confirm that the third $p^+$-type region 23 may be formed by the oblique ion implantations 42, 43 with precision at a deep position of the predetermined distance t1 in a direction orthogonal to the trench side wall and confirm that it is possible to realize characteristics about equivalent to a case in which the $p^-$-type BOX region 73 is provided.

Figure 14:
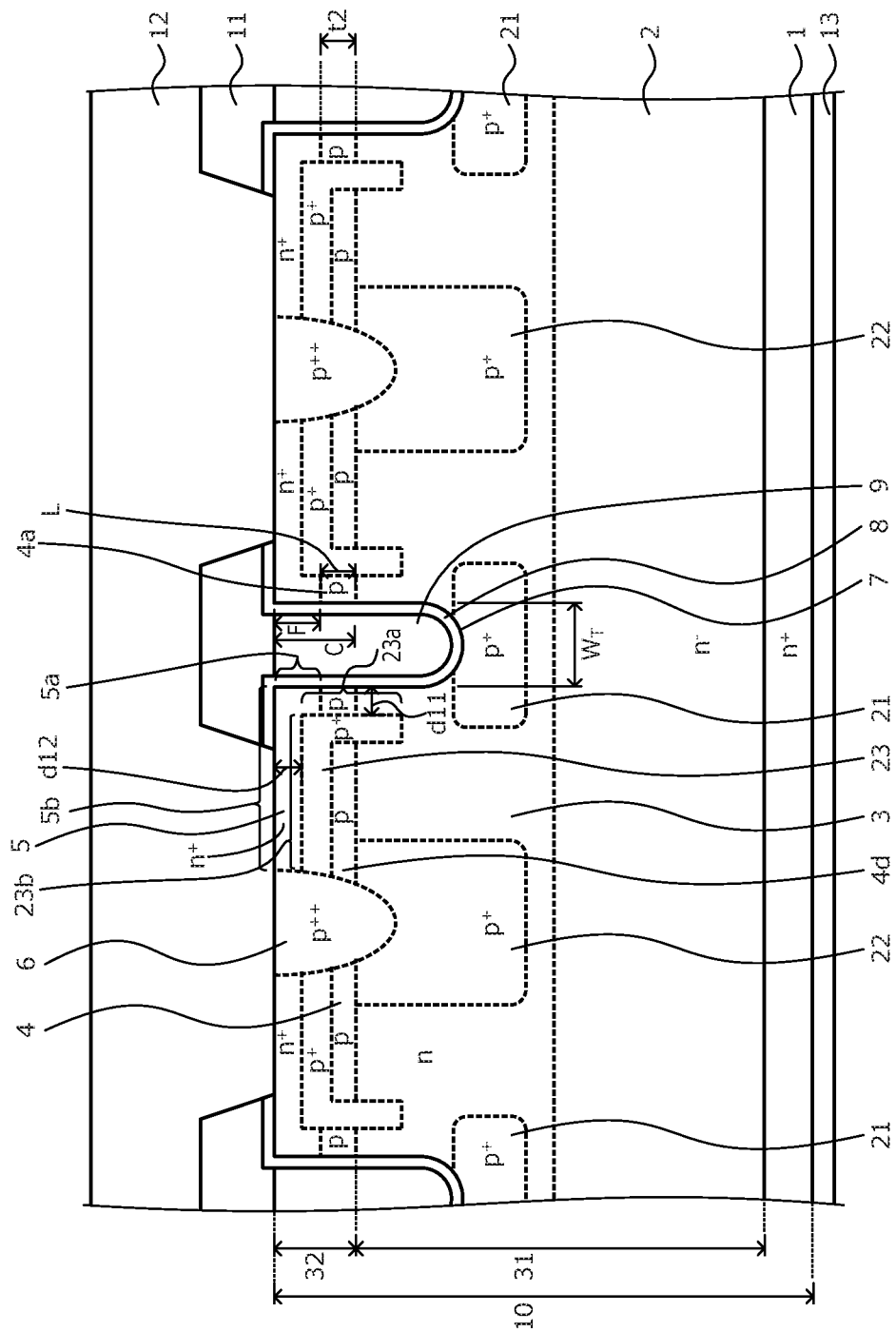
FIG. 14 is a cross-sectional view of a structure of the semiconductor device according to a second embodiment.

A structure of the semiconductor device according to a second embodiment will be described. FIG. 14 is a cross-sectional view of a structure of the semiconductor device according to the second embodiment. The semiconductor device according to the second embodiment and depicted in FIG. 14 is a vertical MOSFET similar to that depicted in FIG. 1 and includes a MOS gate having a trench gate structure at the front surface (surface on the p-type base region 4 side) side of the semiconductor substrate 10 that contains silicon carbide. The $n^+$-type starting substrate 1, the $n^-$-type drift region 2, the p-type base region 4, the silicon carbide layers 31, 32, the $n^+$-type source region 5, the $p^{++}$-type contact region 6, the trench 7, the gate insulating film 8, the gate electrode 9, the semiconductor substrate 10, the interlayer insulating film 11, the source electrode 12, the drain electrode 13 and the first and the second $p^+$-type regions 21, 22 depicted in FIG. 14 are similar to those depicted in FIG. 1 and description thereof is omitted herein after.

In the semiconductor device according to the second embodiment depicted in FIG. 14, a part of the p-type silicon carbide layer 32 excluding the $n^+$-type source region 5 and the $p^{++}$-type contact region 6 is the p-type base region 4. In the p-type base region 4, near the side wall of the trench 7, the third $p^+$-type region 23 is selectively provided separated from the side wall of the trench 7 by a predetermined distance d11 in a direction orthogonal to the side wall. The third $p^+$-type region 23 penetrates the p-type base region 4 in the depth direction substantially parallel to the side wall of the trench 7 and from the interface of the $n^+$-type source region 5 and the p-type base region 4, extends spanning the interface of the p-type base region 4 and the n-type current diffusion region 3. The third $p^+$-type region 23 may penetrate the p-type base region 4 from the interface of the $n^+$-type source region 5 and the p-type base region 4 and terminate in the n-type current diffusion region 3.

The third $p^+$-type region 23 opposes the gate insulating film 8 at the side wall of the trench 7, across a part (the channel region 4a described hereinafter) of the p-type base region 4 (or the p-type base region 4 and the n-type current diffusion region 3) along the side wall of the trench 7. The drain-side end of the third $p^+$-type region 23 terminates in the n-type current diffusion region 3, at a position closer to the substrate front surface than is the first $p^+$-type region 21 and is not in contact with the first $p^+$-type region 21. Further, the third $p^+$-type region 23 is provided along the interface of the $n^+$-type source region 5 and the p-type base region 4 and is in contact with the $p^{++}$-type contact region 6. Between the third $p^+$-type region 23 and the second $p^+$-type region 22, a part 4d of the p-type base region 4 is interposed and is not in contact with the third $p^+$-type region 23 or the second $p^+$-type region 22.

In particular, the third $p^+$-type region 23, for example, is separated from the side wall of the trench 7 and has a substantially L-shaped cross-sectional shape formed by a first linear part 23a that extends in the depth direction substantially parallel to the side wall and a second linear part 23b that extends along the interface of the $n^+$-type source region 5 and the p-type base region 4 and that is substantially orthogonal to the first linear part 23a. The first linear part 23a of the third $p^+$-type region 23 is a so-called HALO region that suppresses the depletion layers that spread in the p-type base region 4, respectively from the pn junction of the p-type base region 4 and the $n^+$-type source region 5 and the pn junction of the p-type base region 4 and the n-type current diffusion region 3 when the MOSFET is in the ON state.

Provision of the first linear part 23a of the third $p^+$-type region 23 enables increases of the short channel effect when the MOSFET is in the ON state to be suppressed even when the thickness t2 of the channel region 4a (=the channel length L) is thinned to reduce the ON resistance and enables decreases in the gate threshold voltage to be suppressed. The second linear part 23b of the third p+-type region 23 functions as a punch-through top layer that suppresses punch-through due to the depletion layers that spread in the p-type base region 4, from the drain side and the source side, respectively, when the MOSFET is in the ON state. Provision of the second linear part 23b of the third p+-type region 23 enables punch-through due to the short channel effect to be suppressed even when the impurity concentration of the p-type base region 4 is reduced to about the channel concentration.

By providing the third p+-type region 23 in this manner to have a substantially L-shaped cross-sectional shape, the n+-type source region 5 has a substantially L-shaped cross-sectional shape formed by a first linear part 5a along the side wall of the trench 7 and a second linear part 5b along the front surface of the semiconductor substrate 10. A depth F of a part (i.e., the first linear part 5a) of the n+-type source region 5 along the side wall of the trench 7, from the substrate front surface, for example, may be at least about 0.4 μm with consideration of an etching back margin of a poly-silicon (poly-Si) layer constituting the gate electrode 9 described hereinafter. The p-type base region 4 is separated further from the part (hereinafter, channel region) 4a on the trench 7 side and a part other than the channel region 4a than is the third p+-type region 23.

The channel region 4a is a part of the p-type base region 4 sandwiched by the first linear part 23a of the third p+-type region 23 and the side wall of the trench 7, and is a region in which a channel (n-type inversion layer) is formed along the side wall of the trench 7 when the MOSFET is in the ON state. The width of the channel region 4a is the distance d11 from the side wall of the trench 7 to the first linear part 23a of the third p+-type region 23. The thickness (i.e., the thickness of the p-type base region) t2 of the channel region 4a is the channel length L. The channel length L is a value obtained by subtracting the depth F of the first linear part 5a of the n+-type source region 5 from the substrate front surface, from a depth C of the first linear part 23a of the third p+-type region 23 from the substrate front surface. The channel concentration, for example, is in a range from about $1 \times 10^{17}/cm^3$ to $3 \times 10^{17}/cm^3$. The channel concentration is determined by the impurity concentrations of the channel region 4a and the third p+-type region 23.

Figure 15A:
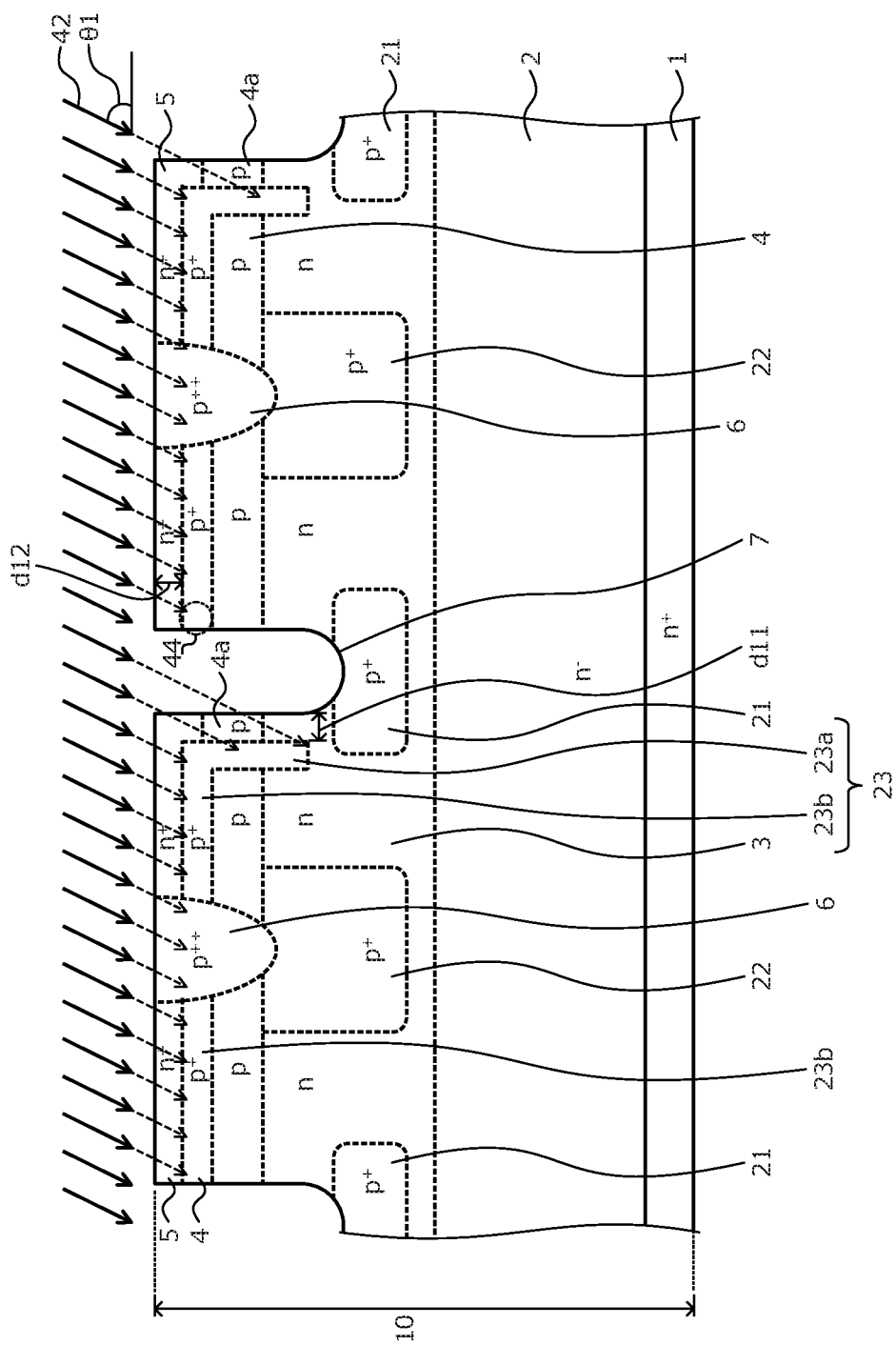
FIG. 15A is a cross-sectional view of the semiconductor device according to the second embodiment during manufacture.
Figure 15B:
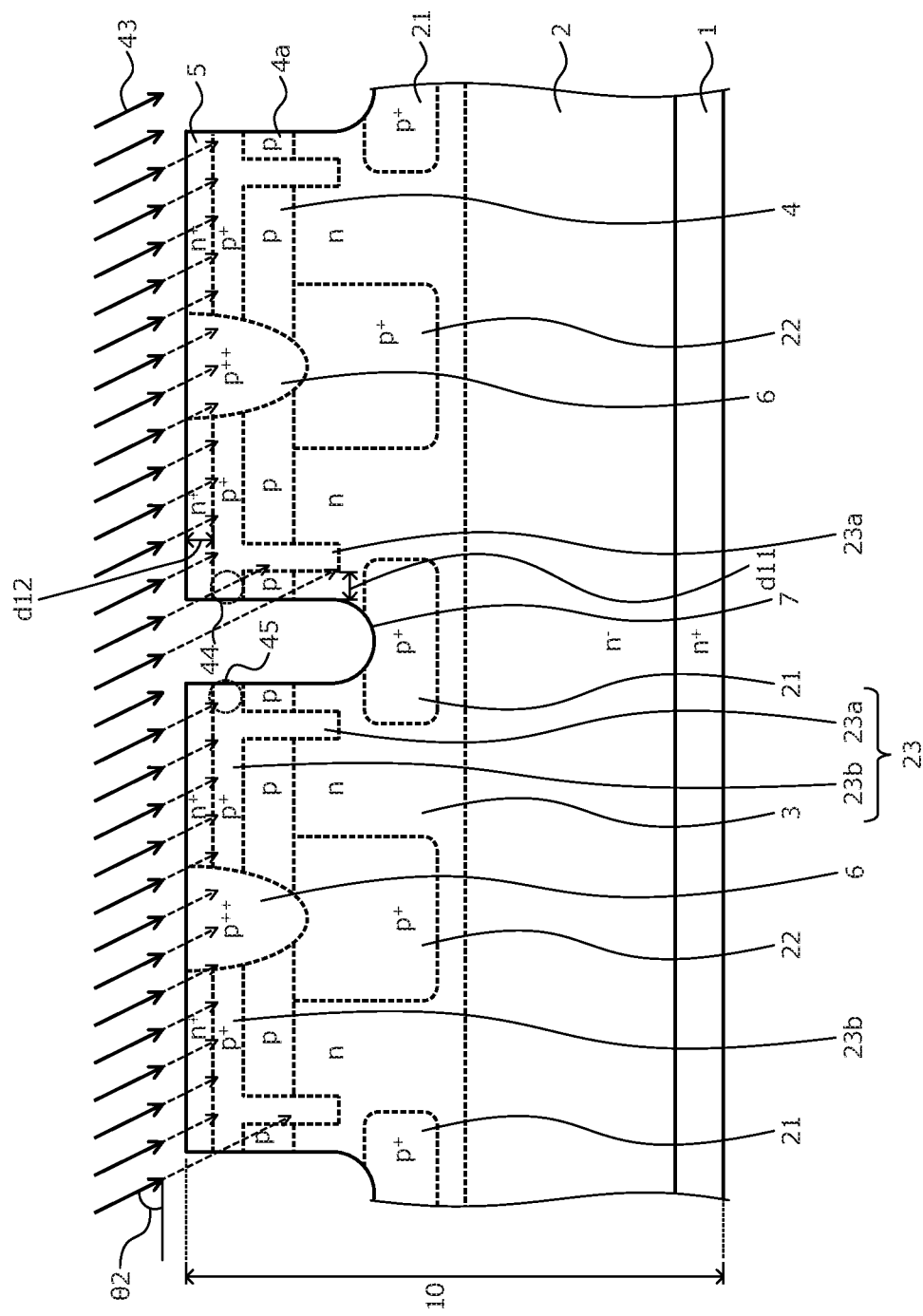
FIG. 15B is a cross-sectional view of the semiconductor device according to the second embodiment during manufacture.
Figure 16:
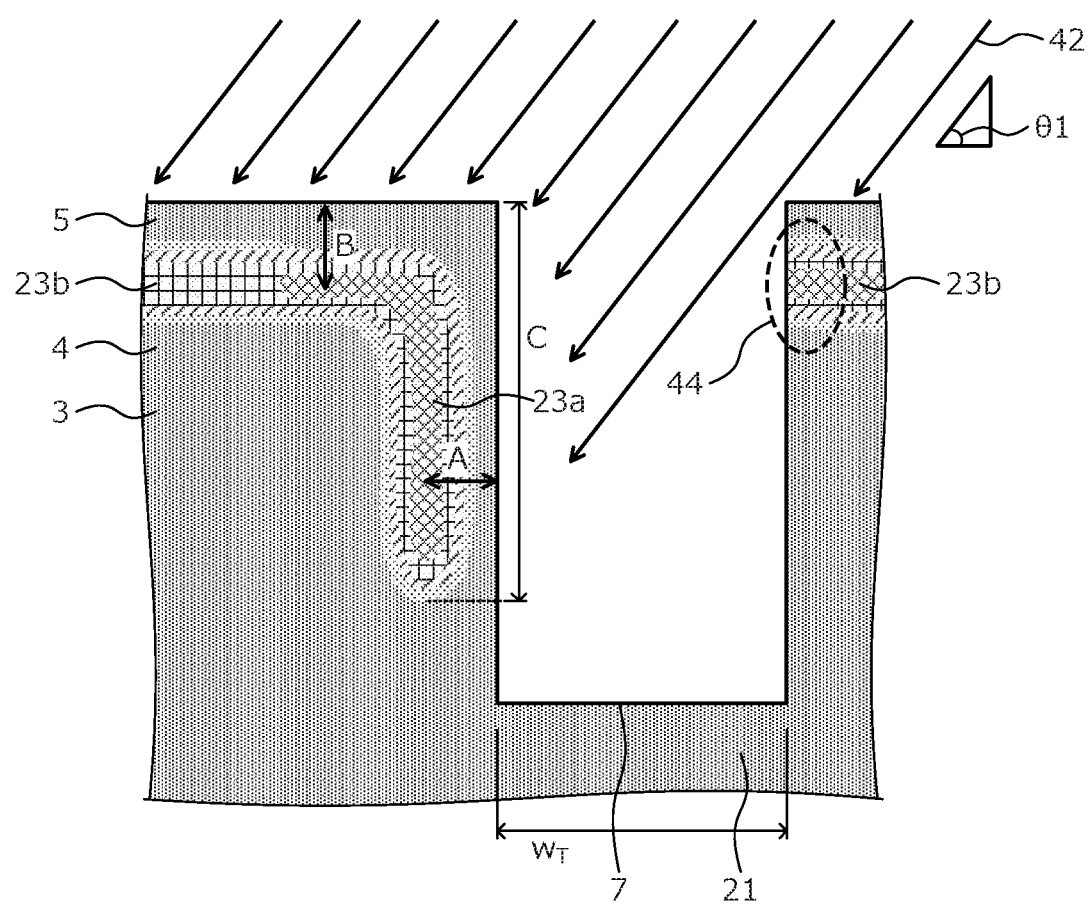
FIG. 16 is an enlarged cross-sectional view of a part depicted in FIG. 15A.
Figure 17:
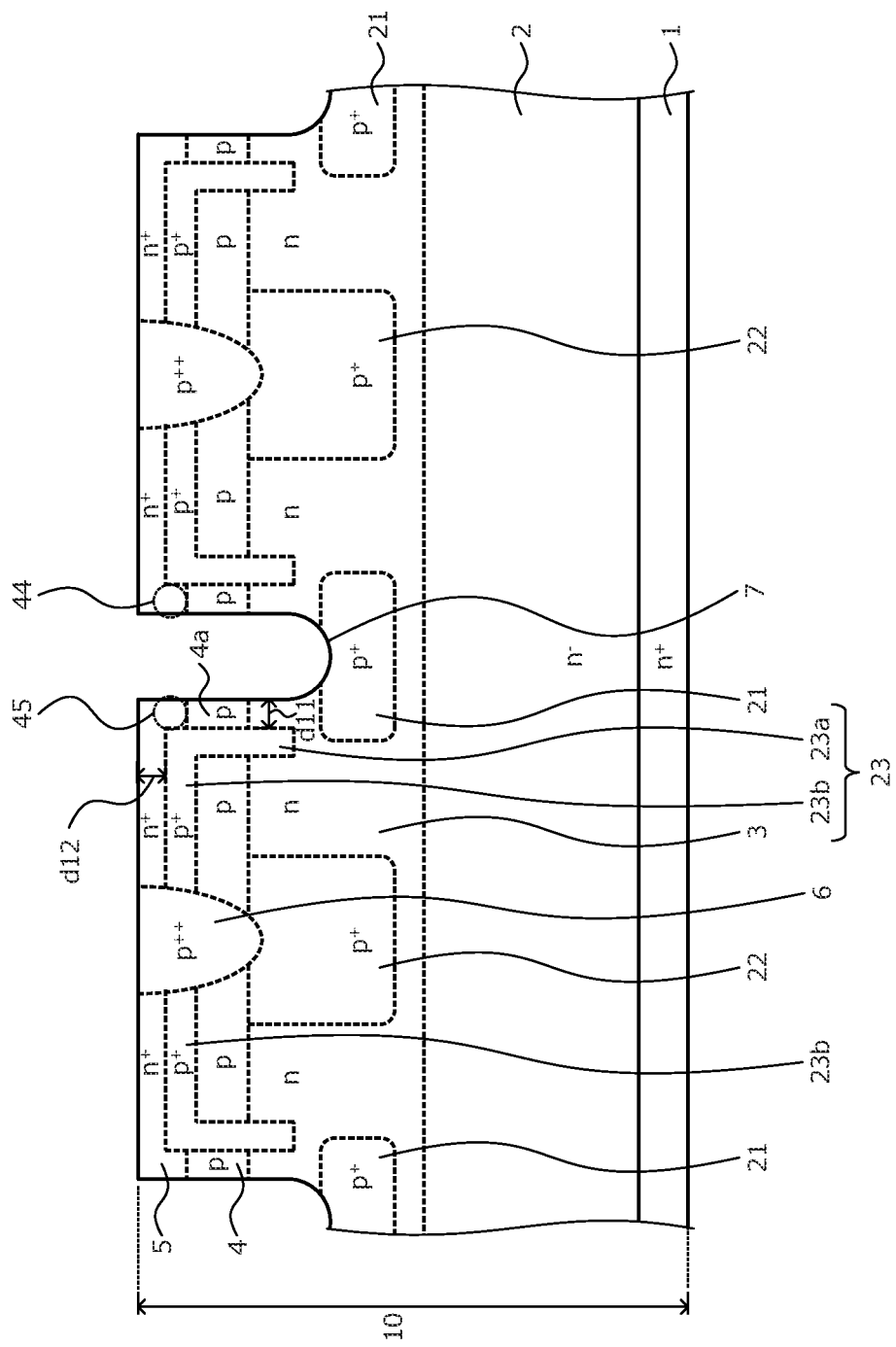
FIG. 17 is a cross-sectional view of the semiconductor device according to the second embodiment during manufacture.

The method of manufacturing a semiconductor device according to the second embodiment will be described. Description of parts similar to those depicted in FIGS. 2 to 6 of the first embodiment will be omitted hereinafter. FIGS. 15A, 15B, and 17 are cross-sectional views of the semiconductor device according to the second embodiment during manufacture. FIG. 16 is an enlarged cross-sectional view of a part depicted in FIG. 15A. FIG. 16 depicts an enlarged view of a vicinity of one of the trenches 7 in FIG. 15A. First, similarly to the first embodiment, processes of preparing the n+-type starting substrate 1 constituting the n+-type drain region and forming the n−-type silicon carbide layer 31, to forming the trench 7 are sequentially performed (refer to FIGS. 2 to 6).

Subsequent to the formation (FIG. 6) of the trench 7, next, as depicted in FIG. 15A, after the oxide film 41 is removed, ion implantation (hereinafter, first oblique ion implantation) 42 of a p-type impurity, for example, aluminum (Al), etc. is performed with respect to the first side walls of the trenches 7 and the front surface of the semiconductor substrate 10, from the oblique direction that is the predetermined implantation angle θ1 relative to the front surface of the semiconductor substrate 10. As a result, the first linear part 23a of the third p+-type region 23 is selectively formed in the p-type base region 4 (or spanning into the n-type current diffusion region 3 from the p-type base region 4) and is separated from the first side wall of the trench 7 by a depth (thickness) of the predetermined distance d11 in a direction orthogonal to the side wall. Additionally, the second linear part 23b of the third p+-type region 23 is selectively formed at the interface of the n+-type source region 5 and the p-type base region 4 and is separated from the front surface of the semiconductor substrate 10 by a depth of a predetermined distance d12 in the depth direction.

At this time, based on the distance d11 from the side wall of the trench 7 to the first linear part 23a of the third p+-type region 23 and the distance d12 from the front surface of the semiconductor substrate 10 to the second linear part 23b of the third p+-type region 23, conditions of the first oblique ion implantation 42 are set. In particular, based on a depth A from a silicon surface (the side wall of the trench 7), of a peak position of the p-type impurity concentration of the first linear part 23a of the third p+-type region 23 and a depth B from a silicon surface (the front surface of the semiconductor substrate 10), of a peak position of the p-type impurity concentration of the second linear part 23b of the third p+-type region 23, the implantation angle θ1 of the first oblique ion implantation 42 is set (refer to FIG. 16). More specifically, the implantation angle θ1 of the first oblique ion implantation 42 is set so as to satisfy conditions of expression (1).

$$B = A/\tan\theta1 \quad (1)$$

Next, as depicted in FIG. 15B, ion implantation (hereinafter, second oblique ion implantation) 43 of a p-type impurity such as, for example, aluminum is performed with respect to the second side walls of the trenches 7, from an oblique direction at the predetermined implantation angle θ2 relative to the front surface of the semiconductor substrate 10. As a result, the first linear part 23a of the third p+-type region 23 is selectively formed in the p-type base region 4 (or spanning into the n-type current diffusion region 3 from the p-type base region 4) and is separated from the second side wall of the trench 7 by a depth of the predetermined distance d11 in a direction orthogonal to the side wall. Additionally, similarly to the first oblique ion implantation 42, the second linear part 23b of the third p+-type region 23 is selectively formed at the interface of the n+-type source region 5 and the p-type base region 4 and is separated from the front surface of the semiconductor substrate 10 by a depth of the predetermined distance d12 in the depth direction.

The second oblique ion implantation 43, to ion implant a p-type impurity in the second side walls of the trenches 7, is performed with respect to the second side walls of the trenches 7 at the implantation angle θ2 that is symmetrical the implantation angle θ1 of the first oblique ion implantation 42 performed with respect to the first side walls of the trenches 7. Excluding the implantation angle θ2, conditions of the second oblique ion implantation 43 performed with respect to the second side walls of the trenches 7 are similar to those of the first oblique ion implantation 42 performed with respect to the first side walls of the trenches 7. The first and the second implantation angles θ1, θ2 of the oblique ion implantations 42, 43 may be set corresponding to a width $w_T$ of the trenches 7 and, for example, may be set to be in a range from 40 degrees to 60 degrees. In particular, when the width $w_T$ of the trench 7 is, for example, 0.8 μm, the first and the second implantation angles θ1, θ2 of the oblique ion implantations 42, 43 may be, for example, about 45 degrees relative to, for example, the front surface of the semiconductor substrate 10.

During the first and the second oblique ion implantations 42, 43, the p-type impurity is also ion implanted in a part (part in which the n$^+$-type source region 5 and the p$^{++}$-type contact region 6 are formed) to a depth that is the predetermined distance d12 from the front surface of the semiconductor substrate 10. However, the n$^+$-type source region 5 and the p$^{++}$-type contact region 6 have high impurity concentrations (for example, the impurity concentration of the n$^+$-type source region 5 is about $1\times10^{19}/cm^3$), and the impurity concentration of the third p$^+$-type region 23 is at least 10 times lower than the impurity concentrations of the n$^+$-type source region 5 and the p$^{++}$-type contact region 6. Therefore, during the first and the second oblique ion implantations 42, 43, even when the p-type impurity is ion implanted in the n$^+$-type source region 5 or the p$^{++}$-type contact region 6, the MOSFET characteristics are not affected.

Further, the p-type impurity concentration profile of the first linear part 23a of the third p$^+$-type region 23 by the oblique ion implantations 42, 43 pulls on a tail (a part where the impurity concentration decreases along a gradual slope like a flaring of a hem) of the peak position, toward the side wall of the trench 7 from a depth from the side wall of the trench 7. The range and dose amounts of the oblique ion implantations 42, 43 are set so that the impurity concentration of the tail part of the p-type impurity concentration profile of the first linear part 23a of the third p$^+$-type region 23 becomes a predetermined channel concentration. Further, the oblique ion implantations 42, 43 may be performed in multiple stages (plural times) to form a predetermined p-type impurity concentration profile of the first linear part 23a of the third p$^+$-type region 23.

Further in the first and the second oblique ion implantations 42, 43, the second linear part 23b of the third p$^+$-type region 23 is formed at the entire interface of the n$^+$-type source region 5 and the p-type base region 4 and extends to the side wall of the trench 7. Therefore, after the first and the second oblique ion implantations 42, 43, for example, oblique ion implantation (not depicted) of an n-type impurity is performed from both side walls of the trenches 7 and parts 44, 45 of the second linear part 23b of the third p$^+$-type region 23 exposed at the side wall of the trench 7 are inverted to an n-type, forming the n$^+$-type source region 5. A method of this oblique ion implantation, for example, is similar to third and fourth oblique ion implantations for forming the n$^+$-type source region 5 in a third embodiment described hereinafter. The state up to here is depicted in FIG. 17.

Next, a non-depicted carbon (C) film is formed along the front surface of the semiconductor substrate 10 and the inner walls of the trenches 7. Next, heat treatment (activation annealing) for activating the impurities is performed with respect to all of the regions formed by ion implantation. Next, the carbon film is removed. Next, heat treatment (annealing) for rounding corners of the bottoms of the trenches 7 and openings of the trenches 7 is performed. Next, by a general method, the gate insulating film 8, the gate electrode 9, the interlayer insulating film 11, contact holes, the source electrode 12, and the drain electrode 13 are formed. Thereafter, the semiconductor wafer is diced (cut) into individual chips, whereby the MOSFET depicted in FIG. 14 is completed.

As described above, according to the second embodiment, the third p$^+$-type region constituted by the first linear part that is separated from the trench side wall and extends along the trench side wall, the second linear part that is orthogonal to the first linear part and extends along the interface of the n$^+$-type source region and the p-type base region is disposed in a silicon part (mesa part) between adjacent trenches. The first linear part of the third p$^+$-type region functions as a HALO region, suppresses increases of the short channel effect when the MOSFET is in the ON state, and suppresses decreases in the gate threshold voltage. The second linear part of the third p$^+$-type region functions as a punch-through top layer and suppresses punch-through due to the depletion layers that spread in the p-type base region 4, from the drain side and the source side. Therefore, the tradeoff relationship of reducing the ON resistance and suppressing punch-through may be improved.

Further, according to the second embodiment, the first and the second linear parts of the third p$^+$-type region may be formed concurrently by the first and the second oblique ion implantations alone. Further, according to the second embodiment, by the first and the second oblique ion implantations alone, the first and the second linear parts of the third p$^+$-type region may be formed with positioning precision from an implantation face (the side walls of the trenches and the front surface of the semiconductor substrate) by self-alignment.

Figure 18:
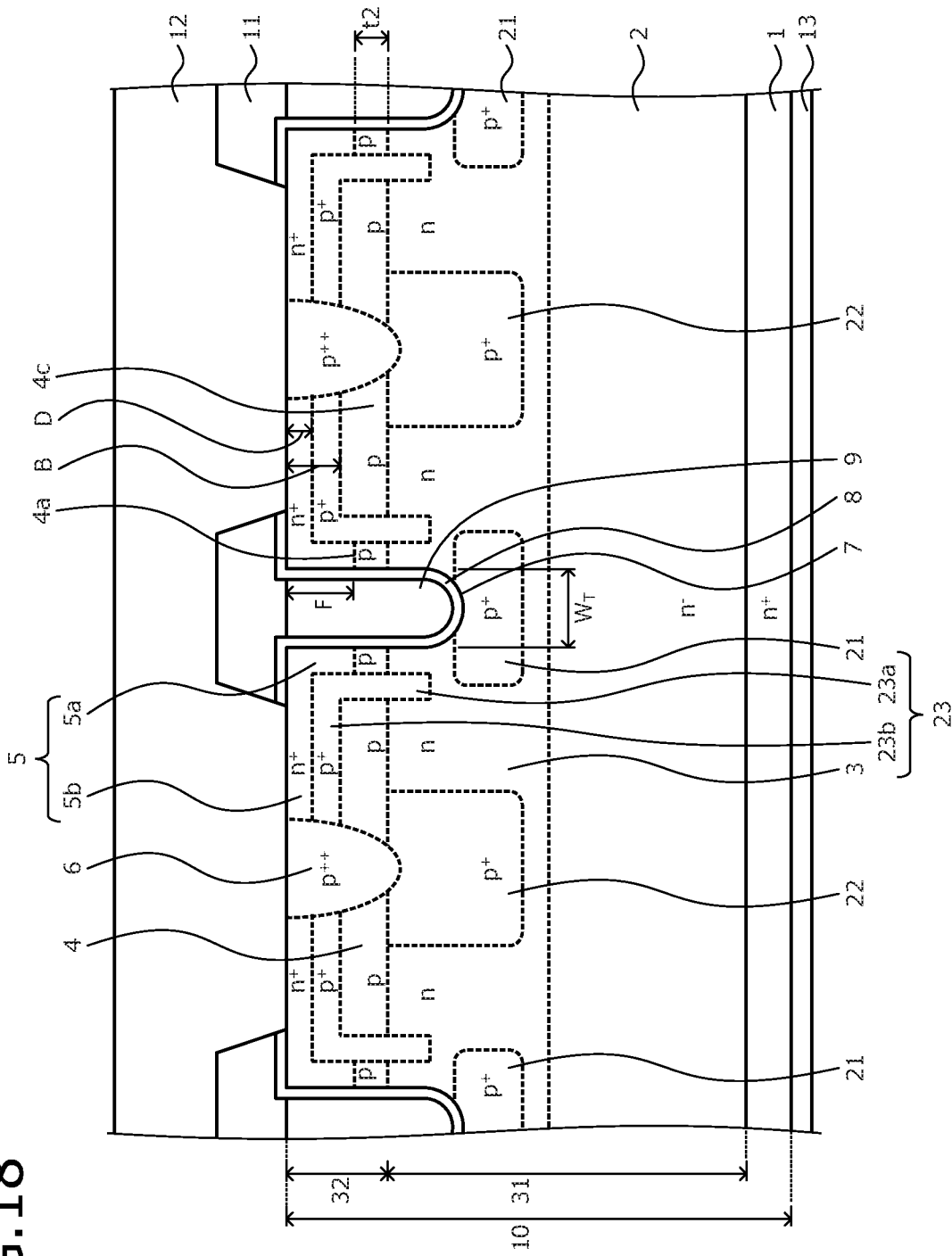
FIG. 18 is a cross-sectional view of a structure of the semiconductor device according to a third embodiment.
Figure 19:
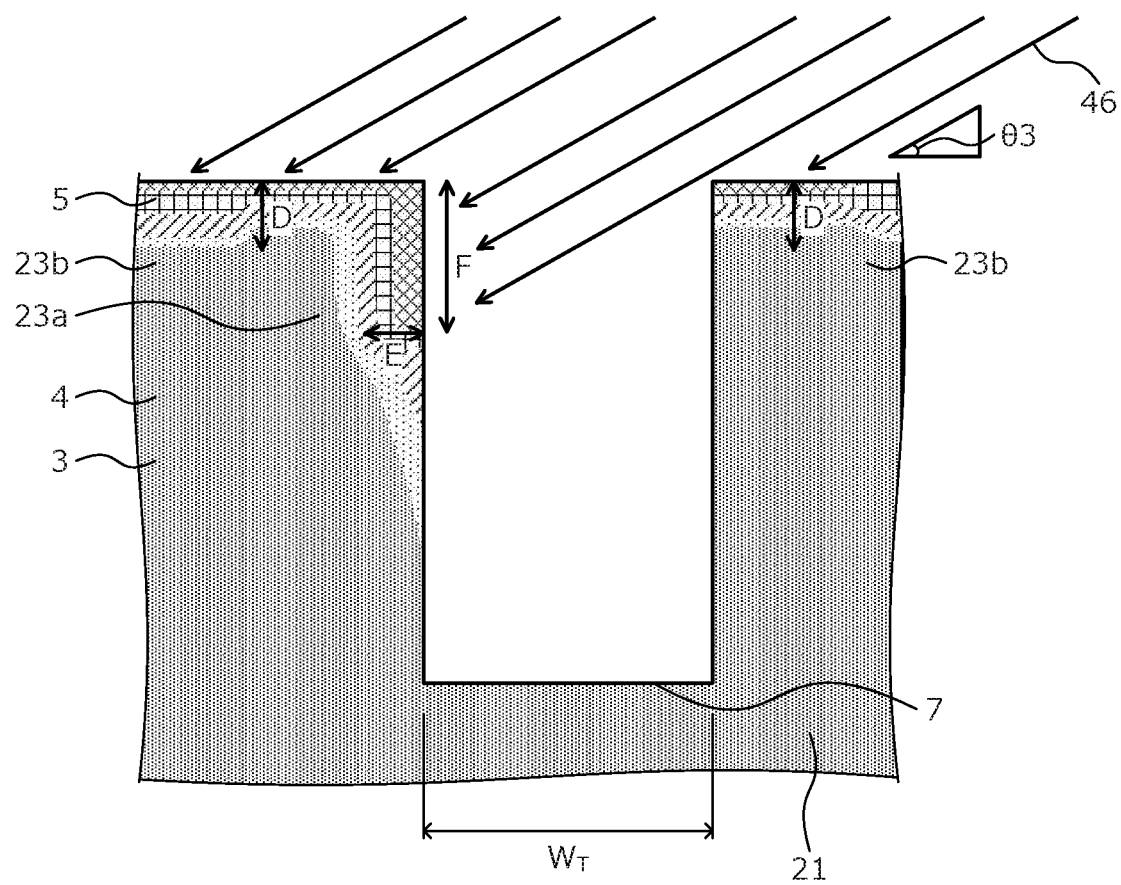
FIG. 19 is a cross-sectional view of the semiconductor device according to the third embodiment during manufacture.

A method of manufacturing the semiconductor device according to the third embodiment will be described. FIG. 18 is a cross-sectional view of a structure of the semiconductor device according to the third embodiment. FIG. 19 is a cross-sectional view of the semiconductor device according to the third embodiment during manufacture. FIG. 19 depicts an enlarged view near one of the trenches 7 depicted in FIG. 18. the method of manufacturing the semiconductor device according to the third embodiment differs from the method of manufacturing the semiconductor device according to the second embodiment in that the n$^+$-type source region 5 is formed by self-alignment from the side wall of the trench 7 and the front surface of the semiconductor substrate 10.

In particular, the method of manufacturing the semiconductor device according to the third embodiment substitutes in the method of manufacturing the semiconductor device according to the second embodiment, formation of the n$^+$-type source region 5 with formation by oblique ion implantation (hereinafter, third and fourth oblique ion implantations) of an n-type impurity from the side wall of the trench 7. More specifically, as depicted in FIG. 19, in the formation of the n$^+$-type source region 5, first, the third oblique ion implantation 46 of an n-type impurity, for example, arsenic (As), etc. into the first side walls of the trenches 7 and the front surface of the semiconductor substrate 10, from an oblique direction at a predetermined implantation angle θ3 relative to the front surface of the semiconductor substrate 10 is performed.

By the third oblique ion implantation 46, a part of the p-type silicon carbide layer 32 the predetermined depth F from the front surface of the semiconductor substrate 10 and a predetermined depth E from the first side walls of the trenches 7 is inverted to an n-type, selectively forming the first linear part 5a of the n$^+$-type source region 5. Additionally, a part of the p-type silicon carbide layer 32 a depth D from the front surface of the semiconductor substrate 10 is inverted to an n-type, forming the second linear part 5b of the n$^+$-type source region 5.

At this time, based on the depth E of the first linear part 5a of the n+-type source region 5 from the first side walls of the trenches 7 and the depth D of the second linear part 5b of the n+-type source region 5 from the front surface of the semiconductor substrate 10, an implantation angle θ3 of the third oblique ion implantation 46 is set. In particular, the implantation angle θ3 of the third oblique ion implantation 46 is set so as to satisfy conditions of expression (2).

$$D=E/\tan\theta 3 \text{(where,} \theta 1<\theta 3) \tag{2}$$

The first and the second linear parts 5a, 5b of the n+-type source region 5 are formed at positions closer to the front surface of the semiconductor substrate 10 and the first side walls of the trenches 7 than are the first and the second linear parts 23a, 23b of the third p+-type region 23. Therefore, the implantation angle θ3 of the third oblique ion implantation 46 has to be greater than the implantation angle θ1 of the first oblique ion implantation 42. The implantation angle θ3 of the third oblique ion implantation 46 may be set to be in a range, for example, from 50 degrees to 80 degrees, corresponding to the width $w_T$ of the trench 7. In particular, when the width $w_T$ of the trench 7 is, for example, 0.8 μm, the implantation angle θ3 of the third oblique ion implantation 46 may be, for example, about 60 degrees relative to, for example, the front surface of the semiconductor substrate 10.

Next, the fourth oblique ion implantation (not depicted) of an n-type impurity, for example, arsenic, etc. into the second side walls of the trenches 7, from an oblique angle at a predetermined implantation angle relative to the front surface of the semiconductor substrate 10 is performed. By the fourth oblique ion implantation, the first linear part 5a of the n+-type source region 5 is selectively formed toward the second side walls of the trenches 7 and the second linear part 5b of the n+-type source region 5 is formed in the surface layer at the front surface of the semiconductor substrate 10.

The fourth oblique ion implantation, to ion implant an n-type impurity into the second side walls of the trenches 7, is performed with respect to the second side walls of the trenches 7 at an implantation angle that is symmetrical to the implantation angle θ3 of the third oblique ion implantation 46 performed with respect to the first side walls of the trenches 7. Excluding the implantation angle, conditions of the fourth oblique ion implantation are similar to those of the third oblique ion implantation 46. Impurity concentrations of the first and the second linear parts 5a, 5b of the n+-type source region 5 may be, for example, in a range from about $1 \times 10^{17}/\text{cm}^3$ to $3 \times 10^{17}/\text{cm}^3$.

Third and fourth oblique ions for forming the n+-type source region 5 are implanted, for example, in the active region overall, or may be implanted after etching for forming the trenches 7 and before the mask (the oxide film 41, refer to FIG. 6) used for the etching is removed. As a result, the depth D of the second linear part 5b of the n+-type source region 5 from the substrate front surface may be shallower than the depth F of the first linear part 5a of the n+-type source region, from the substrate front surface.

Figure 20:
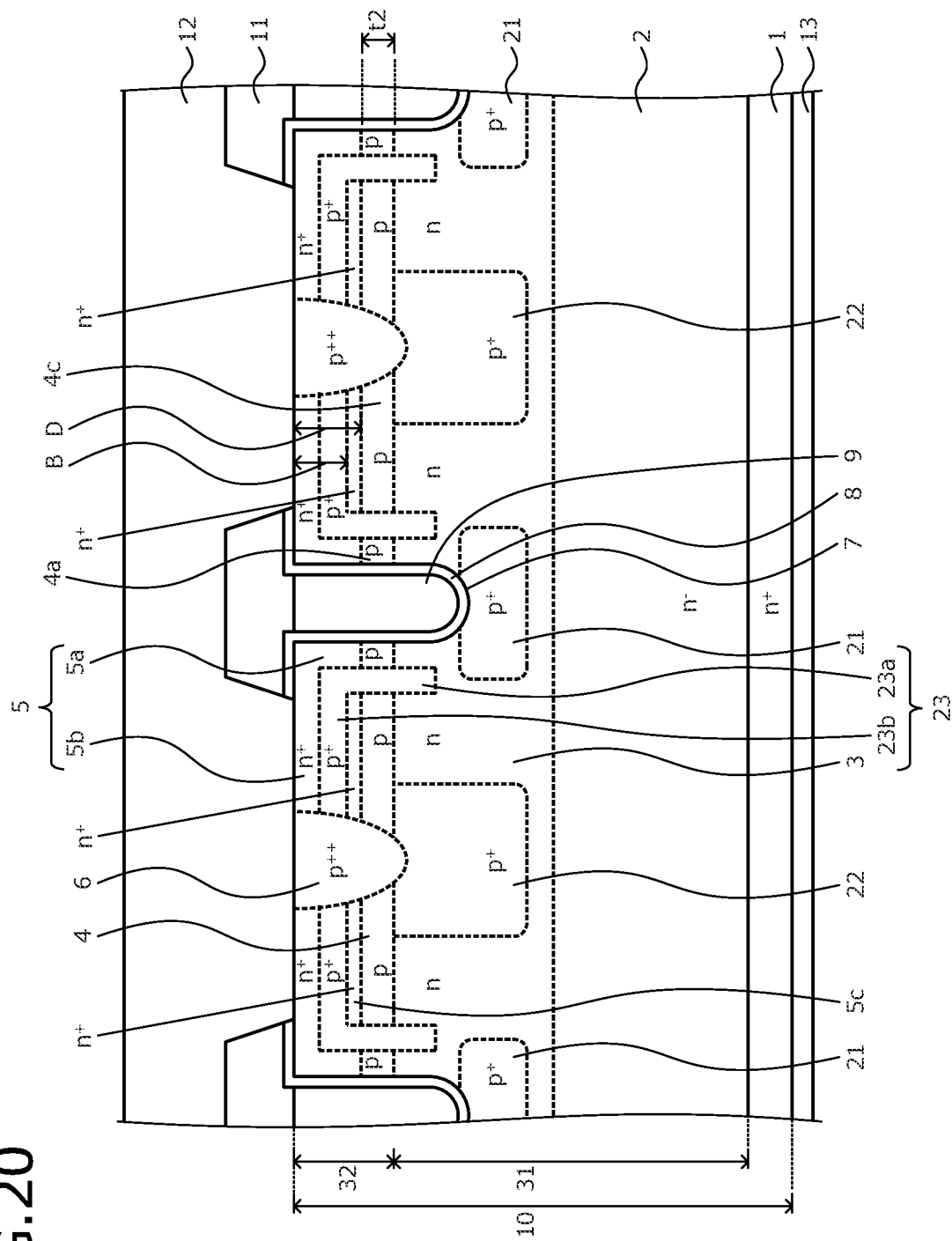
FIG. 20 is a cross-sectional view of a structure of a semiconductor device according to a comparison example.

In this manner, the n+-type source region 5 is formed by the third and the fourth oblique ion implantations, whereby the following effects are obtained. FIG. 20 is a cross-sectional view of a structure of a semiconductor device according to a comparison example. Ranges of the first and the second oblique ion implantations 42, 43 for forming the third p+-type region 23 are set to be shallower from the front surface of the semiconductor substrate 10 as compared to the depth D of the second linear part 5b of the n+-type source region 5. In this case, like the comparison example depicted in FIG. 20, the second linear part 23b of the third p+-type region 23 functioning as a punch-through top layer may be separated from the interface of the n+-type source region 5 and the p-type base region 4, and disposed at a position (i.e., in the n+-type source region 5) shallower from the front surface of the semiconductor substrate 10 than is the interface.

When the second linear part 23b of the third p+-type region 23 is not disposed at the interface of the n+-type source region 5 and the p-type base region 4, a part 5c of the n+-type source region 5 is interposed between the second linear part 23b of the third p+-type region 23 and the p-type base region 4. Therefore, in the comparison example, a p-type impurity concentration of a part (part indicated by reference character 4c) of the p-type base region 4 excluding the channel region 4a becomes substantially lower, whereby punch-through due to the short channel effect may occur. In contrast, according to the third embodiment, the n+-type source region 5 is formed by the third and the fourth oblique ion implantations to have a substantially L-shape, whereby the part 5c of the n+-type source region 5 may be prevented from being interposed between the second linear part 23b of the third p+-type region 23 and the p-type base region 4.

As described above, according to the third embodiment, effects similar to those of the second embodiment may be obtained. Further, according to the third embodiment, formation of the n+-type source region by the third and the fourth oblique ion implantations enables the n+-type source region and the third p+-type region to be formed with positioning precision by self-alignment from the implantation face (the side wall of the trench 7 and the front surface of the semiconductor substrate).

Figure 21:
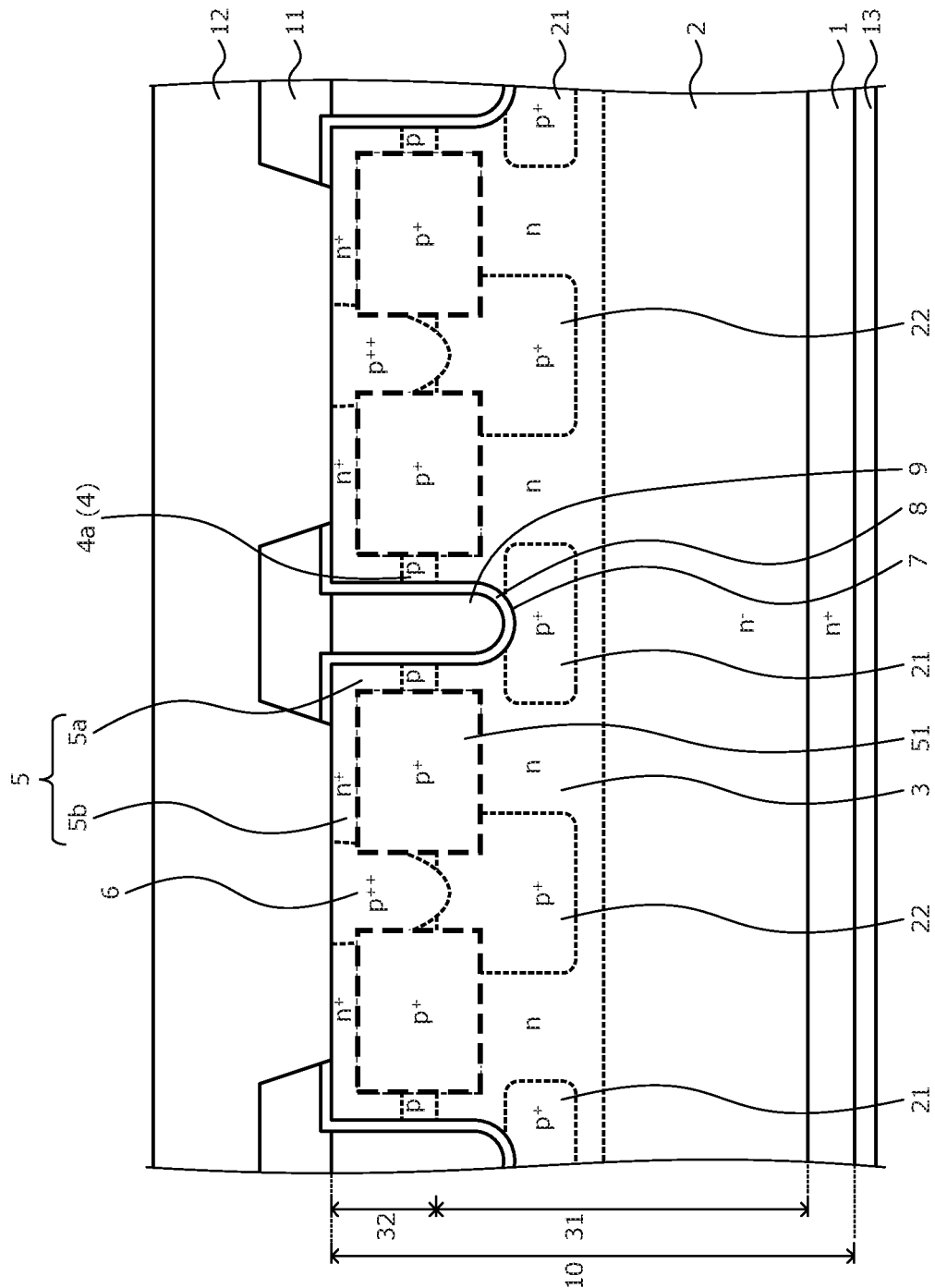
FIG. 21 is a cross-sectional view of a structure of the semiconductor device according to a fourth embodiment.

A structure of the semiconductor device according to a fourth embodiment will be described. FIG. 21 is a cross-sectional view of a structure of the semiconductor device according to the fourth embodiment. The semiconductor device according to the fourth embodiment differs from the semiconductor device according to the second embodiment in that a third p+-type region 51 that functions as a HALO region and as a punch-through top layer is provided to have a substantially rectangular cross-sectional shape.

In particular, the third p+-type region 51 is in contact with a surface (in FIG. 21, lower surface of the second linear part 5b of the n+-type source region 5) of the second linear part 5b of the n+-type source region 5 facing toward the drain, and the third p+-type region 51 penetrates the p-type silicon carbide layer 32 in the depth direction, reaches the n−-type silicon carbide layer 31, and terminates in the n-type current diffusion region 3. Further, the third p+-type region 51 is in contact with the p++-type contact region 6 and the second p+-type region 22.

A part of the p-type silicon carbide layer 32 excluding the n+-type source region 5, the p++-type contact region 6 and the third p+-type region 51 is the channel region 4a. The p-type base region 4 is disposed at only a part (i.e., the channel region 4a) along the trench 7. Further, the third p+-type region 51 is in contact with the p++-type contact region 6 and the second p+-type region 22. The third p+-type region 51 is disposed separated from the first p+-type region 21.

As described above, according to the fourth embodiment, the third p+-type region having an impurity concentration higher than that of the channel region may disposed between the n-type current diffusion region and the n+-type source region, at a part excluding the channel region and effects similar to those of the second and third embodiments may be obtained irrespective of the cross-sectional shape of the third p⁺-type region.

Figure 22:
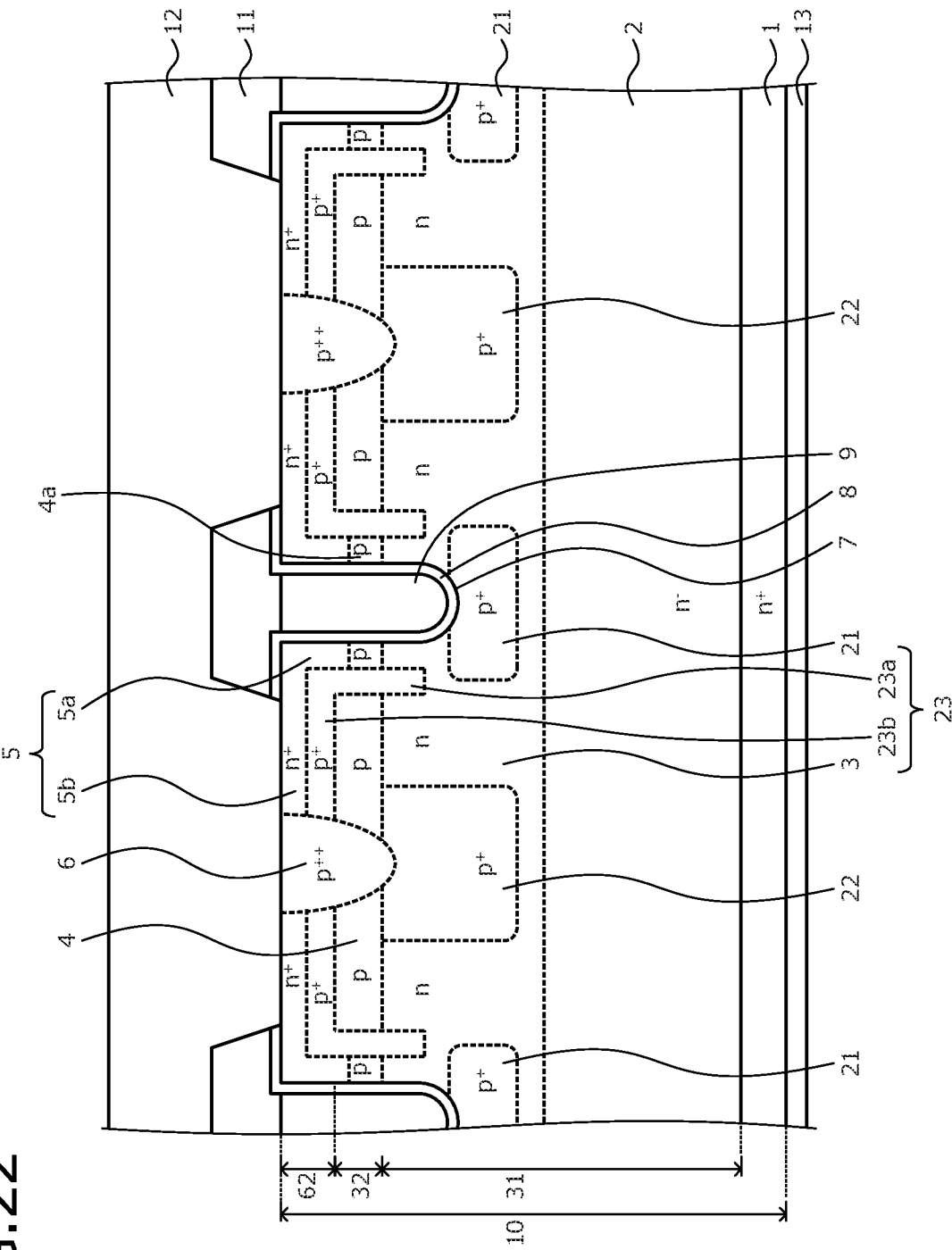
FIG. 22 is a cross-sectional view of a structure of the semiconductor device according to a fifth embodiment.

A structure of the semiconductor device according to a fifth embodiment will be described. FIG. 22 is a cross-sectional view of a structure of the semiconductor device according to the fifth embodiment. The semiconductor device according to the fifth embodiment differs from the semiconductor device according to the second embodiment in that the n⁺-type source region 5 is constituted by an n⁺-type silicon carbide layer 62 formed on the p-type silicon carbide layer 32 by epitaxial growth.

In particular, the semiconductor substrate 10 is an epitaxial substrate (semiconductor chip) in which the silicon carbide layers 31, 32, 62 constituting the n⁻-type drift region 2, the p-type base region 4 and the n⁺-type source region 5 are formed sequentially by epitaxial growth on the n⁺-type starting substrate 1 that contains silicon carbide. The first linear part 5a of the n⁺-type source region 5, similarly to the third embodiment, is formed by the third and the fourth oblique ion implantations spanning the p-type silicon carbide layer 32 from the n⁺-type silicon carbide layer 62. The second linear part 5b of the n⁺-type source region 5 is constituted by the n⁺-type silicon carbide layer 62. In the second linear part 5b of the n⁺-type source region 5, an n-type impurity may be introduced by the third and the fourth oblique ion implantations.

As described above, according to the fifth embodiment, even when a semiconductor substrate is used in which n-type epitaxial layers are stacked in an uppermost layer on the front surface side, effects similar to those of the second to fourth embodiments may be obtained.

Figure 23:
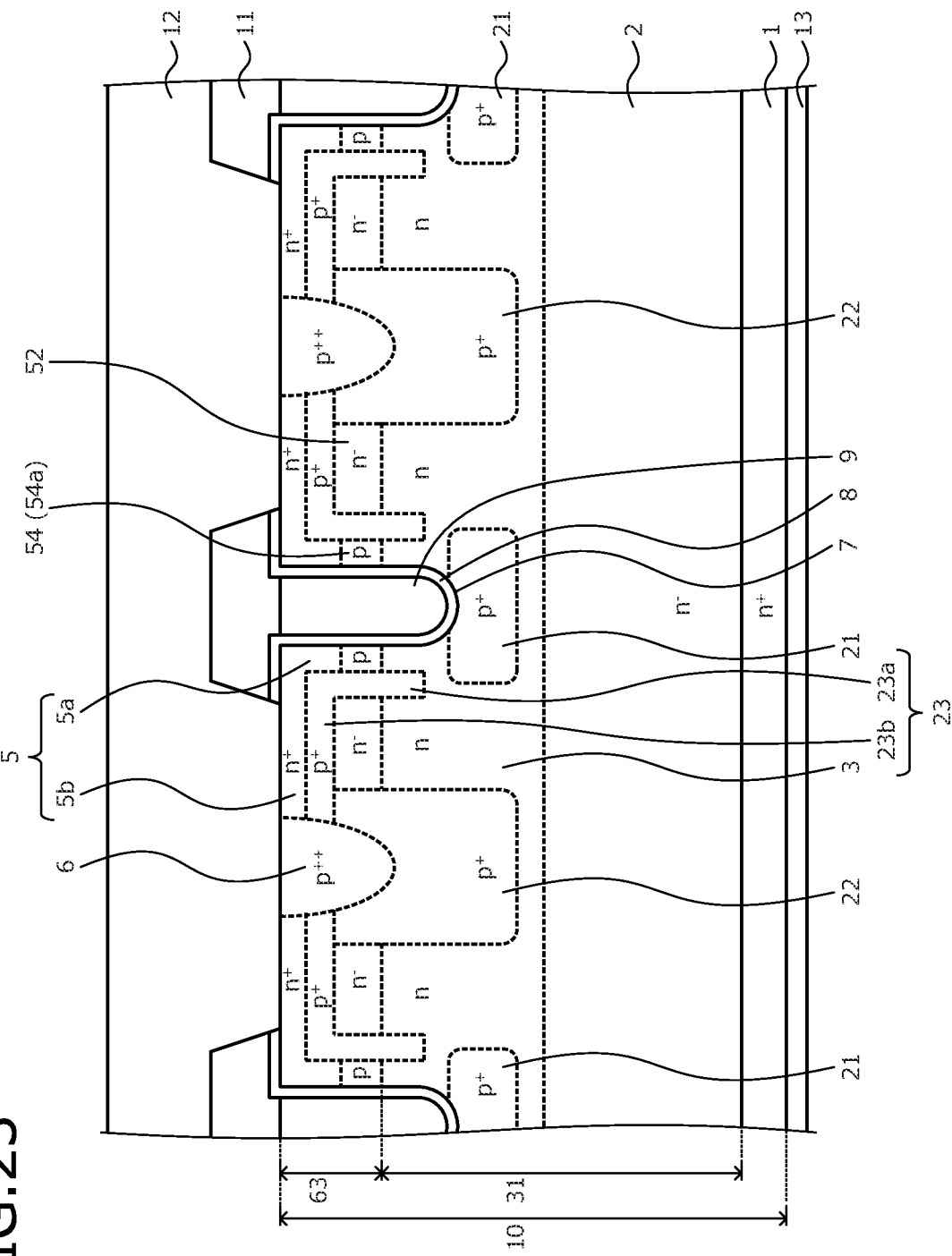
FIG. 23 is a cross-sectional view of a structure of the semiconductor device according to a sixth embodiment.

A structure of the semiconductor device according to a sixth embodiment will be described. FIG. 23 is a cross-sectional view of a structure of the semiconductor device according to the sixth embodiment. The semiconductor device according to the sixth embodiment differs from the semiconductor device according to the second embodiment on the following three points. A first difference is that an n⁻-type region 52 is disposed between the second linear part 23b of the third p⁺-type region 23 and the n-type current diffusion region 3.

The n⁻-type region 52, for example, is constituted by an n⁻-type silicon carbide layer 63 formed on the n⁻-type silicon carbide layer 31 by epitaxial growth. In other words, the semiconductor substrate 10 is an epitaxial substrate (semiconductor chip) in which the n⁻-type silicon carbide layers 31, 63 constituting the n⁻-type drift region 2 and the n⁻-type region 52 are sequentially formed by epitaxial growth on the n⁺-type starting substrate 1 that contains silicon carbide, and in which no p-type silicon carbide layer is used.

For example, on the n⁺-type starting substrate 1, the n⁻-type silicon carbide layer 31 constituting the n⁻-type drift region 2 is formed by epitaxial growth and the n-type current diffusion region 3 is formed by ion implantation performed with respect to the surface layer of the n⁻-type silicon carbide layer 31. At this time, on the n⁻-type silicon carbide layer 31, the n⁻-type silicon carbide layer 63 constituting the n⁻-type region 52 is formed by epitaxial growth, whereby the semiconductor substrate 10 is fabricated. The impurity concentration of the n⁻-type region 52 (i.e., the n⁻-type silicon carbide layer 63) is about equal to the impurity concentration of the n⁻-type drift region 2 and, for example, is in a range from about $1\times10^{15}/cm^3$ to $5\times10^{16}/cm^3$.

The first linear part 23a of the third p⁺-type region 23 extends from inside the n⁻-type silicon carbide layer 63 to the n⁻-type silicon carbide layer 31 and terminates in the n⁻-type silicon carbide layer 31. The second linear part 23b of the third p⁺-type region 23 is disposed in the n⁻-type silicon carbide layer 63. Further, the second linear part 23b of the third p⁺-type region 23 is in contact with the p⁺⁺-type contact region 6 and the second p⁺-type region 22. The n⁻-type region 52 is in contact with a first surface of the first linear part 23a of the third p⁺-type region 23, opposite a second surface of the first linear part 23a facing toward the trench 7. Additionally, the n⁻-type region 52 is in contact with a surface (lower surface) of the second linear part 23b of the third p⁺-type region 23, the surface facing toward the drain. Further, the n⁻-type region 52 is in contact with the second p⁺-type region 22.

A second difference is that, similarly to the third embodiment, the n⁺-type source region 5 is formed by the third and the fourth oblique ion implantations. A third difference is that a p-type base region 54 is disposed only at a part (i.e., a channel region 54a) along the trench 7. The channel region 54a is formed by oblique ion implantation performed with respect to the side wall of the trench 7. The channel region 54a, for example, is formed by oblique ion implantation in a part of the n⁻-type silicon carbide layer 63 along the trench 7. Further, the channel region 54a, for example, may be formed by a tail part of a p-type impurity concentration profile of the first linear part 23a of the third p⁺-type region 23 formed by the first and the second oblique ion implantations.

As described above, according to the sixth embodiment, even when a channel region is formed in the n⁻-type epitaxial layer by oblique ion implantation, effects similar to those of the second to the fifth embodiments may be obtained.

Figure 24:
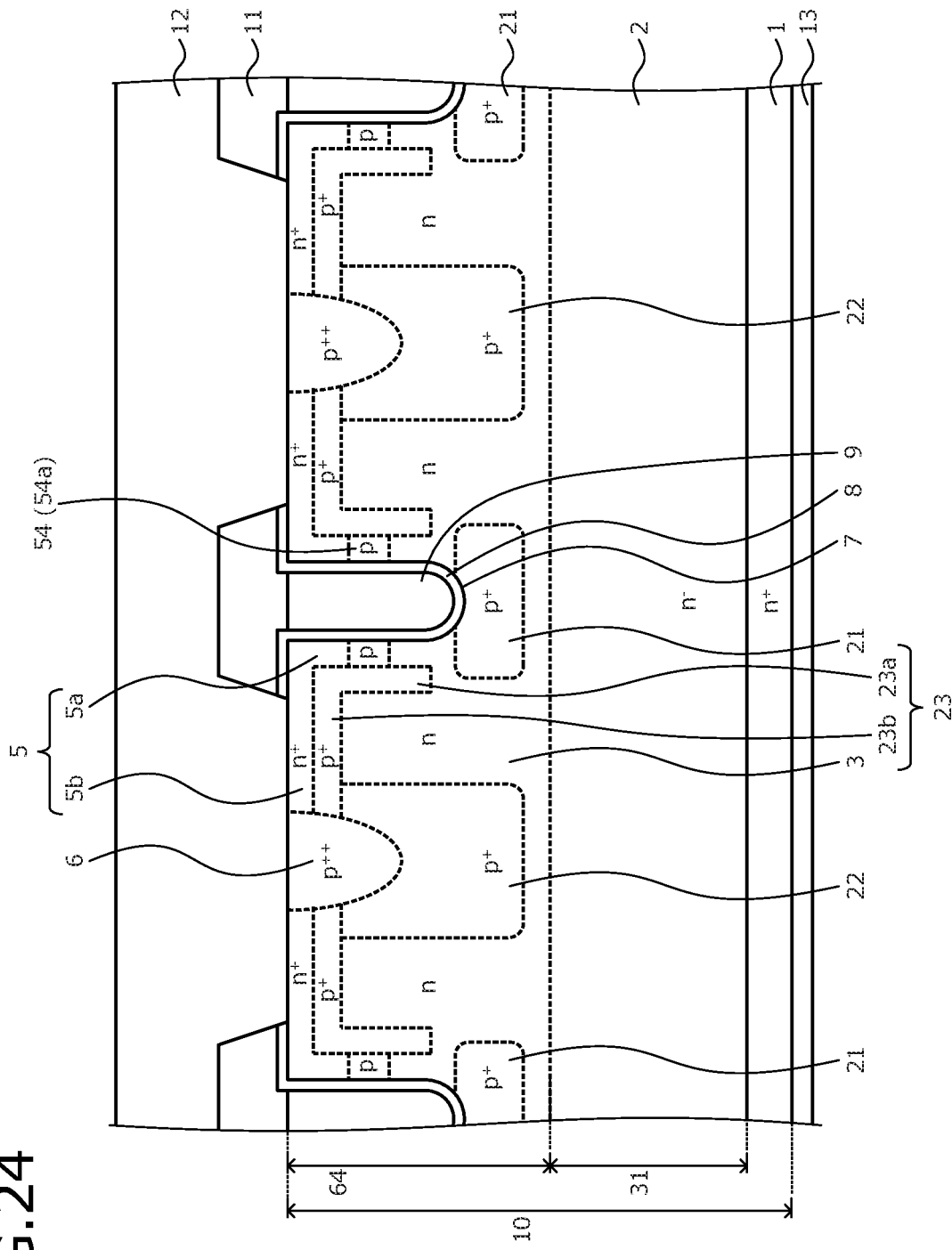
FIG. 24 is a cross-sectional view of a structure of the semiconductor device according to a seventh embodiment.

A structure of the semiconductor device according to a seventh embodiment will be described. FIG. 24 is a cross-sectional view of a structure of the semiconductor device according to the seventh embodiment. The semiconductor device according to the seventh embodiment differs from the semiconductor device according to the sixth embodiment in that the n-type current diffusion region 3 is constituted by an n-type silicon carbide layer 64 formed on the n⁻-type silicon carbide layer 31 by epitaxial growth. In other words, the semiconductor substrate 10 is an epitaxial substrate (semiconductor chip) in which the silicon carbide layers 31, 64 constituting the n⁻-type drift region 2 and the n-type current diffusion region 3 are sequentially formed by epitaxial growth on the n⁺-type starting substrate 1 that contains silicon carbide, and in which the p-type silicon carbide layer is not used.

The third p⁺-type region 23 is provided in the n-type silicon carbide layer 64 (i.e., the n-type current diffusion region 3). The first surface of the first linear part 23a of the third p⁺-type region 23 opposite the second surface of the first linear part 23a facing toward the trench 7 and the surface (lower surface) of the second linear part 23b facing toward the drain are in contact with the n-type current diffusion region 3. The second linear part 23b of the third p⁺-type region 23 is in contact with the second p⁺-type region 22, at an end part thereof toward the p⁺⁺-type contact region 6.

The p-type base region 54 is disposed only at a part (i.e., the channel region 54a) of the n-type silicon carbide layer 64 along the trench 7. The channel region 54a is formed at a part of the n-type silicon carbide layer 64 along the trench 7 by oblique ion implantation. The channel region 54a may be formed by a tail part of a p-type impurity concentration profile of the first linear part 23a of the third p+-type region 23 formed by the first and the second oblique ion implantations.

As described above, according to the seventh embodiment, even when the channel region is formed in an n-type epitaxial layer by oblique ion implantation, effects of the second to the sixth embodiments may be obtained.

The relationship of the implantation angle θ1 of the first oblique ion implantation 42 for forming the third p+-type region 23 and the depths A to C of the third p+-type region 23 from the silicon face were verified. Twelve samples in which combinations of the width $w_T$ of the trench 7 and target depths of the depth C of the first linear part 23a of the third p+-type region 23 from the substrate front surface differ were fabricated according to the method of manufacturing the semiconductor device according to the second embodiment. For these samples, verification results of the implantation angle θ1 of the first oblique ion implantation 42 and the depths A to C of the third p+-type region 23 from the silicon surface are depicted in FIG. 25A and a first sample thereamong is depicted in FIG. 25B.

FIG. 25A is a table depicting implantation angles of the first oblique ion implantation performed in the samples of an example. FIG. 25B is a characteristics diagram depicting a relationship of the implantation angle of the first oblique ion implantation and the depth of the third p+-type region from the silicon surface. In FIG. 25B, a horizontal axis is the implantation angle θ1 of the first oblique ion implantation 42 (degrees: deg.) and a vertical axis is the depths A, B of peak positions of the p-type impurity concentration of the first and the second linear parts 23a, 23b of the third p+-type region 23, the depths A, B being from the silicon surface (the side wall of the trench 7, the front surface of the semiconductor substrate 10), and the depth C (μm) of the first linear part 23a of the third p+-type region 23 from the substrate front surface.

The twelve samples have different combinations of a target depth of the depth C of the first linear part 23a of the third p+-type region 23 from the substrate front surface and the width $w_T$ of the trench 7. The depths A to C of the third p+-type region 23 from the silicon surface include the depth A of a peak position of the p-type impurity concentration of the first linear part 23a of the third p+-type region 23, from the trench side wall (the side wall of the trench 7); the depth B of a peak position of the p-type impurity concentration of the second linear part 23b of the third p+-type region 23, from the substrate front surface; and the depth C of the first linear part 23a of the third p+-type region 23 from the substrate front surface.

As depicted in FIG. 25B, when the width $w_T$ of the trench 7 is 0.8 μm, an optimum range $w_A$ of the depth A of a peak position of the p-type impurity concentration of the first linear part 23a of the third p+-type region 23, from the trench side wall is, for example, 0.05 μm or higher. A range 61A of the implantation angle of the first oblique ion implantation 42 satisfying the range $w_A$ is 14 degrees or higher. The depth B of a peak position of the p-type impurity concentration of the second linear part 23b of the third p+-type region 23, from the substrate front surface may be deeper than the depth A of a peak position of the p-type impurity concentration of the first linear part 23a of the third p+-type region 23 from the side wall of the trench 7 and a range $w_B$ thereof, for example, is from 0.1 μm to 0.2 μm. A range θ1B of the implantation angle of the first oblique ion implantation 42 satisfying the range $w_B$ is from about 20 degrees to 61 degrees.

For the first to fourth samples, cases are depicted where a range $w_e$ of a target depth of the depth C of the first linear part 23a of the third p+-type region 23, from the substrate front surface is from 0.85 μm to 1.3 μm, and the widths $w_T$ of the trench 7 are 0.8 μm, 1.0 μm, 0.6 μm, and 0.4 μm, respectively. As depicted in FIG. 25B, when the width $w_T$ of the trench 7 of the first sample is 0.8 μm, a range 61C of the implantation angle of the first oblique ion implantation (hereinafter, the first oblique ion implantation by which the depth C becomes the target depth) by which the depth C of the first linear part 23a of the third p+-type region 23 becomes a target depth from the substrate front surface is from about 37 degrees to 50 degrees.

An overlapping range of the range θ1C of the implantation angle of the first oblique ion implantation by which the depth C becomes the target depth; the range θ1A of the implantation angle of the first oblique ion implantation 42 satisfying the optimal range $w_A$ of the depth A of a peak position of the p-type impurity concentration of the first linear part 23a of the third p+-type region 23, from the trench side wall; and the range 81B of the implantation angle of the first oblique ion implantation 42 satisfying the optimal range $w_B$ of the depth B of a peak position of the p-type impurity concentration of the second linear part 23b of the third p+-type region 23, from the substrate front surface is an optimal range of the implantation angle θ1 of the first oblique ion implantation 42. In other words, an optimal range of the implantation angle θ1 of the first oblique ion implantation 42 is the range θ1C of the implantation angle of the first oblique ion implantation by which the depth C becomes the target depth.

Further, as indicated by the second sample, when the width $w_T$ of the trench 7 is 1.0 μm, the range θ1C of the implantation angle of the first oblique ion implantation by which the depth C becomes a target depth is from 43 degrees to 56 degrees. As indicated by the third sample, when the width $w_T$ of the trench 7 is 0.6 μm, the range θ1C of the implantation angle of the first oblique ion implantation by which the depth C becomes a target depth is from 29 degrees to 42 degrees. As indicated by the fourth sample, when the width $w_T$ of the trench 7 is 0.4 μm, the range θ1C of the implantation angle of the first oblique ion implantation by which the depth C becomes a target depth is 20 degrees to 31 degrees.

In the second to fourth samples, similarly to the samples depicted in FIG. 25B, the range θ1C of the implantation angle of the first oblique ion implantation by which the depth C becomes a target depth is an overlapping range of the range θ1A of the implantation angle of the first oblique ion implantation 42 satisfying the range $w_A$ and the range θ1B of the implantation angle of the first oblique ion implantation 42 satisfying the range $w_B$. Therefore, for the second to the fourth samples, similarly to the first sample, an optimal range of the implantation angle θ1 of the first oblique ion implantation 42 is the range θ1C of the implantation angle of the first oblique ion implantation by which the depth C becomes the target depth.

For the fifth to the eighth samples, cases are depicted where the range $w_c$ of the target depth of the depth C of the first linear part 23a of the third p+-type region 23, from the substrate front surface is in a range from 0.4 μm to 0.85 μm and the widths $w_T$ of the trench 7 are 0.8 μm, 1.0 μm, 0.6 μm, and 0.4 μm, respectively. In the fifth to the eighth samples, the depth C of the first linear part 23a of the third p+-type region 23, from the substrate front surface is shorter than that of the first to the fourth samples, whereby the channel length is shorter that than in the first to the fourth samples.

As indicated by the fifth sample, when the width $w_T$ of the trench 7 is 0.8 µm, the range θ1C of the implantation angle of the first oblique ion implantation whereby the depth C becomes a target depth is from about 51 degrees to 75 degrees.

As indicated by the sixth sample, when the width $w_T$ of the trench 7 is 1.0 µm, the range θ1C of the implantation angle of the first oblique ion implantation by which the depth C becomes a target depth is from about 57 degrees to 78. As indicated by the seventh sample, when the width $w_T$ of the trench 7 is 0.6 µm, the range θ1C of the implantation angle of the first oblique ion implantation by which the depth C becomes a target depth is from about 43 degrees to 71. As indicated by the eighth sample, when the width $w_T$ of the trench 7 is 0.4 µm, the range θ1C of the implantation angle of the first oblique ion implantation by which the depth C becomes a target depth is from about 32 degrees to 63.

For the ninth to the twelfth samples, cases are depicted where the range $w_c$ of the target depth of the depth C of the first linear part 23a of the third p$^+$-type region 23, from the substrate front surface, is from 0.2 µm to 0.65 µm and the widths $w_T$ of the trench 7 are 0.8 µm, 0.6 µm, 0.4 µm, and 0.2 µm, respectively. In the ninth to the twelfth samples, the depth C of the first linear part 23a of the third p$^+$-type region 23, from the substrate front surface is shorter than that of the fifth to the eighth samples, whereby the channel length is shorter that than in the fifth to the eighth samples. As indicated by the ninth sample, when the width $w_T$ of the trench 7 is 0.8 µm, a range θ1C of the implantation angle θ1 of the first oblique ion implantation by which the depth C becomes the target depth is from about 61 degrees to 89 degrees.

As indicated by the tenth sample, when the width $w_T$ of the trench 7 is 0.6 µm, the range θ1C of the implantation angle of the first oblique ion implantation by which the depth C becomes a target depth is from about 53 degrees to 89 degrees. As indicated by the eleventh sample, when the width $w_T$ of the trench 7 is 0.4 µm, the range θ1C of the implantation angle of the first oblique ion implantation by which the depth C becomes a target depth is from about 42 degrees to 89 degrees. As indicated by the twelfth sample, when the width $w_T$ of the trench 7 is 0.2 µm, the range θ1C of the implantation angle of the first oblique ion implantation by which the depth C becomes a target depth is from about 24 degrees to 89 degrees.

For the fifth to the twelfth samples, similarly to the first to the fourth samples, of the ranges θ1C of the implantation angle of the first oblique ion implantation by which the depth C becomes a target depth, an overlapping range of the range θ1A of the implantation angle of the first oblique ion implantation 42 that satisfies the range $w_A$ and the range θ1B of the implantation angle of the first oblique ion implantation 42 that satisfies the range $w_B$ is an optimal range of the implantation angle θ1 of the first oblique ion implantation 42. From the fifth to the twelfth samples, it was confirmed that when the channel length is shortened, the narrower is the width $w_T$ of the trench 7, the wider the optimal range of the implantation angle θ1 of the first oblique ion implantation 42 may be.

Further, from the results depicted for the tenth to the twelfth samples, it is found that even when the channel length is further shortened, the narrower is the width $w_T$ of the trench 7, the wider the optimal range of the implantation angle θ1 of the first oblique ion implantation 42 may be. Further, from results indicated for the ninth sample, it was confirmed that depending on the width $w_T$ of the trench 7, the range θ1C of the implantation angle of the first oblique ion implantation by which the depth C becomes a target depth and the ranges θ1B, θ1A of the implantation angle of the first oblique ion implantation 42 satisfying the ranges $W_B$, $W_A$ do not overlap, and an optimal range of the implantation angle θ1 of the first oblique ion implantation 42 cannot be set.

Therefore, it was found that an optimal range of the implantation angle θ1 of the first oblique ion implantation 42 may be from about 40 degrees to 60 degrees. The implantation angle θ2 of the second oblique ion implantation 43 for the second side walls of the trenches 7, as described above, is an implantation angle that relative to the second side walls of the trenches 7, is symmetrical to the implantation angle θ1 of the first oblique ion implantation 42 for the first side walls of the trenches 7.

Figure 26:
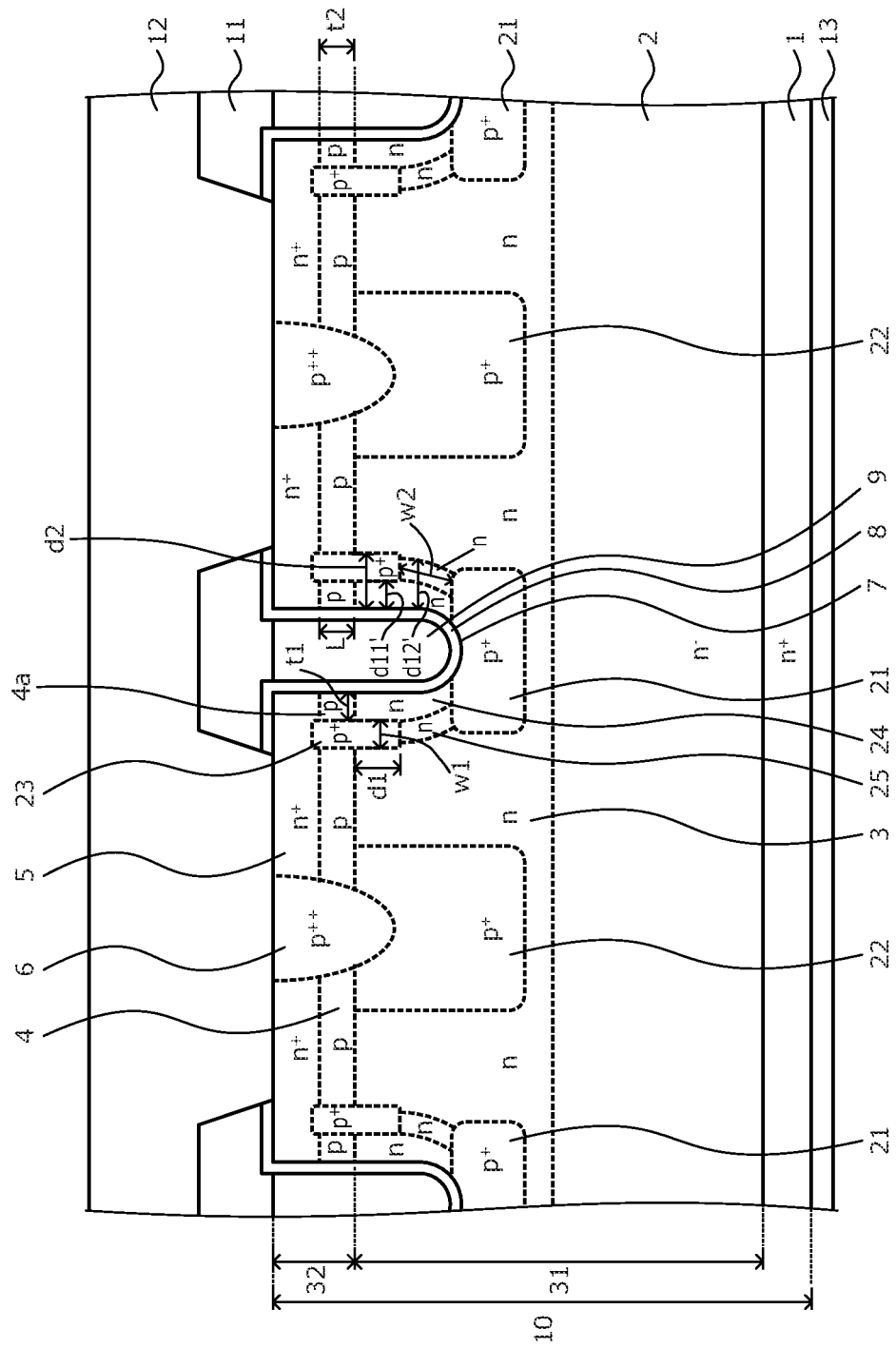
FIG. 26 is a cross-sectional view of a structure of the semiconductor device according to an eighth embodiment.

A structure of the semiconductor device according to an eighth embodiment will be described. FIG. 26 is a cross-sectional view of a structure of the semiconductor device according to the eighth embodiment. The semiconductor device according to the eighth embodiment depicted in FIG. 26 is a vertical MOSFET similar to that depicted in FIG. 1 and includes a MOS gate having a trench gate structure at the front surface (surface on the p-type base region 4 side) side of the semiconductor substrate 10 that contains silicon carbide. The n$^+$-type starting substrate 1, the n$^-$-type drift region 2, the p-type base region 4, the silicon carbide layers 31, 32, the n$^+$-type source region 5, the p$^{++}$-type contact region 6, the trench 7, the gate insulating film 8, the gate electrode 9, the semiconductor substrate 10, the interlayer insulating film 11, the source electrode 12, the drain electrode 13, and the first and the second p$^+$-type regions 21, 22 depicted in FIG. 26 are similar to those depicted in FIG. 1 and description thereof is omitted hereinafter.

In the semiconductor device according to the eighth embodiment depicted in FIG. 26, the drain-side end of the third p$^+$-type region 23 is in contact with the n-type current diffusion region 3, or protrudes from the interface of the p-type base region 4 and the n-type current diffusion region 3 toward the drain (i.e., inside the n-type current diffusion region 3) to the predetermined depth d1. Further, the drain-side end of the third p$^+$-type region 23 terminates in the n-type current diffusion region 3, at a position shallower from the substrate front surface than is the first p$^+$-type region 21. In other words, the third p$^+$-type region 23 opposes the gate insulating film 8 at the side wall of the trench 7, across a part of the p-type base region 4 (or the p-type base region 4 and the n-type current diffusion region 3) along the side wall of the trench 7.

The source-side end of the third p$^+$-type region 23 may slightly protrude into the n$^+$-type source region 5. Further, the third p$^+$-type region 23 is disposed separated from the first and the second p$^+$-type regions 21, 22. The third p$^+$-type region 23, for example, may have a substantially rectangular cross-sectional shape having a length in the depth direction. The third p$^+$-type region 23 is a so-called HALO region and suppresses the spreading of depletion layers in the p-type base region 4 respectively spreading from the pn junction of the p-type base region 4 and the n$^+$-type source region 5, and the pn junction of the p-type base region 4 and the n-type current diffusion region 3, when the MOSFET is in the ON state.

A part of the p-type base region 4 between the side wall of the trench 7 and the third p$^+$-type region 23 is a region (hereinafter, channel region) 4a in which the channel (n-type inversion layer) is formed along the side wall of the trench 7 when the MOSFET is in the ON state. The width of the channel region 4a is the distance t1 from the third p$^+$-type region 23 to the side wall of the trench 7. The thickness (i.e., the thickness of the p-type base region) t2 of the channel region 4a is the channel length L. Provision of the third p$^+$-type region 23 enables increases of the short channel effect to be suppressed when the MOSFET is in the ON state, even when the thickness t2 of the channel region 4a (=the channel length L) is reduced to reduce the ON resistance.

In the n-type current diffusion region 3, a first n-type region 24 is provided between the channel region 4a and the first p$^+$-type region 21. The first n-type region 24 may be in contact with the channel region 4a, the first p$^+$-type region 21, third p$^+$-type region 23, and the gate insulating film 8. The first n-type region 24, for example, may have a substantially curved or linear cross-sectional shape extending along the inner wall of the trench 7. The first n-type region 24 opposes the gate electrode 9 across the gate insulating film 8. A depth d11' of the first n-type region 24 from the inner wall of the trench 7, for example, may be about equal to the width of the channel region 4a (=t1).

An impurity concentration of the first n-type region 24 is higher than the impurity concentration of the n-type current diffusion region 3. Further, an impurity amount of the first n-type region 24 is set to an impurity amount of a magnitude by which the channel region 4a is not inverted (inverted to an n-type) by third and fourth oblique ion implantations 46a, 46b (refer to FIGS. 29 and 30) for forming the first n-type region 24 and described hereinafter. In particular, the impurity amount of the first n-type region 24 is less than a total impurity amount of the n-type current diffusion region 3 and the p-type base region 4.

Further, in the n-type current diffusion region 3, a second n-type region 25 is provided between the third p$^+$-type region 23 and the first p$^+$-type region 21. The second n-type region 25 may be in contact with the third p$^+$-type region 23, the first p$^+$-type region 21, and the first n-type region 24. The second n-type region 25 has a curved or a linear cross-sectional shape extending along the first n-type region 24.

A depth d12' of the second n-type region 25 from the inner wall of the trench 7 may be a depth d2 of the third p$^+$-type region 23, from the inner wall of the trench 7. A reason for this is that when the depth d12' of the second n-type region 25, from the inner wall of the trench 7 is deeper than the depth d2 of the third p$^+$-type region 23, from the inner wall of the trench 7, the breakdown voltage, which is determined by the impurity concentration of the n-type current diffusion region 3, decreases. On the other hand, the depth d12' of the second n-type region 25, from the inner wall of the trench 7 is deeper than the depth d2 of the third p$^+$-type region 23, from the inner wall of the trench 7, enabling spreading resistance to be reduced. Therefore, the depth d12' of the second n-type region 25, from the inner wall of the trench 7 is set according to required characteristics. The depth d12' of the second n-type region 25, from the inner wall of the trench 7, for example, is determined by the depth d11' of the first n-type region 24, from the inner wall of the trench 7 and a distance w2 between third p$^+$-type region 23 and the first p$^+$-type region 21.

An impurity concentration of the second n-type region 25 is higher than the impurity concentration of the n-type current diffusion region 3. The impurity concentration of the second n-type region 25 may be higher than the impurity concentration of the first n-type region 24. An impurity amount of the second n-type region 25 is set to an impurity amount of a magnitude by which the third p$^+$-type region 23 is not inverted (inverted to an n-type) by fifth and sixth oblique ion implantations 47a, 47b (refer to FIGS. 31, 32) described hereinafter for forming the second n-type region 25. In particular, the impurity amount of the second n-type region 25 is less than a total impurity amount of the n-type current diffusion region 3 and the third p$^+$-type region 23.

Arrangement of the first and the second n-type regions 24, 25 in this manner enables an n-type impurity concentration of a region in the n-type current diffusion region 3, a region whose parasitic resistance increases, to be increased by a HALO structure. As a result, the parasitic resistance of the region whose parasitic resistance increases may be reduced by the HALO structure. Thus, it is preferable for the first and the second n-type regions 24, 25 to be positioned accurately by self-alignment with the third p$^+$-type region 23 constituting the HALO structure. Therefore, as described hereinafter, the first and the second n-type regions 24, 25 may be formed by self-alignment with the inner wall of the trench 7 by oblique ion implantation. In this case, the depths d11', d12' of the first and the second n-type regions 24, 25 from the inner wall of the trench 7 are each constant from the inner wall of the trench 7.

The method of manufacturing the semiconductor device according to the eighth embodiment will be described. Description of parts similar to those depicted in FIGS. 2 to 6 of the first embodiment will be omitted hereinafter. FIGS. 27, 28, 29, 30, 31, and 32 are cross-sectional views of the semiconductor device according to the eighth embodiment during manufacture. First, similarly to the first embodiment, processes of preparing the n$^+$-type starting substrate 1 constituting the n$^+$-type drain region and forming the n$^-$-type silicon carbide layer 31, to forming the trench 7 are sequentially performed (refer to FIGS. 2 to 6).

Figure 27:
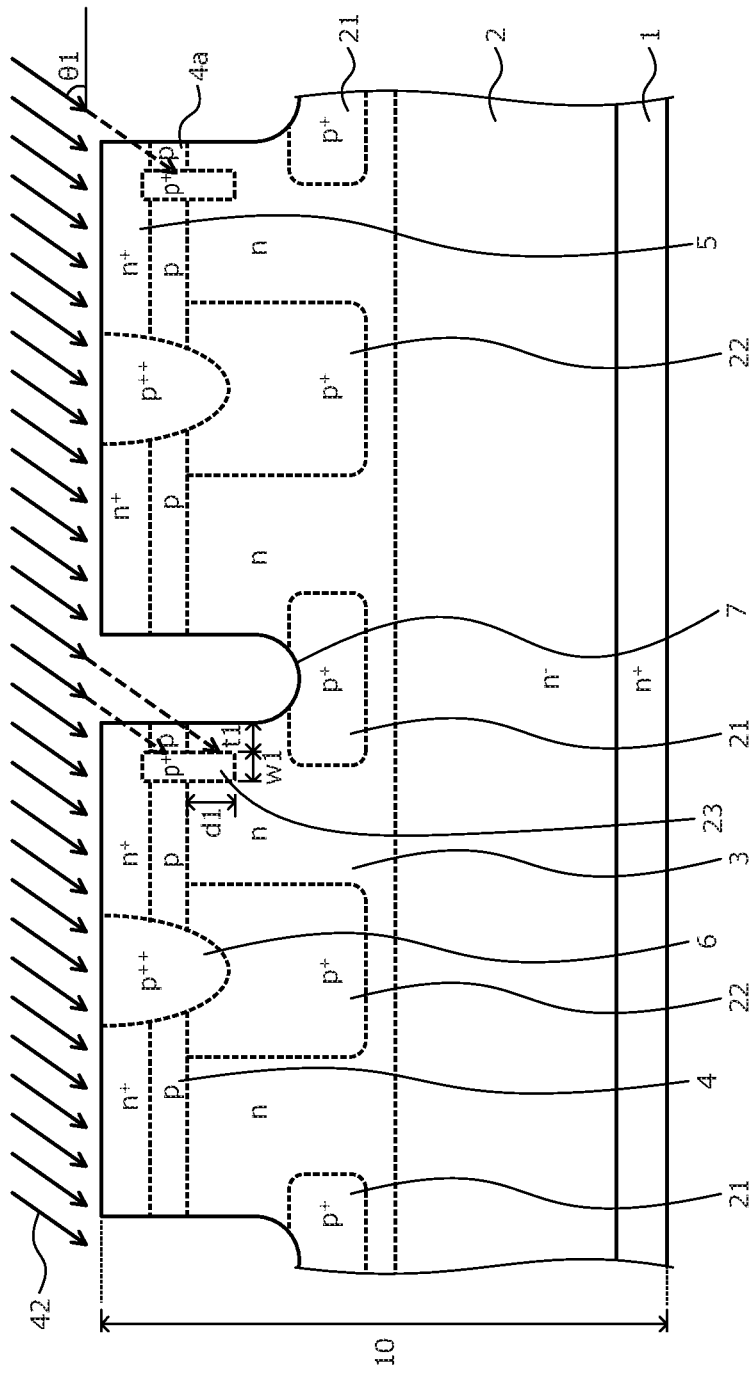
FIG. 27 is a cross-sectional view of the semiconductor device according to the eighth embodiment during manufacture.

Subsequently, after formation of the trench 7 (FIG. 6), next, as depicted in FIG. 27, after the oxide film 41 is removed, ion implantation (hereinafter, first oblique ion implantation) 42 of a p-type impurity such as aluminum (Al), etc. is performed with respect to the first side walls of the trenches 7, from the oblique direction that is the predetermined implantation angle θ1 relative to the front surface of the semiconductor substrate 10. The third p$^+$-type region 23 is selectively formed, by the first oblique ion implantation 42, in the p-type base region 4 (or spanning into the n-type current diffusion region 3 from the p-type base region 4) and is separated from the first side wall of the trench 7 by the predetermined distance t1.

Figure 28:
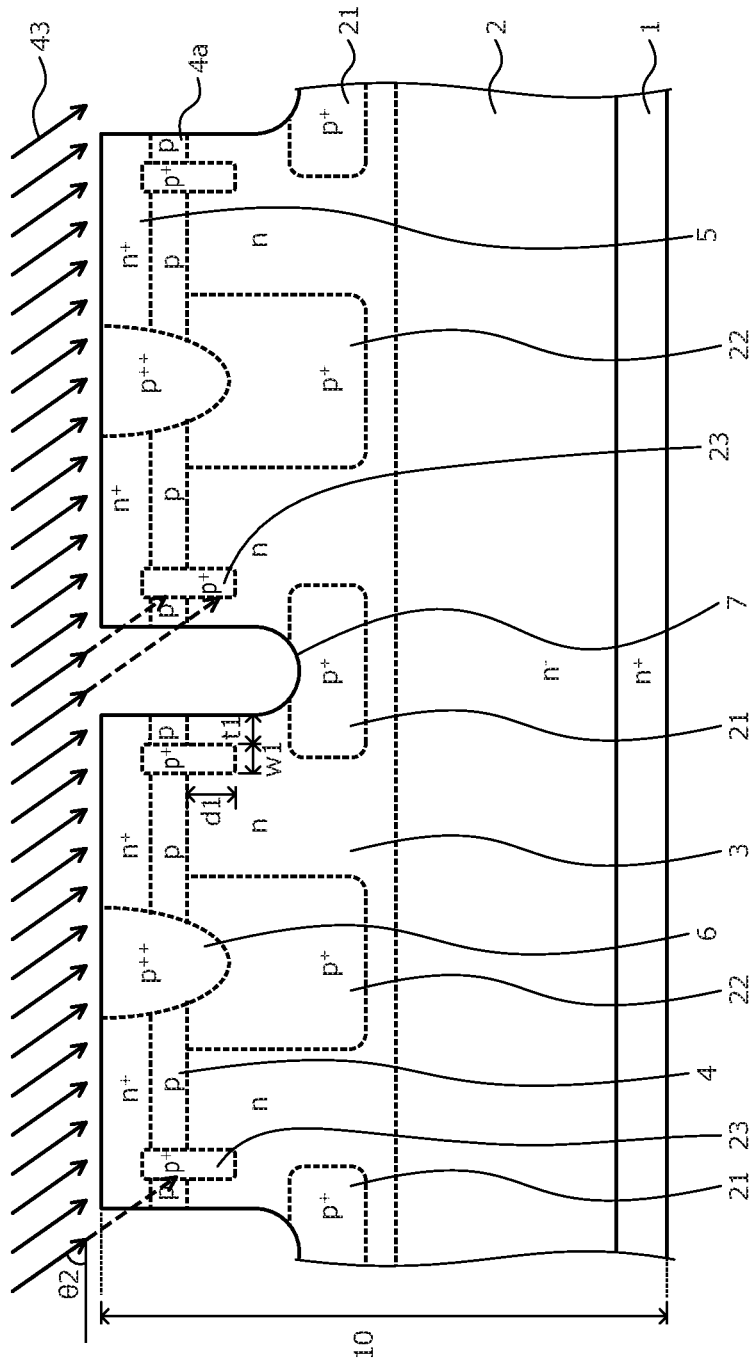
FIG. 28 is a cross-sectional view of the semiconductor device according to the eighth embodiment during manufacture.

Next, as depicted in FIG. 28, ion implantation (hereinafter, second oblique ion implantation) 43 of a p-type impurity such as aluminum is performed with respect to the second side walls of the trenches, from the oblique direction at the predetermined implantation angle θ2 relative to the front surface of the semiconductor substrate 10. The third p$^+$-type region 23 is selectively formed, by the second oblique ion implantation 43, in the p-type base region 4 (or spanning into the n-type current diffusion region 3 from the p-type base region 4) and is separated from the second side wall of the trench 7 by the predetermined distance t1. Conditions of the second oblique ion implantation 43 excluding the implantation angle θ2 are similar to those of the first oblique ion implantation 42.

A p-type impurity is implanted into each of the side walls of the trenches 7 by the first and the second oblique ion implantations 42, 43 at the implantation angles θ1, θ2 that are symmetrical to each other relative to the side walls of the trenches 7, whereby the third p$^+$-type regions 23 are formed. Formation of the third p$^+$-type region 23 by the first and the second oblique ion implantations 42, 43 in this manner enables the predetermined distance t1 from the third p$^+$-type region 23 to the side wall of the trench 7 to be achieved stably.

Conditions of the first and the second oblique ion implantations 42, 43 are set based on the predetermined distance t1 from the third p$^+$-type region 23 to the side wall of the trench 7; the predetermined depth d1 of the third p$^+$-type region 23 from the interface of the p-type base region 4 and the n-type current diffusion region 3 toward the drain; and the width (thickness in a direction orthogonal to the side wall of the trench 7) w1 of the third p$^+$-type region 23. The implantation angles θ1, θ2 of the first and the second oblique ion implantations 42, 43, for example, may be in a range from about 30 degrees to 60 degrees relative to the front surface of the semiconductor substrate 10. First and second acceleration energies of the first and the second oblique ion implantations 42, 43, for example, may be in a range from about 150 keV to 350 keV.

During the first and the second oblique ion implantations 42, 43, the p-type impurity is also ion implanted in the n$^+$-type source region 5 and the p$^{++}$-type contact region 6. However, the n$^+$-type source region 5 and the p$^{++}$-type contact region 6 have high impurity concentrations (for example, the impurity concentration of the n$^+$-type source region 5 is about $1\times10^{19}/cm^3$), and the impurity concentration of the third p$^+$-type region 23 is at least 10 times lower than the impurity concentrations of the n$^+$-type source region 5 and the p$^{++}$-type contact region 6. Therefore, even when the p-type impurity is ion implanted in the n$^+$-type source region 5 and/or the p$^{++}$-type contact region 6 during the first and the second oblique ion implantations 42, 43, the MOSFET characteristics are not affected.

Figure 29:
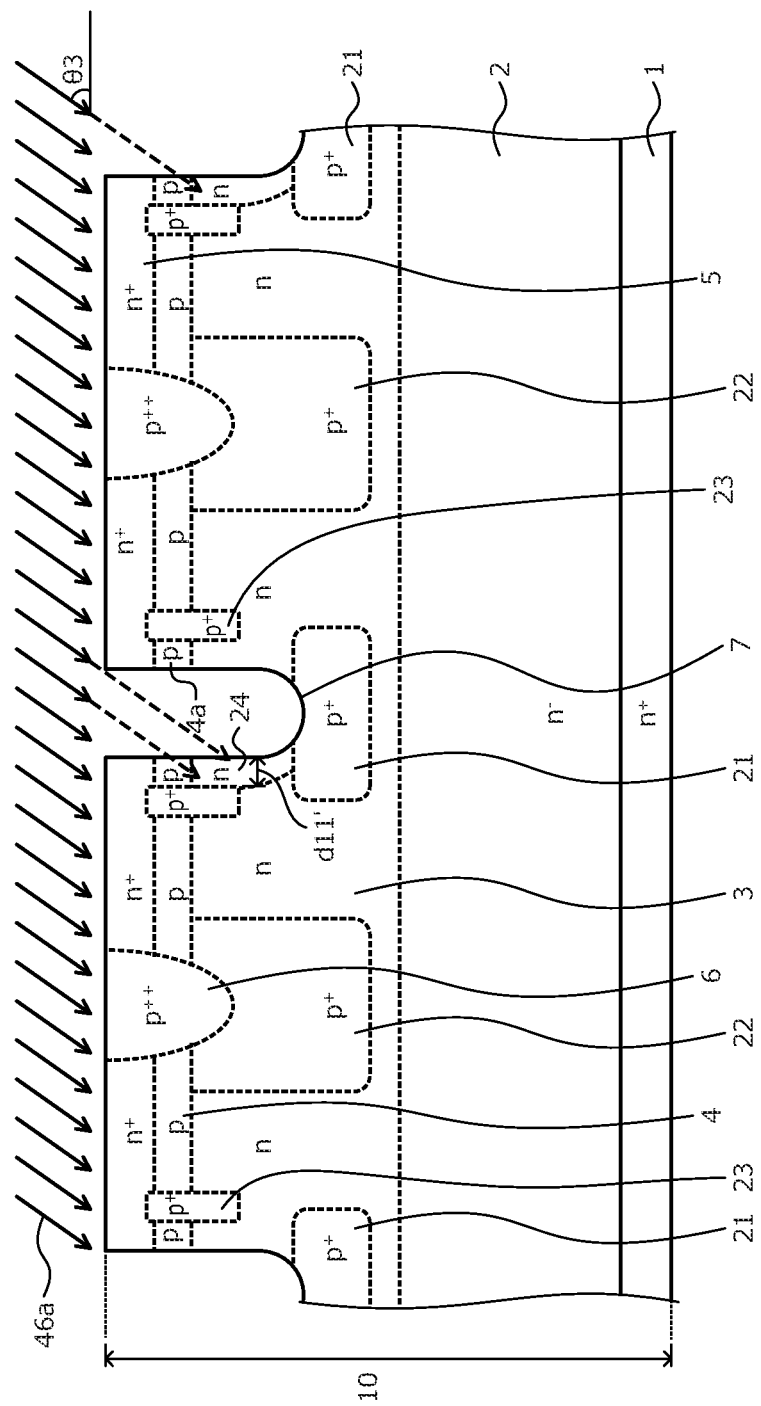
FIG. 29 is a cross-sectional view of the semiconductor device according to the eighth embodiment during manufacture.

Next, as depicted in FIG. 29, from an oblique direction at the predetermined implantation angle θ3 relative to the front surface of the semiconductor substrate 10, ion implantation (hereinafter, third oblique ion implantation) 46a of an n-type impurity is performed with respect to the first side walls of the trenches 7. The first n-type region 24 is selectively formed in the n-type current diffusion region 3 at the predetermined depth d11' from the first side walls of the trenches 7 by the third oblique ion implantation 46a.

Figure 30:
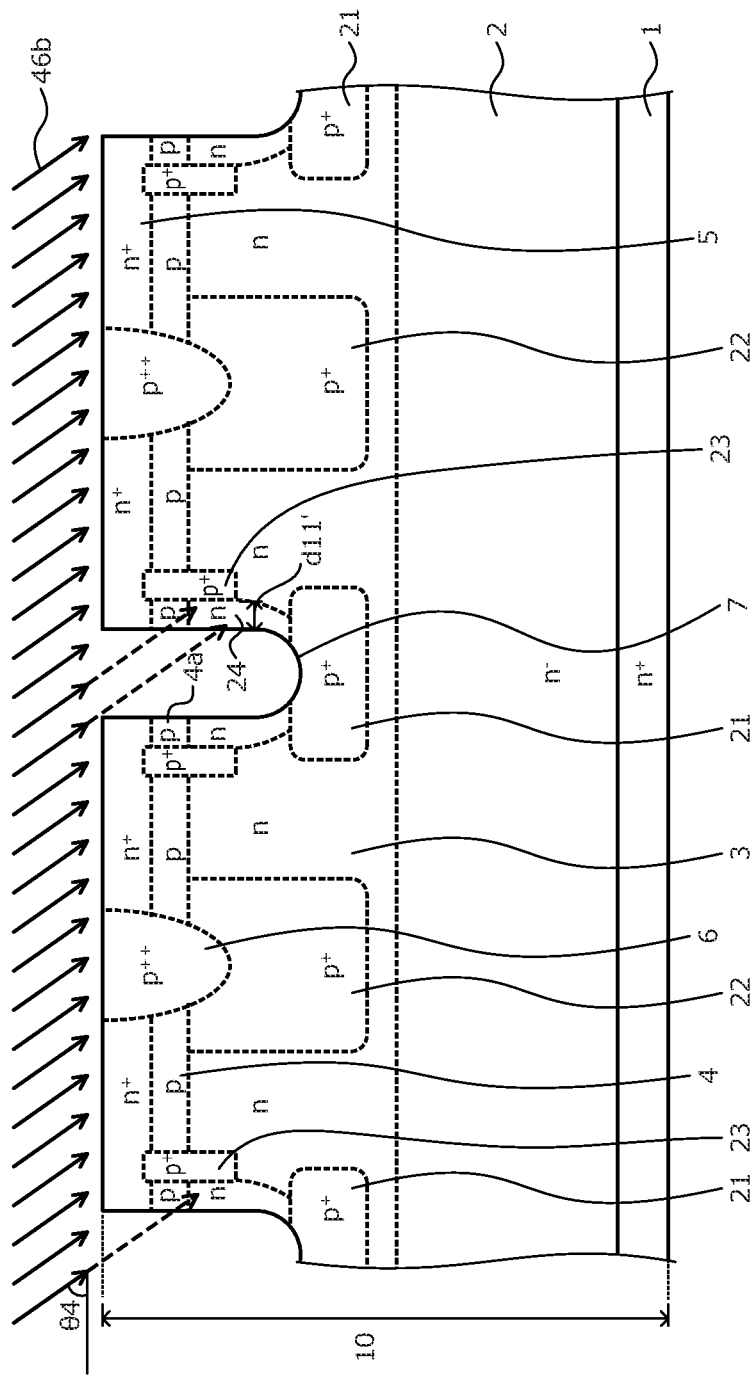
FIG. 30 is a cross-sectional view of the semiconductor device according to the eighth embodiment during manufacture.

Next, as depicted in FIG. 30, ion implantation (hereinafter, fourth oblique ion implantation) 46b of an n-type impurity is performed with respect to the second side walls of the trenches 7 from an oblique direction at the predetermined implantation angle θ4 relative to the front surface of the semiconductor substrate 10. The first n-type region 24 is selectively formed in the n-type current diffusion region 3 at the predetermined depth d11' from the second side walls of the trenches 7 by the fourth oblique ion implantation 46b.

An n-type impurity is implanted into both side walls of the trenches 7 by the third and the fourth oblique ion implantations 46a, 46b from the implantation angles θ3, θ4 that are symmetrical to each other relative to the side walls of the trenches 7, whereby the first n-type regions 24 are formed. Excluding the implantation angle θ4, conditions of the fourth oblique ion implantation 46b are similar to those of the third oblique ion implantation 46a. The implantation angles θ3, θ4 of the third and the fourth oblique ion implantations 46a, 46b, for example, may be in a range from about 10 degrees to 50 degrees relative to the front surface of the semiconductor substrate 10. The acceleration energies of the third and the fourth oblique ion implantations 46a, 46b, for example, may be in a range from about 30 keV to 300 keV.

Figure 31:
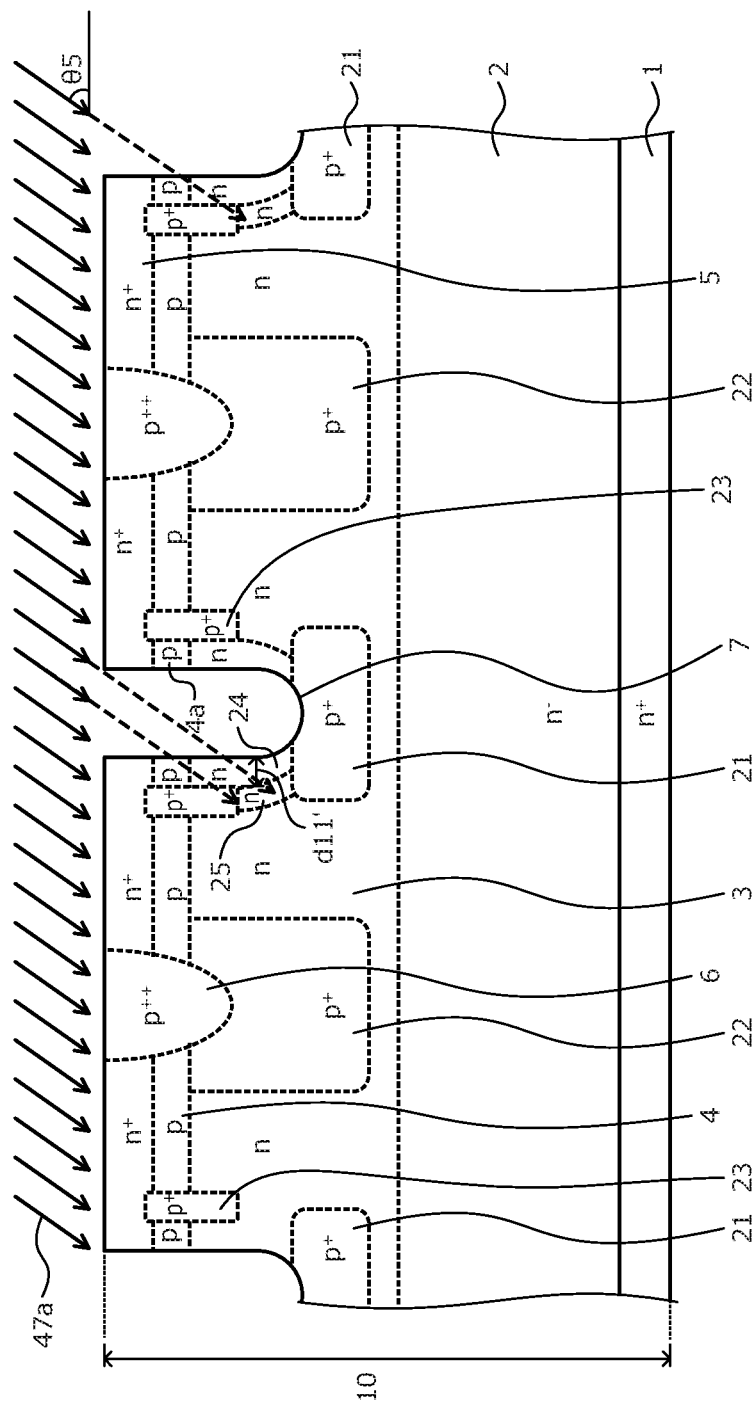
FIG. 31 is a cross-sectional view of the semiconductor device according to the eighth embodiment during manufacture.

Next, as depicted in FIG. 31, ion implantation (hereinafter, fifth oblique ion implantation) 47a of an n-type impurity is performed with respect to the first side walls of the trenches 7 from an oblique direction at a predetermined implantation angle θ5 relative to the front surface of the semiconductor substrate 10. The second n-type region 25 is selectively formed in the n-type current diffusion region 3 by the fifth oblique ion implantation 47a so as to be separated from the first side walls of the trenches 7 by a predetermined distance (equal to the depth d11' of the first n-type region 24, from the inner wall of the trench 7).

Figure 32:
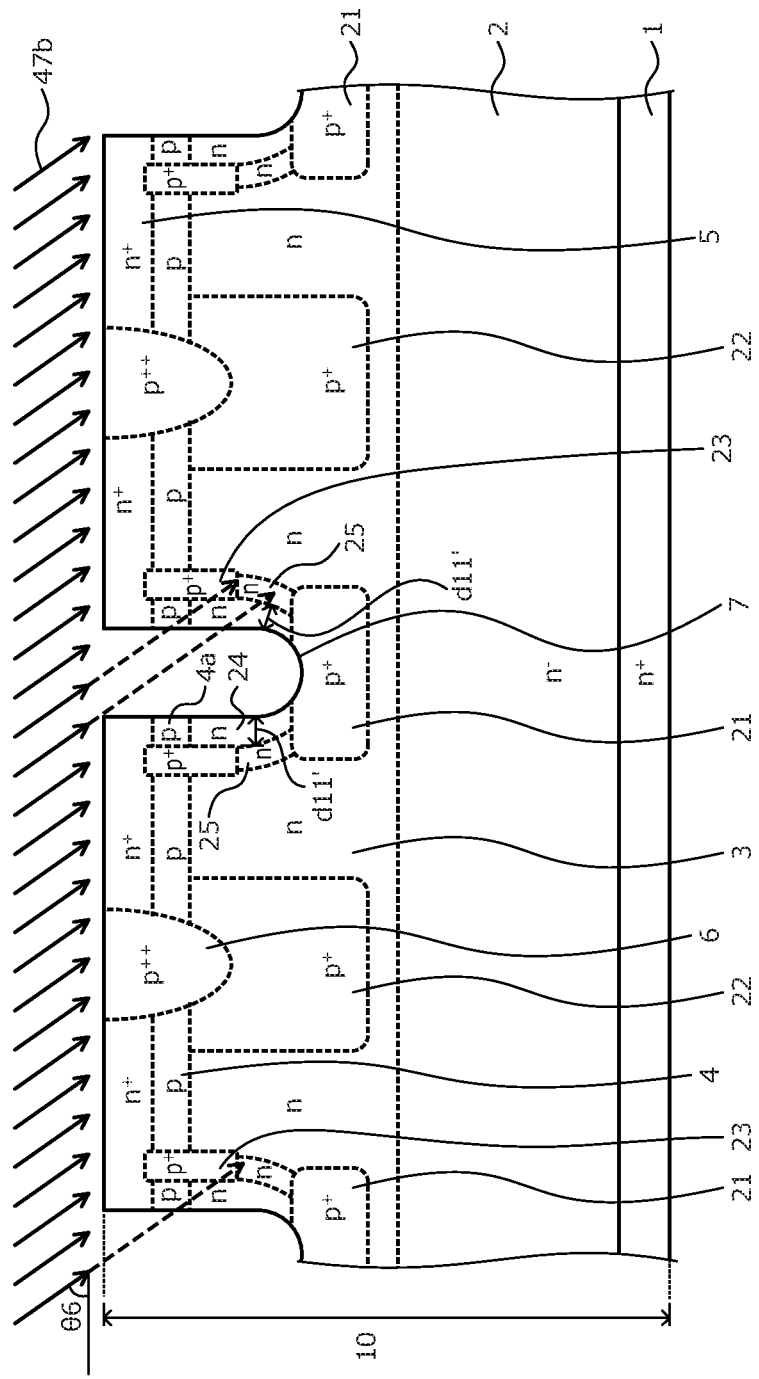
FIG. 32 is a cross-sectional view of the semiconductor device according to the eighth embodiment during manufacture.

Next, as depicted in FIG. 32, ion implantation (hereinafter, sixth oblique ion implantation) 47b of implanting an n-type impurity is performed with respect to the second side walls of the trenches 7, from an oblique direction at a predetermined implantation angle θ6 relative to the front surface of the semiconductor substrate 10. The second n-type region 25 is selectively formed in the n-type current diffusion region 3 by the sixth oblique ion implantation 47b so as to be separated from the second side walls of the trenches 7 by a predetermined distance (equal to the depth d11' of the first n-type region 24, from the inner wall of the trench 7).

An n-type impurity is implanted into both side walls of the trenches by the fifth and the sixth oblique ion implantations 47a, 47b, at the implantation angles θ5, θ6 that are symmetrical to each other relative to the side walls of the trenches 7, whereby the second n-type regions 25 are formed. Excluding the implantation angle θ6, conditions of the sixth oblique ion implantation 47b are similar to those of the fifth oblique ion implantation 47a. The implantation angles θ5, θ6 of the fifth and the sixth oblique ion implantations 47a, 47b, for example, may be in a range from about 10 degrees to 50 degrees relative to the front surface of the semiconductor substrate 10. The acceleration energies of the fifth and the sixth oblique ion implantations 47a, 47b, for example, may be in a range from about 100 keV to 400 keV.

Next, a non-depicted carbon (C) film is formed along the front surface of the semiconductor substrate 10 and the inner walls of the trenches 7. Next, heat treatment (activation annealing) for activating the impurities is performed with respect to all of the regions formed by ion implantation. Next, the carbon film is removed. Next, heat treatment (annealing) for rounding corners of the bottoms of the trenches 7 and openings of the trenches 7 is performed. Next, by a general method, the gate insulating film 8, the gate electrode 9, the interlayer insulating film 11, contact holes, the source electrode 12, and the drain electrode 13 are formed. Thereafter, the semiconductor wafer is diced (cut) into individual chips, whereby the MOSFET depicted in FIG. 26 is completed.

As described above, according to the eighth embodiment, as a HALO structure, the first n-type region is disposed in a region (region of the n-type current diffusion region, between the trench and the third p$^+$-type region) in which the parasitic resistance is highest. Additionally, as a HALO structure, the second n-type region is disposed in a region (region of the n-type current diffusion region, between the first p$^+$-type region and the third p$^+$-type region) in which the parasitic resistance is second highest. As a result, the n-type impurity concentration of the regions in which the parasitic resistance increases may be increased by the HALO structures. As a result, with the HALO structure, the parasitic resistance is a region whose parasitic resistance increases may be reduced, enabling the ON resistance to be reduced.

Further, according to the eighth embodiment, the first and the second n-type regions, and the third p$^+$-type region constituting the HALO structure are formed by self-alignment with the inner walls of the trenches by oblique ion implantation. Therefore, the first and the second n-type regions may be disposed by self-alignment with the third p$^+$-type region constituting the HALO structure. Thus, with the HALO structure, the first and the second n-type regions may to be disposed with dimensional precision in the region whose parasitic resistance increases.

Figure 33:
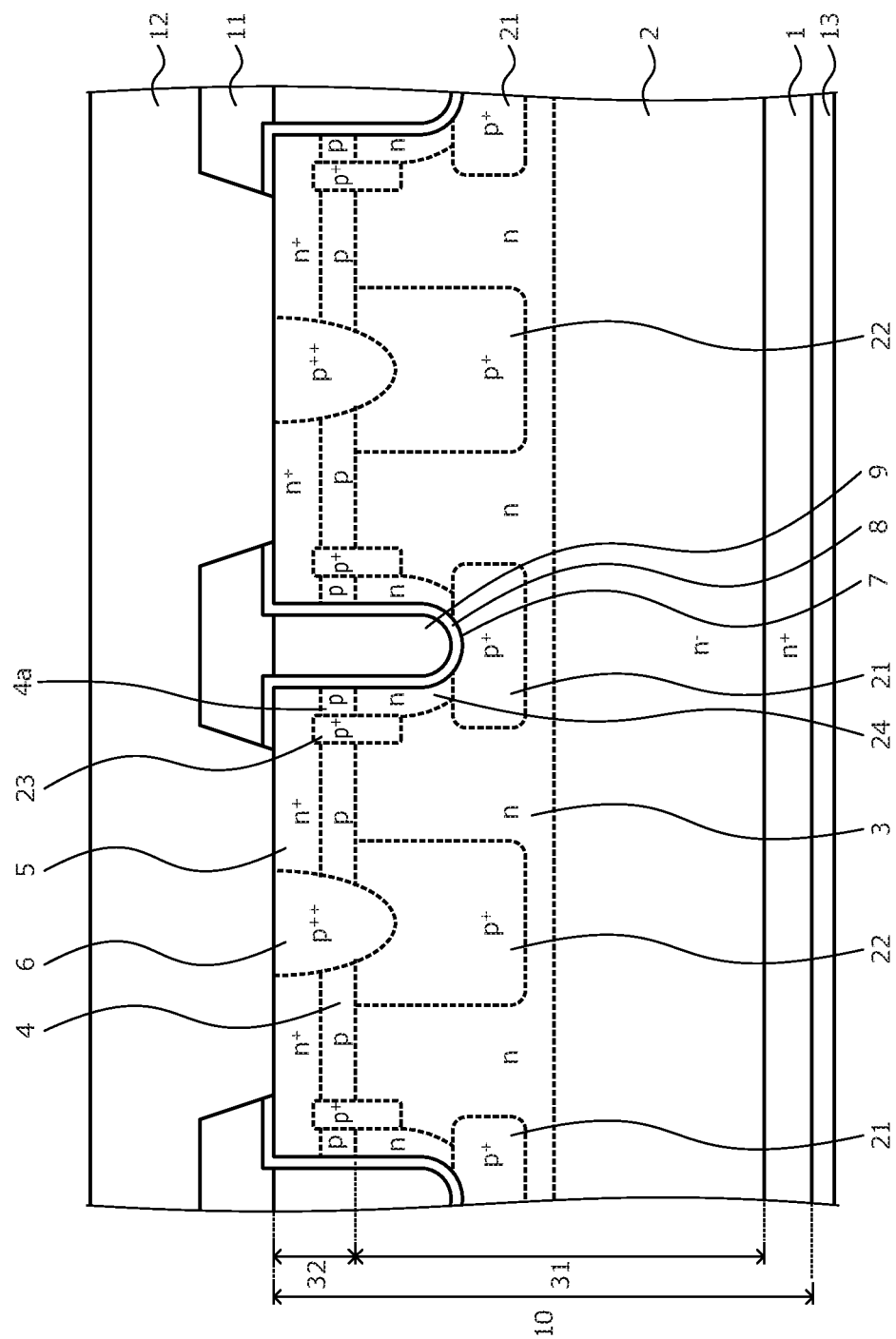
FIG. 33 is a cross-sectional view of a structure of the semiconductor device according to a ninth embodiment.

A structure of the semiconductor device according to a ninth embodiment will be described. FIG. 33 is a cross-sectional view of a structure of the semiconductor device according to the ninth embodiment. The semiconductor device according to the ninth embodiment differs from the semiconductor device according to the eighth embodiment in that the first n-type region 24 alone is provided without provision of the second n-type region 25 (refer to FIG. 2).

A method of manufacturing the semiconductor device according to the ninth embodiment omits in the method of manufacturing the semiconductor device according to the eighth embodiment, the fifth and the sixth oblique ion implantations 47a, 47b (refer to FIGS. 31, 32) for forming the second n-type region 25.

As described above, according to the ninth embodiment, of the first and the second n-type regions of the n-type current diffusion region and disposed near the trench side wall, even when only the first n-type region is disposed between the channel region and the first p$^+$-type region, Junction FET (JFET) resistance may be reduced. Therefore, similarly to the eighth embodiment, an effect of reducing the ON resistance may be obtained.

Figure 34:
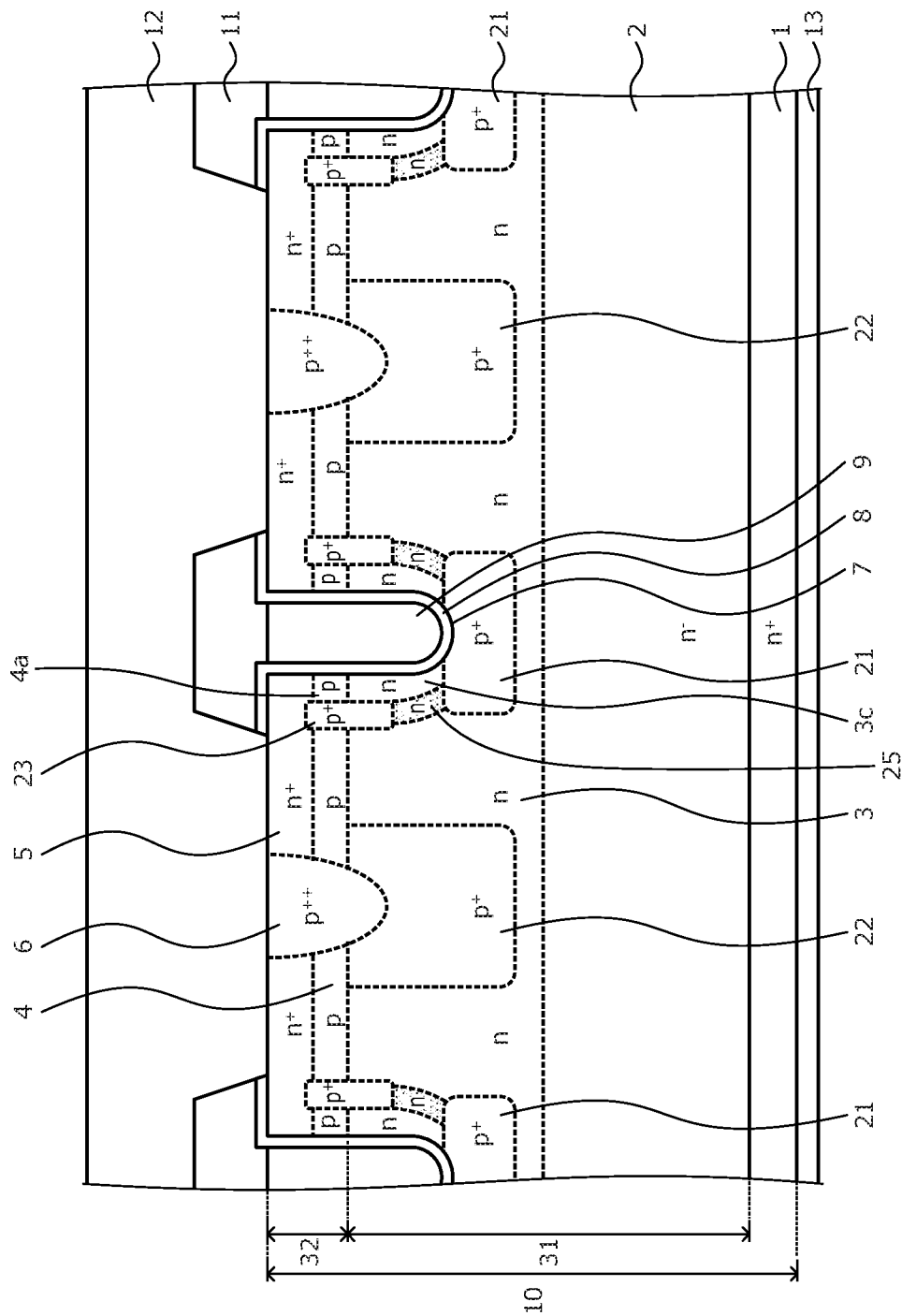
FIG. 34 is a cross-sectional view of a structure of the semiconductor device according to a tenth embodiment.

A structure of the semiconductor device according to a tenth embodiment will be described. FIG. 34 is a cross-sectional view of a structure of the semiconductor device according to the tenth embodiment. The semiconductor device according to the tenth embodiment differs from the semiconductor device according to the eighth embodiment in that the second n-type region 25 alone is provided without provision of the first n-type region 24 (refer to FIG. 26). In other words, a part surrounded by the channel region 4a, the third p$^+$-type region 23, the first p$^+$-type region 21 and the second n-type region 25 is a part 3c of the n-type current diffusion region 3. In FIG. 34, the second n-type region 25 is indicated by hatching.

The method of manufacturing the semiconductor device according to the tenth embodiment omits in the method of manufacturing the semiconductor device according to the eighth embodiment, the third and the fourth oblique ion implantations 46a, 46b for forming the first n-type region 24 (refer to FIGS. 29, 30).

As described above, according to the tenth embodiment, of the first and the second n-type regions of the n-type current diffusion region and disposed near the trench side wall, even when only the second n-type region is disposed between the channel region and the first p$^+$-type region, the JFET resistance may be reduced. Therefore, similarly to the eighth embodiment, an effect of reducing the ON resistance may be obtained.

Figure 35:
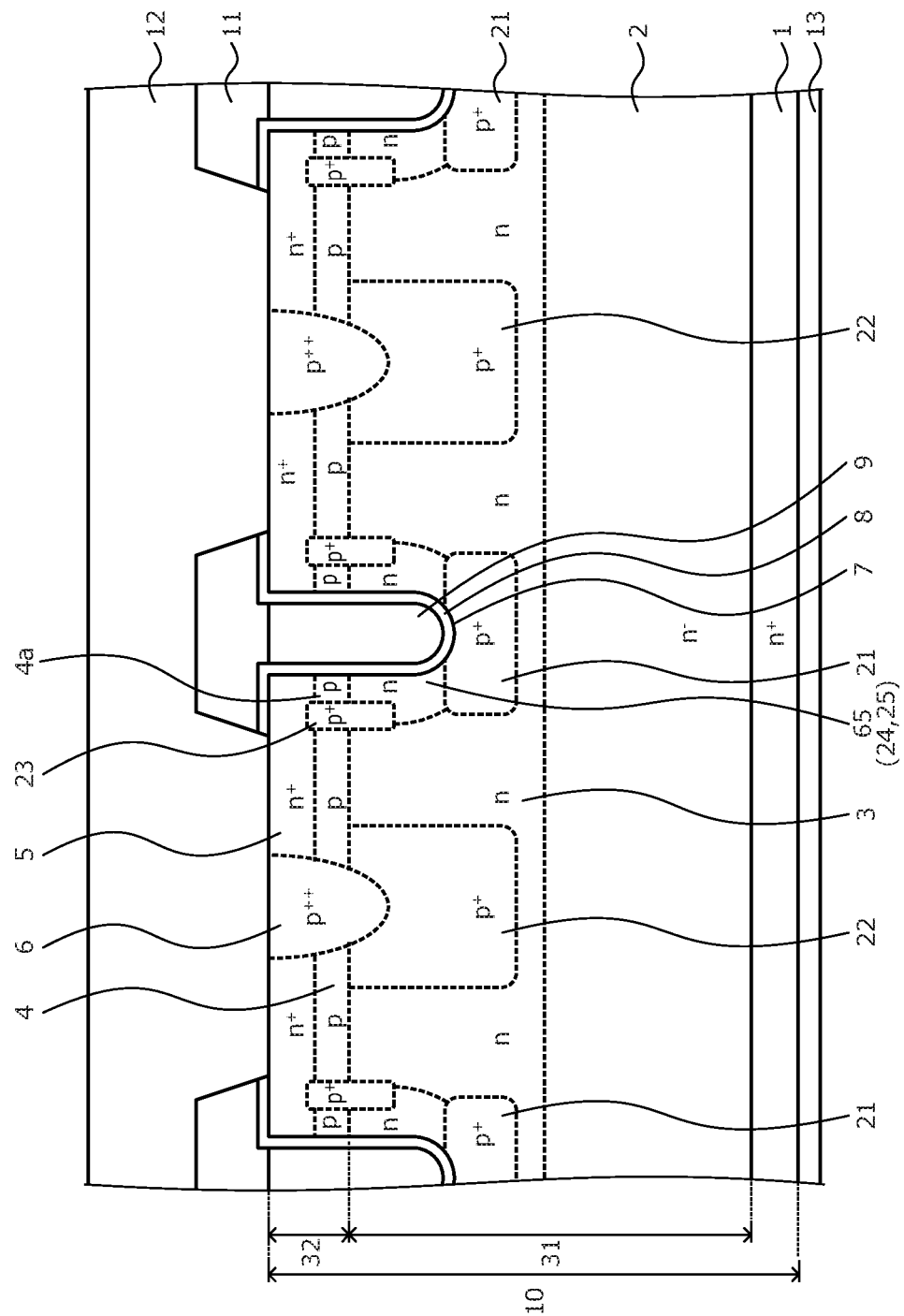
FIG. 35 is a cross-sectional view of a structure of the semiconductor device according to an eleventh embodiment.

A structure of the semiconductor device according to the eleventh embodiment will be described. FIG. 35 is a cross-sectional view of a structure of the semiconductor device according to the eleventh embodiment. The semiconductor device according to the eleventh embodiment differs from the semiconductor device according to the eighth embodiment in that the first and the second n-type regions 24, 25 have a same impurity concentration and a single n-type region 65 formed by a connection of the first and the second n-type regions 24, 25 is provided.

The method of manufacturing the semiconductor device according to the eleventh embodiment includes in the method of manufacturing the semiconductor device according to the eighth embodiment, performing the third to the sixth oblique ion implantations 46a, 46b, 47a and 47b (refer to FIGS. 29 to 32) so that the impurity concentrations of the first n-type region 24 and the second n-type region 25 become equal.

As described above, according to the eleventh embodiment, even when the first and the second n-type regions of the n-type current diffusion region and disposed near the trench side wall have the same impurity concentrations, the parasitic resistance may be reduced, thereby enabling effects similar to those of the eighth to the tenth embodiments to be obtained.

Figure 36:
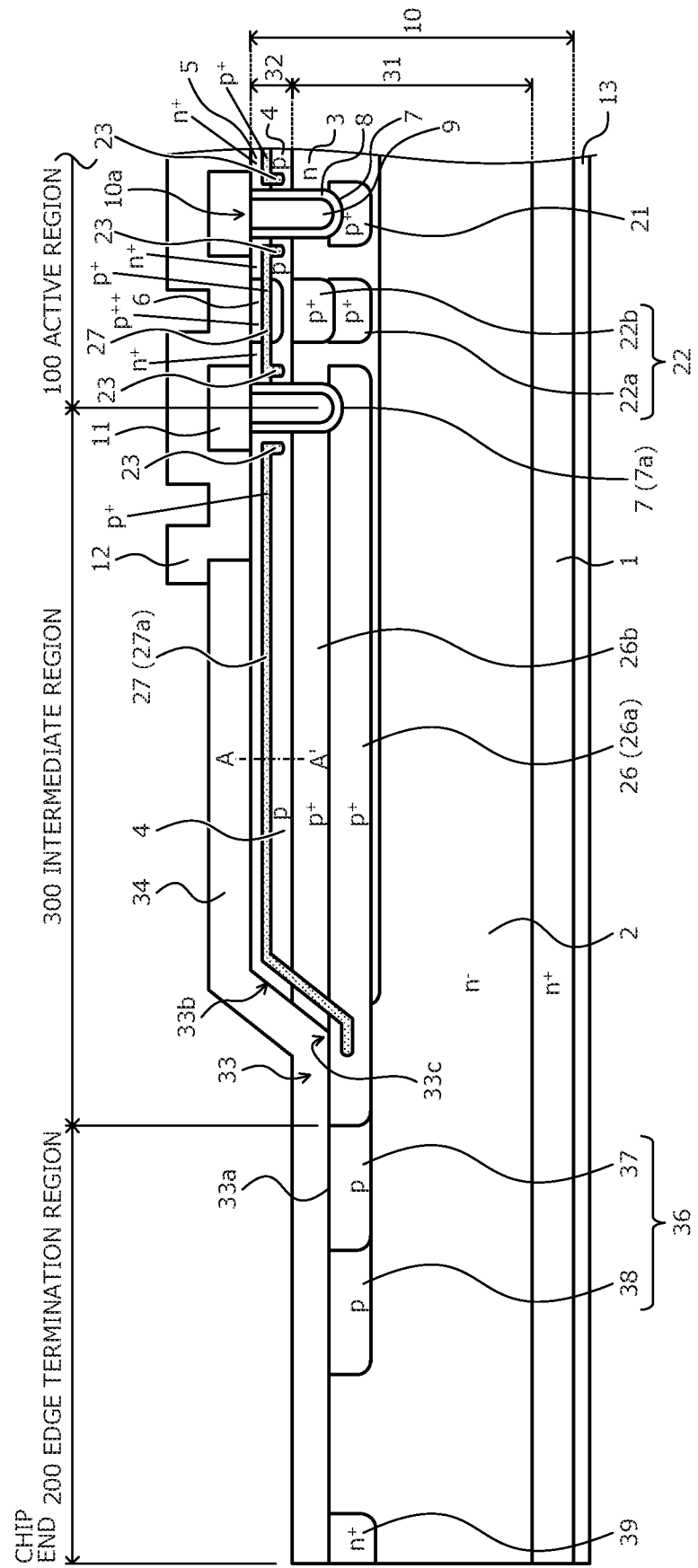
FIG. 36 is a cross-sectional view of a structure of the semiconductor device according to a twelfth embodiment.

A structure of the semiconductor device according to a twelfth embodiment will be described. FIG. 36 is a cross-sectional view of a structure of the semiconductor device according to the twelfth embodiment. The semiconductor device according to the twelfth embodiment depicted in FIG. 36 includes in the semiconductor substrate (semiconductor chip) 10 containing silicon carbide, an active region 100 in which a vertical MOSFET is disposed and an edge termination region 200 in which a JTE structure 36 is disposed. Description of regions similar to those in the first to the eleventh embodiments will be omitted hereinafter. The edge termination region 200 is a region between the active region 100 and the chip (the semiconductor substrate 10) side surface and a region that mitigates electric field of the n$^-$-type drift region 2 at the side thereof toward the substrate front surface (the front surface of the semiconductor substrate 10) and that sustains breakdown voltage. The breakdown voltage is a voltage limit at which errant operation or damage of the semiconductor device does not occur. Reference numeral 300 is a region (intermediate region) between the active region 100 and the edge termination region 200.

A first p$^+$-type region 26 (hereinafter, outermost first p$^+$-type region 26a) that underlies the bottom of an outermost trench 7a extends to a recess 33 described hereinafter and is exposed at a bottom 33a of the recess 33. The bottom 33a of the recess 33 is the front surface of the semiconductor substrate 10 newly formed in the edge termination region 200 by the formation of the recess 33. Exposure at the bottom 33a of the recess 33 means disposal so as to be in contact with a field oxide film 34 described hereinafter at a surface layer of the bottom 33a of the recess 33. The outermost first p$^+$-type region 26a, for example, extends further toward a chip end than do the n-type current diffusion region 3 and a fourth p$^+$-type region 26b.

The second p$^+$-type region 22 is provided between (mesa region) adjacent trenches 7, separated from the first p$^+$-type region 22 and the trenches 7, and in contact with the p-type base region 4. The second p$^+$-type region 22, for example, may have a 2-layer structure in which a part 22a disposed at a position at a same depth as that of the first p$^+$-type region 26 and a part 22b in contact with the p-type base region 4 are disposed adjacent to each other in the depth direction. When the second p$^+$-type region 22 has the 2-layer structure constituted by the parts 22a, 22b, the parts 22a, 22b, for example, may have a same width and a same impurity concentration.

Between the outermost first p$^+$-type region 26a and the p-type silicon carbide layer 32, the fourth p$^+$-type region 26b, extends from the outermost trench 7a to the recess 33 described hereinafter and is exposed at a side wall 33b of the recess 33. The side wall 33b of the recess 33 is a side surface of the p-type silicon carbide layer 32 newly formed by the formation of the recess 33 to become the front surface of the semiconductor substrate 10. Exposure at the side wall 33b of the recess 33 means disposal so as to be in contact with the field oxide film 34 at the surface layer of the side wall 33b of the recess 33.

The fourth p$^+$-type region 26b, for example, extends closer to the chip end than does the n-type current diffusion region 3. Further, the fourth p$^+$-type region 26b is in contact with the outermost first p$^+$-type region 26a and the p-type silicon carbide layer 32. In other words, in the intermediate region 300, in surface layer of the front surface of the semiconductor substrate 10, adjacent p-type regions are disposed in a sequence of the outermost first p$^+$-type region 26a nearest the drain, the fourth p$^+$-type region 26b and the p-type silicon carbide layer 32 along a vertical direction.

The first, the second and the fourth p$^+$-type regions 26, 22 and 26b may be selectively provided in the n$^-$-type silicon carbide layer 31 without providing the n-type current diffusion region 3. The pn junctions of the first and the second p$^+$-type region 26, 22 and the n-type current diffusion region 3 (or the n$^-$-type drift region 2) may be formed at a position deeper toward the drain than is the bottom of the trench 7 and a depth position of surfaces of the first and the second p$^+$-type region 26, 22 toward the drain may be variously changed according to design conditions.

Further, in the p-type silicon carbide layer 32, a fifth p$^+$-type region 27 is provided at a predetermined depth from the front surface of the semiconductor substrate 10, parallel to the front surface of the semiconductor substrate 10 and separated from the trench 7. The fifth p$^+$-type region 27, for example, in a same mesa region, is provided spanning between adjacent third p$^+$-type regions 23 sandwiching the p$^{++}$-type contact region 6 and is in contact with the p-type base region 4, the n$^+$-type source region 5 and the p$^{++}$-type contact region 6. The fifth p$^+$-type region 27 is disposed only in the active region 100 and the intermediate region 300 and is not disposed in the edge termination region 200.

An outermost fifth p$^+$-type region 27 (hereinafter, most peripheral fifth p+-type region 27a) extends from near the active region 100, parallel to the side wall 33b of the recess 33 and the bottom 33a, respectively, to a position opposing the bottom 33a of the recess 33 in the depth direction. The most peripheral fifth p$^+$-type region 27a is disposed at a predetermined depth from the bottom 33a of the recess 33 and the side wall 33b, and is not exposed at the bottom 33a of the recess 33 or the side wall 33b. While an outer end of the most peripheral fifth p$^+$-type region 27a toward the chip end terminates in the intermediate region 300, the outer end may be divided multiple times in a direction toward the chip end. The source electrode 12 may extend on the field oxide film 34.

In the edge termination region 200, the p-type silicon carbide layer 32 is removed from the edge termination region 200 entirely, thereby forming at the front surface of the semiconductor substrate 10, the recess 33 in which the edge termination region 200 is lower than the active region 100 (is recessed toward the drain). The p-type silicon carbide layer 32 may be removed from a part from the edge termination region 200 to an outer side of the intermediate region 300 and the recess 33 may extend from the edge termination region 200 to the intermediate region 300. In other words, the side wall 33b of the recess 33 may be positioned in the intermediate region 300.

At the active region 100 side of the bottom 33a of the recess 33, as described above, the outermost first p$^+$-type region 26a extending from the active region 100 side is exposed. The outermost first p$^+$-type region 26a underlies a bottom corner part 33c of the recess 33. The bottom corner part 33c of the recess 33 is a border of the bottom 33a and the side wall 33b of the recess 33. The n$^-$-type drift region 2 is exposed at the bottom 33a of the recess 33, closer to the chip end than is the outermost first p$^+$-type region 26a.

In the surface layer of a part of the n$^-$-type drift region 2 exposed at the bottom 33a of the recess 33, the JTE structure 36 is provided in which plural p-type regions (herein, two, first and second JTE regions 37, 38 sequentially from the active region 100 side) are disposed adjacently to each other and have impurity concentrations that are lower with proximity of the corresponding p-type region to the chip end. The impurity concentrations of the first and the second JTE regions 37, 38 are lower than that of the outermost first p$^+$-type region 26a. The first JTE region 37 is disposed closer to the chip end than is the outermost first p$^+$-type region 26a and is adjacent to the outermost first p$^+$-type region 26a.

The second JTE region 38 is disposed closer to the chip end than is the first JTE region 37 and is adjacent to the first JTE region 37. The JTE structure 36 constitutes the breakdown voltage structure. When the MOSFET is in the OFF state, a depletion layer that spreads from the pn junction between the p-type base region 4 and the n-type current diffusion region 3 toward the chip end spreads to both the first and the second JTE regions 37, 38. The breakdown voltage at the edge termination region 200 is established by the pn junctions of the first and the second JTE regions 37, 38 with the n$^-$-type drift region 2.

Further, in the surface layer of a part of the n$^-$-type drift region 2 exposed at the bottom 33a of the recess 33, an n$^+$-type stopper region 39 is selectively provided separated from the second JTE region 38 and is closer to the chip end than is the second JTE region 38. The n$^+$-type stopper region 39 is exposed at the side surface (i.e., chip end) of the semiconductor substrate 10. In the edge termination region 200 and the intermediate region 300, the front surface of the semiconductor substrate 10 is covered by the field oxide film 34.

The method of manufacturing the semiconductor device according to the twelfth embodiment includes performing in a state in which the edge termination region 200 is covered by an oxide film mask and performing with respect to the side walls of the trench 7 and the front surface of the semiconductor substrate 10 in the active region 100, the oblique ion implantation for forming the third and the fifth p$^+$-type regions 23, 27 that constitute the HALO structure. Additionally, the most peripheral fifth p$^+$-type region 27a may be formed at the bottom 33a and the side wall 33b of the recess 33 and at the front surface of the semiconductor substrate 10 in the intermediate region 300, by the same oblique ion implantation.

As described above, according to the twelfth embodiment, in a state in which the edge termination region is covered by an oxide film mask, the oblique ion implantation for forming the fourth p$^+$-type region that constitutes the HALO structure is performed. Therefore, the fifth p$^+$-type region disposed parallel to the front surface of the semiconductor substrate and formed together with the fourth p$^+$-type region at a predetermined depth from the front surface of the semiconductor substrate is not formed in the edge termination region by the oblique ion implantation. As a result, potential of the edge termination region, for example, does not change from the potential obtained by the JTE structure alone. The fourth p$^+$-type region constituting the HALO structure is formed by oblique ion implantation and the short channel effect may be suppressed while decreases of the breakdown voltage of the edge termination region may be suppressed by the oblique ion implantation.

In the embodiments of the present invention, various modifications are possible. For example, dimensions, impurity concentrations, etc. of regions may be variously set according to required specifications. Further, in the embodiments above, while a MOSFET has been described as an example, application to a MOS-type semiconductor device such as an insulated gate bipolar transistor (IGBT) is possible. Further, in the embodiments above, while a case is described in which an epitaxial substrate is used in which a silicon carbide layer is formed by epitaxial growth on a starting substrate containing silicon carbide, regions constituting the semiconductor device according to the present invention, for example, may be formed in a bulk substrate (semiconductor substrate having an epitaxial layer) by ion implantation, etc. The present invention is further applicable to a wide bandgap semiconductor material (e.g., gallium (Ga), etc.) other than silicon carbide. Furthermore, the present invention is similarly implemented when conductivity types (n-type, p-type) are inverted.

According to the embodiments of the present invention, the impurity concentration of a second semiconductor layer may be increased by an amount corresponding to the third second-conductivity-type semiconductor region provided. As a result, the spreading of depletion layers in the second semiconductor layer from a second electrode side and a first electrode side, respectively, may be suppressed.

According to the semiconductor device of the present invention, the tradeoff of reducing the ON resistance and suppressing decreases in the gate threshold voltage may be improved. Therefore, effects are achieved in that reduction of the ON resistance is facilitated and decreases in the gate threshold voltage due to the short channel effect may be suppressed.

As described, the semiconductor device according to the embodiments of the present invention is useful for a MOS-type semiconductor device having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
a semiconductor substrate containing a semiconductor material having a bandgap wider than that of silicon;
a first semiconductor layer of a first conductivity type provided on a front surface of the semiconductor substrate, the first semiconductor layer containing a semiconductor material having a bandgap wider than that of silicon;
a second semiconductor layer of a second conductivity type provided on a first side of the first semiconductor layer, opposite a second side of the first semiconductor layer facing toward the semiconductor substrate, the second semiconductor layer containing a semiconductor material having a bandgap wider than that of silicon;
a first first-conductivity-type region of the first conductivity type selectively provided in the second semiconductor layer;
a trench that penetrates the first first-conductivity-type region and the second semiconductor layer, and reaches the first semiconductor layer;
a gate electrode provided in the trench, via a gate insulating film;
a first second-conductivity-type semiconductor region of the second conductivity type selectively provided in the first semiconductor layer, separated from the second semiconductor layer and underlying a bottom of the trench;
a second second-conductivity-type semiconductor region of the second conductivity type selectively provided in the first semiconductor layer between the trench and an adjacent trench, the second second-conductivity-type semiconductor region being in contact with the second semiconductor layer;
a third second-conductivity-type semiconductor region of the second conductivity type selectively provided in the second semiconductor layer, closer to the first semiconductor layer than is the first first-conductivity-type region, the third second-conductivity-type semiconductor region being in contact with the first first-conductivity-type region and the first semiconductor layer, the third second-conductivity-type semiconductor region being a predetermined distance from a side wall of the trench, the third second-conductivity-type semiconductor region protruding 0.3 μm or less from an interface of the first semiconductor layer and the second semiconductor layer toward the semiconductor substrate and having an impurity concentration that is lower than that of the second semiconductor layer;
a first electrode in contact with the second semiconductor layer and the first first-conductivity-type region; and
a second electrode provided at a rear surface of the semiconductor substrate.

2. The semiconductor device according to claim 1, wherein
an impurity concentration of a part of the second semiconductor layer between the side wall of the trench and the third second-conductivity-type semiconductor region is at most 10% of the impurity concentration of the third second-conductivity-type semiconductor region.

3. The semiconductor device according to claim 1, wherein
the third second-conductivity-type semiconductor region has an L-shaped cross-sectional shape formed by a first linear part extending along the side wall of the trench and a second linear part orthogonal to the first linear part and extending along a first surface of the second semiconductor layer, opposite a second surface of the second semiconductor layer facing toward semiconductor substrate.

4. The semiconductor device according to claim 1, further comprising
a second first-conductivity-type region of the first conductivity type and having an impurity concentration higher than that of the first semiconductor layer, and in the first semiconductor layer, the second first-conductivity-type region being in contact with the second semiconductor layer and reaching a position deeper toward the second electrode from an interface with the second semiconductor layer than is the bottom of the trench.

5. The semiconductor device according to claim 4, wherein
the second first-conductivity-type region has at least any one of:

a first region of the first semiconductor layer provided between the trench and the third second-conductivity-type semiconductor region, and a second region of the first semiconductor layer provided between the first second-conductivity-type semiconductor region and the third second-conductivity-type semiconductor region.

6. The semiconductor device according to claim 5, wherein the first region of the first semiconductor layer is provided between first second-conductivity-type semiconductor region and the second semiconductor layer.

7. The semiconductor device according to claim 5, wherein the first region is in contact with the first second-conductivity-type semiconductor region and the second semiconductor layer.

8. The semiconductor device according to claim 5, wherein the first region is provided along an inner wall of the trench.

9. The semiconductor device according to claim 5, wherein the second region is in contact with the first second-conductivity-type semiconductor region and the third second-conductivity-type semiconductor region.

10. The semiconductor device according to claim 5, wherein the second region is in contact with the first region.

11. The semiconductor device according to claim 5, wherein a depth of the second region from an inner wall of the trench is at most a depth of the third second-conductivity-type semiconductor region from the side wall of the trench.

12. The semiconductor device according to claim 5, wherein the second first-conductivity-type region has the first region and the second region, and an impurity concentration of the second region is higher than an impurity concentration of the first region.

13. The semiconductor device according to claim 5, wherein the second first-conductivity-type region has the first region and the second region, and an impurity concentration of the second region is equal to an impurity concentration of the first region.

14. The semiconductor device according to claim 3, further comprising:

an active region provided in the semiconductor substrate and including at least the trench and the gate electrode provided in the trench, via the gate insulating film;

a termination region surrounding a periphery of the active region; and a breakdown voltage structure provided in the termination region, toward the front surface of the semiconductor substrate, wherein the third second-conductivity-type semiconductor region extends from an active region side toward the termination region and terminates before reaching the termination region.

15. The semiconductor device according to claim 14, wherein the third second-conductivity-type semiconductor region is divided plural times between the active region and the termination region, in a direction toward the termination region.

* * * * *